US009917037B2

(12) United States Patent
Ikeda et al.

(10) Patent No.: US 9,917,037 B2
(45) Date of Patent: Mar. 13, 2018

(54) SEMICONDUCTOR DEVICE INCLUDING A FIRST INTERNAL CIRCUIT, A SECOND INTERNAL CIRCUIT AND A SWITCH CIRCUIT UNIT

(71) Applicant: Renesas Electronics Corporation, Tokyo (JP)

(72) Inventors: Yuichiro Ikeda, Tokyo (JP); Satoshi Kotani, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/515,799

(22) PCT Filed: Jan. 22, 2015

(86) PCT No.: PCT/JP2015/051648
§ 371 (c)(1),
(2) Date: Mar. 30, 2017

(87) PCT Pub. No.: WO2016/117072
PCT Pub. Date: Jul. 28, 2016

(65) Prior Publication Data
US 2017/0309551 A1  Oct. 26, 2017

(51) Int. Cl.
*H01L 23/31* (2006.01)
*H01L 23/495* (2006.01)
(Continued)

(52) U.S. Cl.
CPC ...... *H01L 23/49541* (2013.01); *H01L 21/565* (2013.01); *H01L 23/3107* (2013.01);
(Continued)

(58) Field of Classification Search
CPC ............ H01L 21/563; H01L 21/67236; H01L 23/3107; H01L 23/3114; H01L 23/4951; H01L 23/498; H01L 23/544
See application file for complete search history.

(56) References Cited

U.S. PATENT DOCUMENTS 5,780,772 A  7/1998  Singh et al.
2006/0208345 A1  9/2006  Nakatsu et al.
(Continued)

FOREIGN PATENT DOCUMENTS

JP  2006-245063 A  9/2006
JP  2007-324291 A  12/2007
JP  2011-100828 A  5/2011

OTHER PUBLICATIONS

International Search Report for application No. PCT/JP2015/051648 dated Apr. 14, 2015.

*Primary Examiner* — Hoai V Pham
(74) *Attorney, Agent, or Firm* — Sughrue Mion, PLLC

(57) ABSTRACT

A semiconductor device PKG includes a semiconductor chip CP, a lead LD3, a wire BW5 electrically connecting a pad electrode PD2 of the semiconductor chip CP to the lead LD3, a wire BW3 electrically connecting a pad electrode PD3 of the semiconductor chip CP to the lead LD3, and a sealing body sealing them with a resin. The semiconductor chip CP includes internal circuits 5b and 5c, and a switch circuit unit SW. Signal transmission is possible between the internal circuit 5c and the pad electrode PD3. The switch circuit unit SW is a circuit capable of being set in a first state in which signal transmission is possible between the internal circuit 5b and the pad electrode PD2, and in a second state in which signal transmission is not possible between the internal circuit 5b and the pad electrode PD2. The switch circuit unit SW is fixed to the second state during operation of the semiconductor device PKG.

13 Claims, 33 Drawing Sheets

(51) Int. Cl.
*H01L 23/00* (2006.01)
*H01L 21/56* (2006.01)
*H01L 23/544* (2006.01)

(52) U.S. Cl.
CPC ............ *H01L 23/544* (2013.01); *H01L 24/49* (2013.01); *H01L 2223/5446* (2013.01); *H01L 2224/04042* (2013.01); *H01L 2224/45124* (2013.01); *H01L 2224/45144* (2013.01); *H01L 2224/45147* (2013.01); *H01L 2224/48247* (2013.01); *H01L 2224/94* (2013.01); *H01L 2924/3862* (2013.01)

(56) References Cited

U.S. PATENT DOCUMENTS

| | | |
|---|---|---|
| 2007/0278652 A1 | 12/2007 | Tanaka |
| 2011/0101544 A1 | 5/2011 | Fukuhara et al. |
| 2011/0115461 A1* | 5/2011 | Horiguchi ............... G05F 3/242 323/311 |

* cited by examiner

FIG. 30
(a)
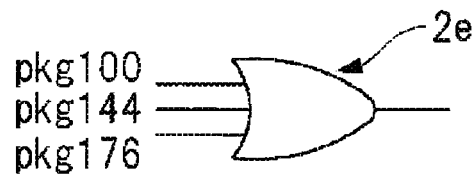
(b)
(c)
(d)
(e)
pkg100 ————————————
(f)
pkg144 ————————————
(g)
pkg176 ————————————
(h)
NONE

SEMICONDUCTOR DEVICE INCLUDING A FIRST INTERNAL CIRCUIT, A SECOND INTERNAL CIRCUIT AND A SWITCH CIRCUIT UNIT

CROSS REFERENCE TO RELATED APPLICATIONS

This application is a National Stage of International Application No. PCT/JP2015/051648, filed on Jan. 22, 2015, the contents of all of which are incorporated herein by reference in their entirety.

TECHNICAL FIELD

The present invention relates to a semiconductor device and a method for manufacturing the same and can be suitably used, for example, in a semiconductor device in which an electrode of a semiconductor chip is connected to an external terminal via a wire and a method for manufacturing the same.

BACKGROUND ART

A semiconductor device of a semiconductor package type can be manufactured by mounting a semiconductor chip on a die pad, electrically connecting a pad electrode of the semiconductor chip to a lead as an external terminal via a wire, and sealing these components with a resin.

In Japanese Patent Application Laid-Open Publication No. 2007-324291 (Patent Document 1), there is disclosed a technique related to a semiconductor integrated device in which a lead frame and a pad are connected via a wire.

In Japanese Patent Application Laid-Open Publication No. 2011-100828 (Patent Document 2), there is disclosed a technique related to a semiconductor package in which electrode pads of a semiconductor chip are electrically connected to corresponding inner leads by a plurality of bonding wires.

RELATED ART DOCUMENTS

Patent Documents

Patent Document 1: Japanese Patent Application Laid-Open Publication No. 2007-324291
Patent Document 2: Japanese Patent Application Laid-Open Publication No. 2011-100828

SUMMARY OF THE INVENTION

Problems to be Solved by the Invention

Also in a semiconductor device in which a semiconductor chip is connected with a wire and is sealed with a resin, it is desired that a manufacturing yield be improved as much as possible. It is also desired that a manufacturing cost of the semiconductor device be reduced. It is further desired that the manufacturing yield of the semiconductor device be improved and the manufacturing cost of the semiconductor device be reduced.

Other objects and novel characteristics of the present invention will be apparent from the description of the present specification and the accompanying drawings.

Means for Solving the Problems

According to an embodiment, a semiconductor device includes: a semiconductor chip; a first external terminal disposed around the semiconductor chip; a first wire electrically connecting the first electrode of the semiconductor chip to the first external terminal; a second wire electrically connecting the second electrode of the semiconductor chip to the first external terminal; and a sealing body sealing the semiconductor chip, the first wire, and the second wire with a resin. The semiconductor device includes a first internal circuit, a second internal circuit, and a switch circuit unit. The second electrode is electrically connected to the second internal circuit, and transmission of a signal is possible between the second internal circuit and the second electrode. The switch circuit unit is a circuit capable of being set in a first state in which transmission of a signal is possible between the first internal circuit and the first electrode and in a second state in which transmission of a signal is not possible between the first internal circuit and the first electrode, and the switch circuit unit is fixed to the second state during operation of the semiconductor device.

Also, according to an embodiment, a method for manufacturing a semiconductor device, includes the steps of: (a) preparing a semiconductor chip including a first internal circuit, a second internal circuit, a storage circuit unit, and a switch circuit unit; and (b) mounting the semiconductor chip over a chip mounting portion. Moreover, the method for manufacturing a semiconductor device includes the steps of: (c) electrically connecting a first electrode of the semiconductor chip to a first external terminal disposed around the chip mounting portion via a first wire as well as electrically connecting a second electrode of the semiconductor chip to the first external terminal via a second wire; and (d) forming a resin sealing portion by sealing the semiconductor chip, the first wire, and the second wire with a resin. Furthermore, the method for manufacturing a semiconductor device includes the step of: (e) storing first information in the storage circuit unit of the semiconductor chip. The second electrode is electrically connected to the second internal circuit, and transmission of a signal is possible between the second internal circuit and the second electrode. The switch circuit unit is a circuit capable of being set in a first state in which transmission of a signal is possible between the first internal circuit and the first electrode and in a second state in which transmission of a signal is not possible between the first internal circuit and the first electrode. Then, after the step (e), the switch circuit unit is fixed to the second state based on the first information stored in the storage circuit unit during operation of the semiconductor device.

Effects of the Invention

According to an embodiment, it is possible to improve the manufacturing yield of the semiconductor device. It is also possible to reduce the manufacturing cost of the semiconductor device. Furthermore, it is possible to improve the manufacturing yield of the semiconductor device and reduce the manufacturing cost of the semiconductor device.

BRIEF DESCRIPTIONS OF THE DRAWINGS

FIG. 1 is a top view of a semiconductor device according to an embodiment;
FIG. 2 is a plan perspective view of the semiconductor device according to the embodiment;
FIG. 3 is a plan perspective view of the semiconductor device according to the embodiment;
FIG. 4 is a plan perspective view of the semiconductor device according to the embodiment;

Figure 29:
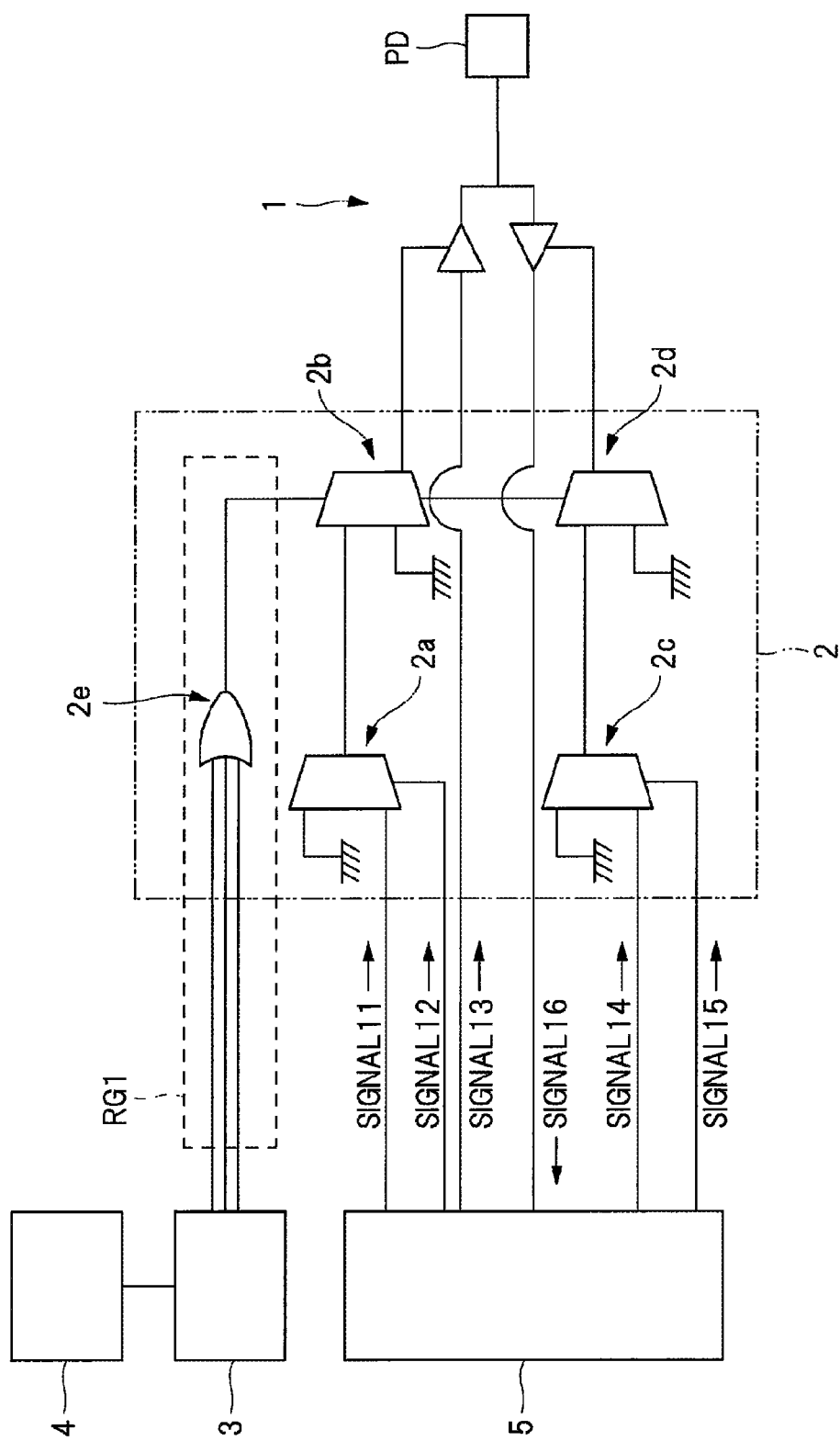
FIG. 29 is a circuit diagram for describing a specific method for switching a pad electrode to be a valid pad or an invalid pad.
Figure 31:
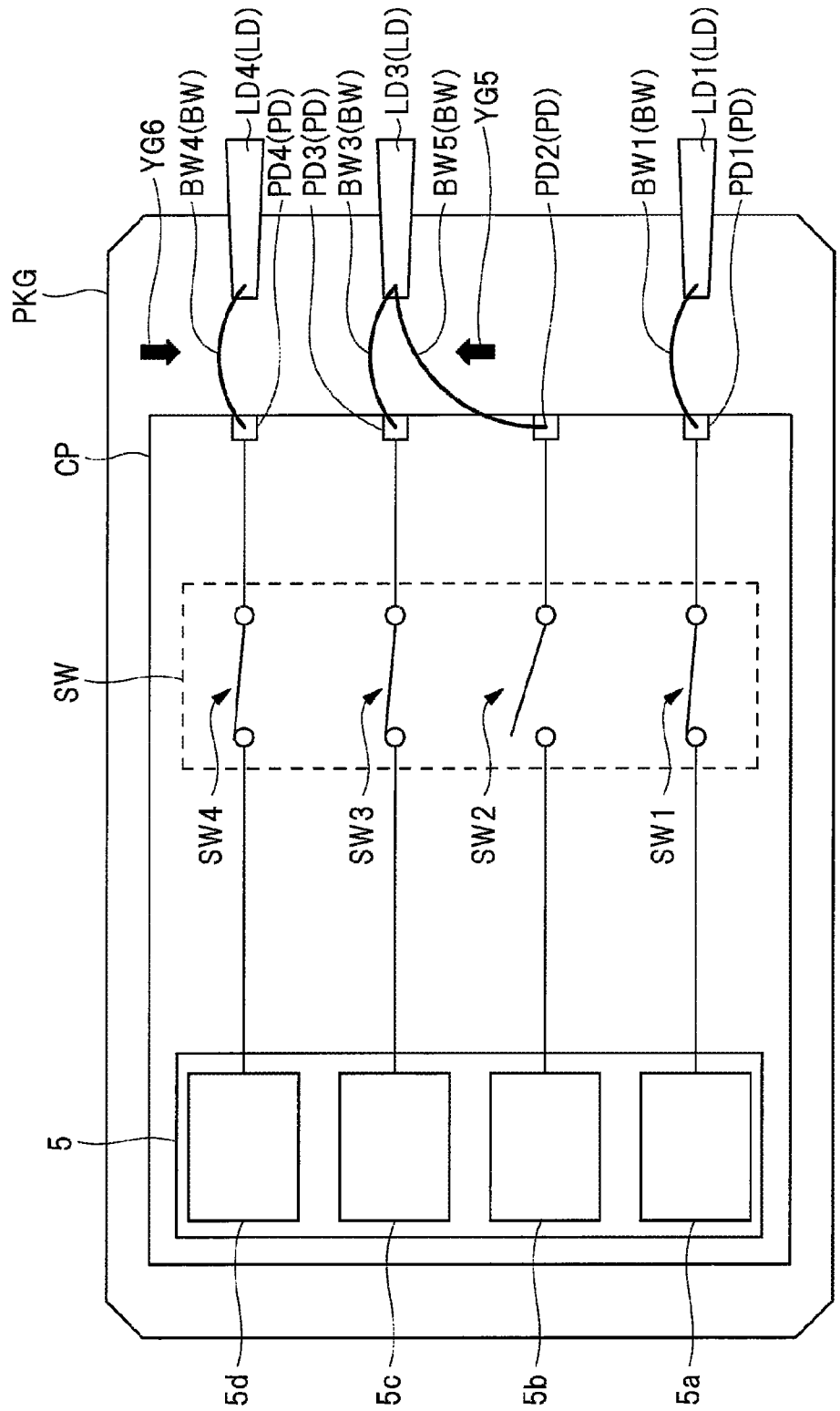
Figure 32:
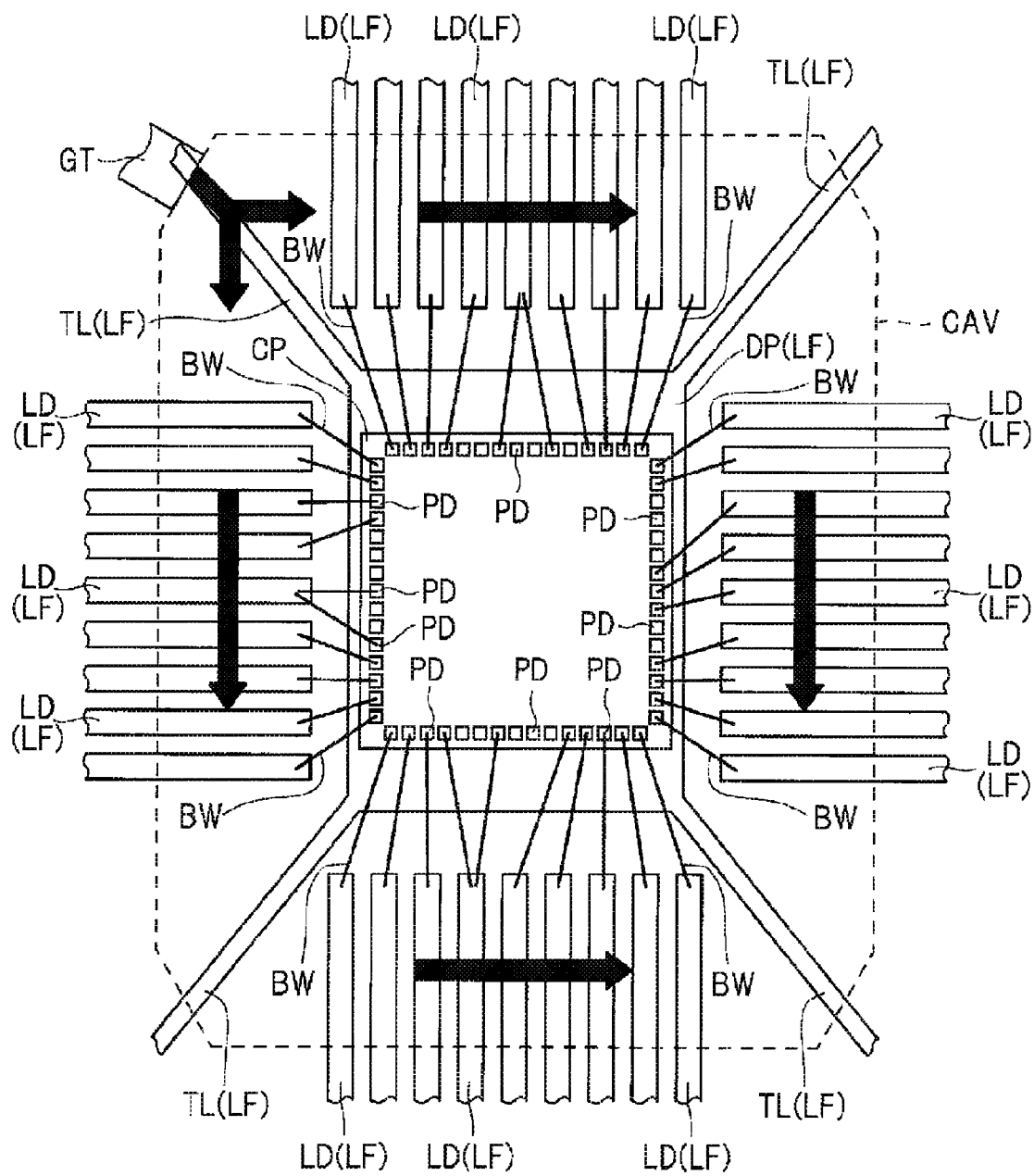
Figure 33:
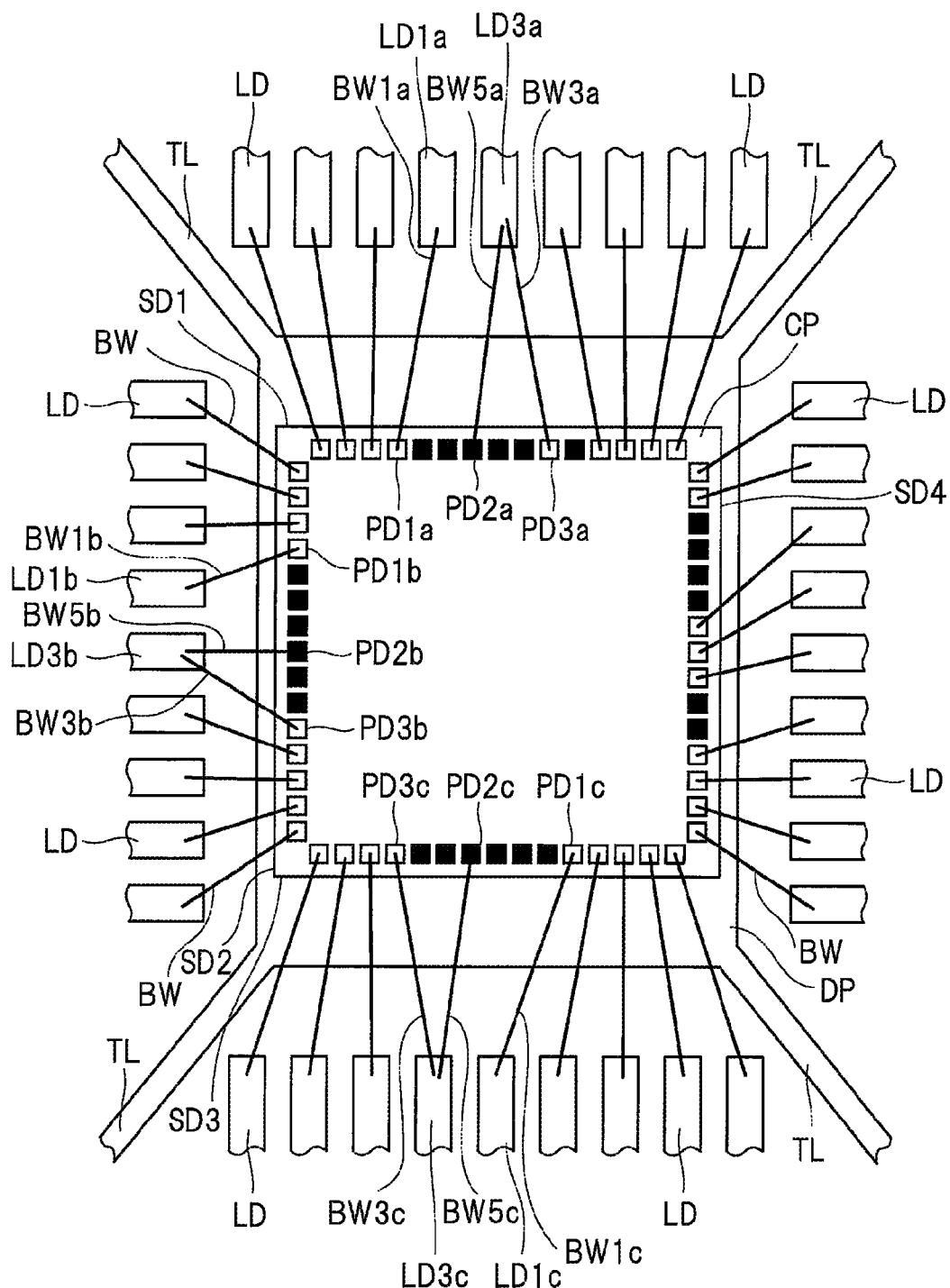
Figure 34:
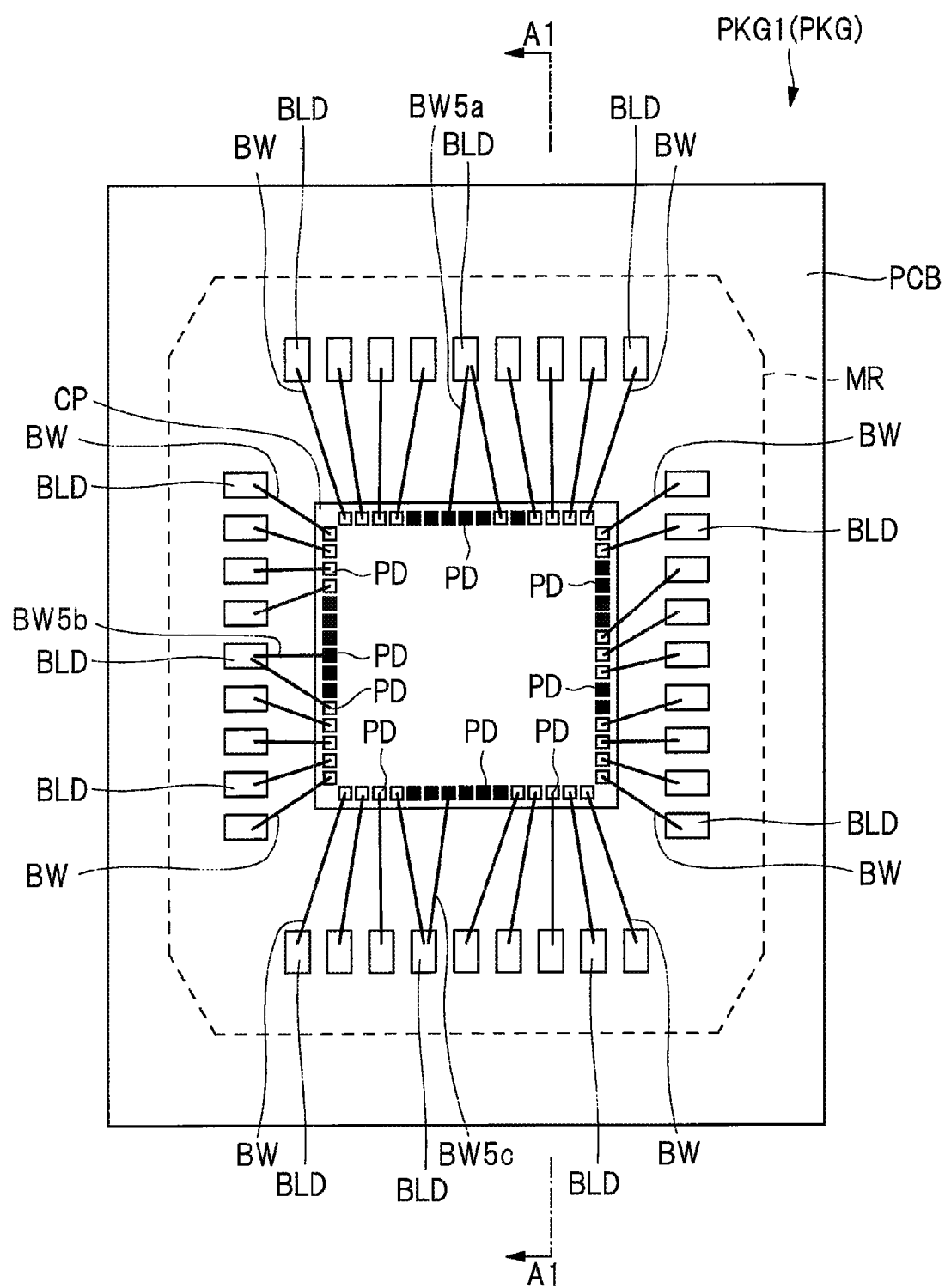
Figure 35:
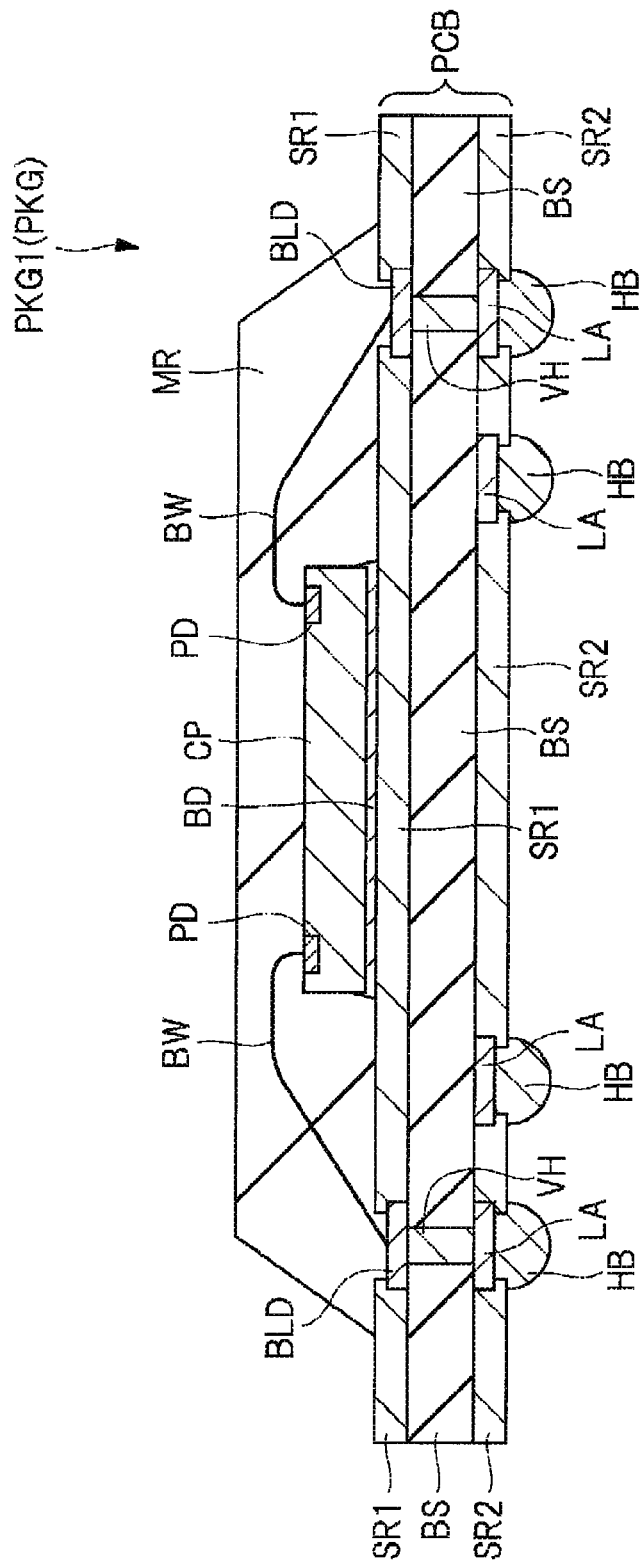

FIGS. 30(a) to 30(h) are explanatory diagrams illustrating exemplary configurations of a region surrounded by a dotted line in FIG. 29;

FIG. 31 is an explanatory diagram conceptually illustrating the semiconductor device according to the embodiment;

FIG. 32 is a plan view illustrating a resin sealing step in the manufacturing process of the semiconductor device according to the embodiment;

FIG. 33 is a partially-enlarged plan view illustrating apart of FIG. 32 in an enlarged manner;

FIG. 34 is a plan perspective view of a semiconductor device according to another embodiment; and FIG. 35 is a cross-sectional view of the semiconductor device according to the embodiment of FIG. 34.

DETAILED DESCRIPTION OF PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

In addition, in some drawings used in the embodiments, hatching may be omitted even in a cross-sectional view so as to make the drawings easy to see. Also, hatching may be used even in a plan view so as to make the drawings easy to see.

First Embodiment

<Overall Structure of Semiconductor Device (Semiconductor Package)>

Figure 1:
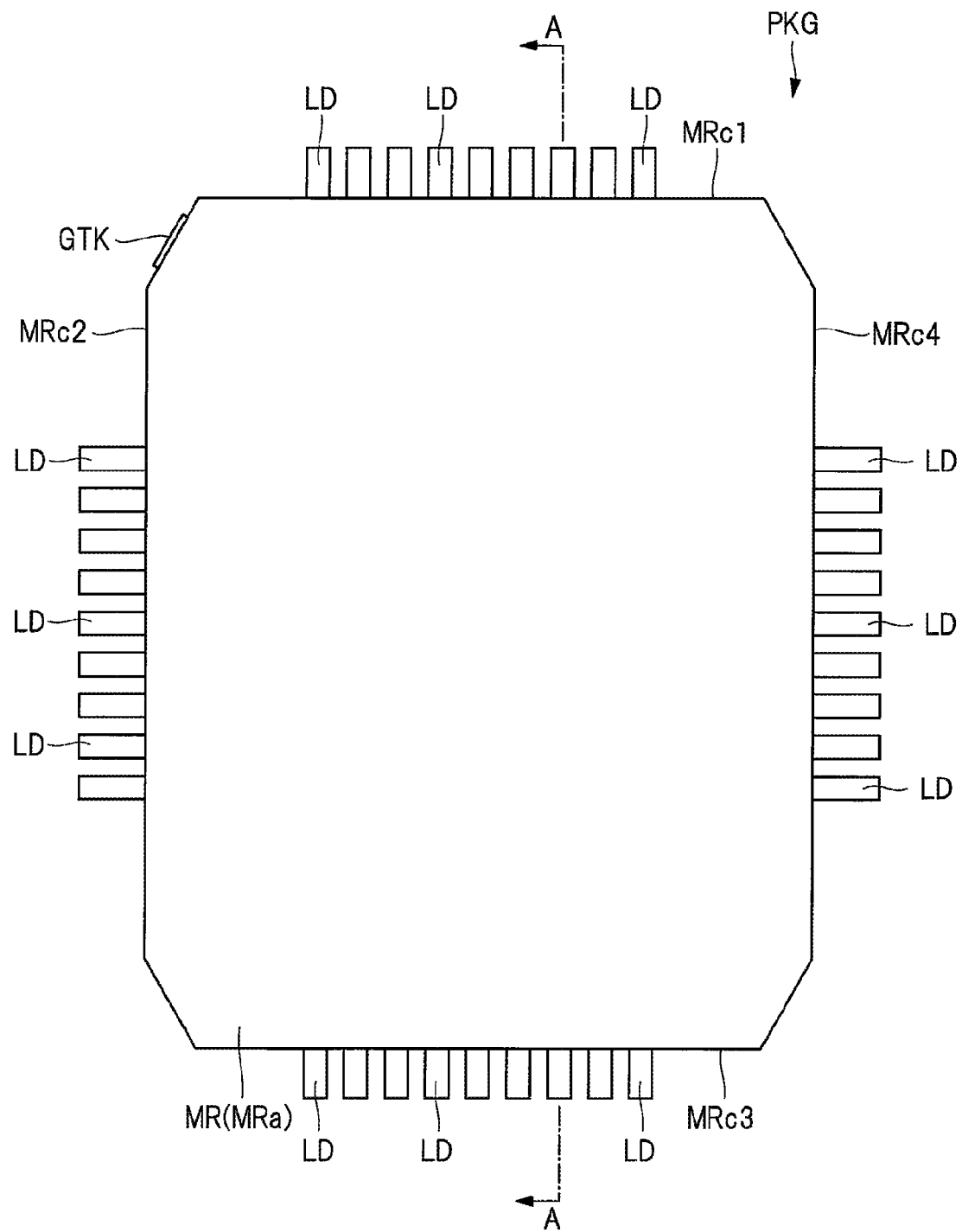
Figure 2:
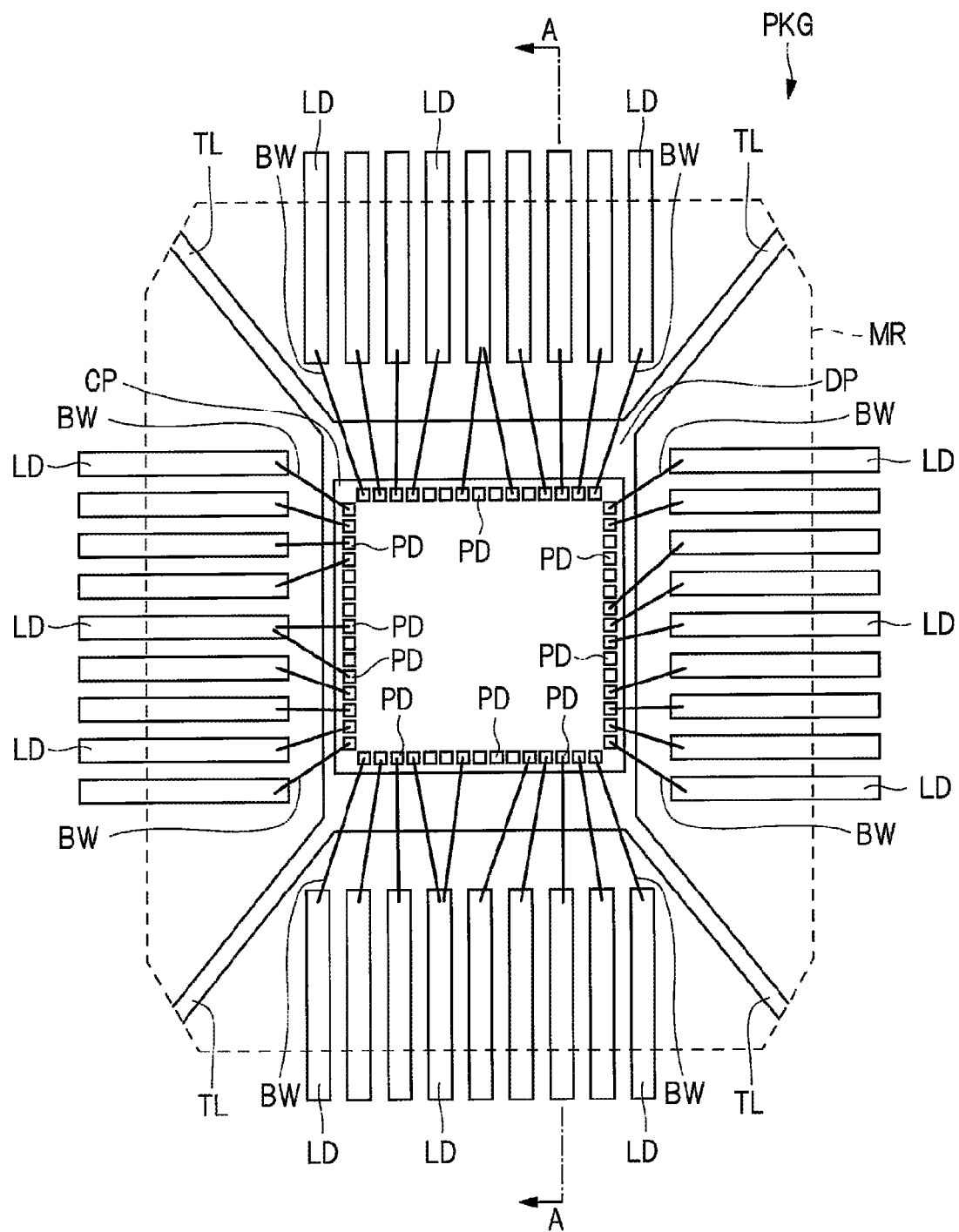
Figure 3:
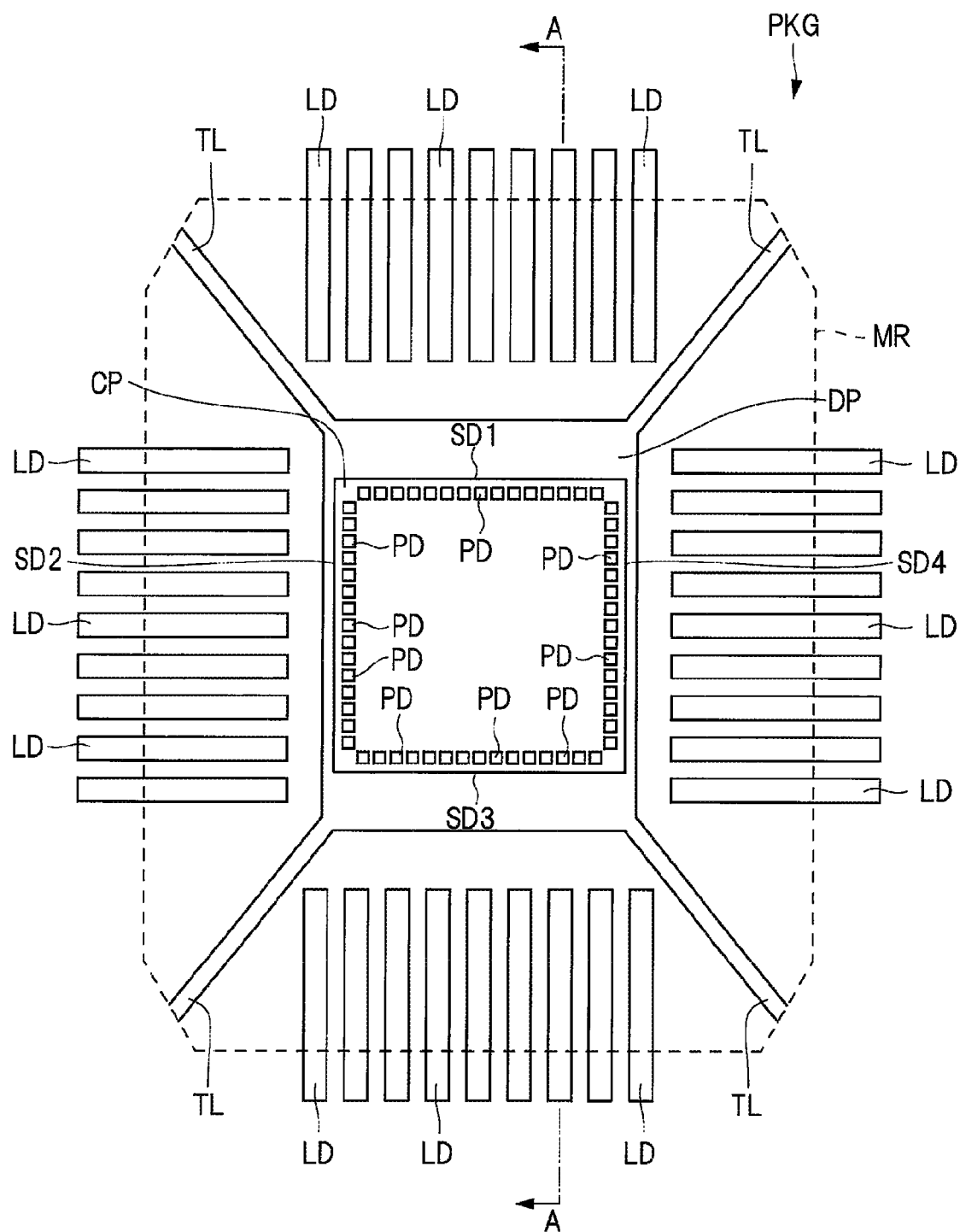
Figure 4:
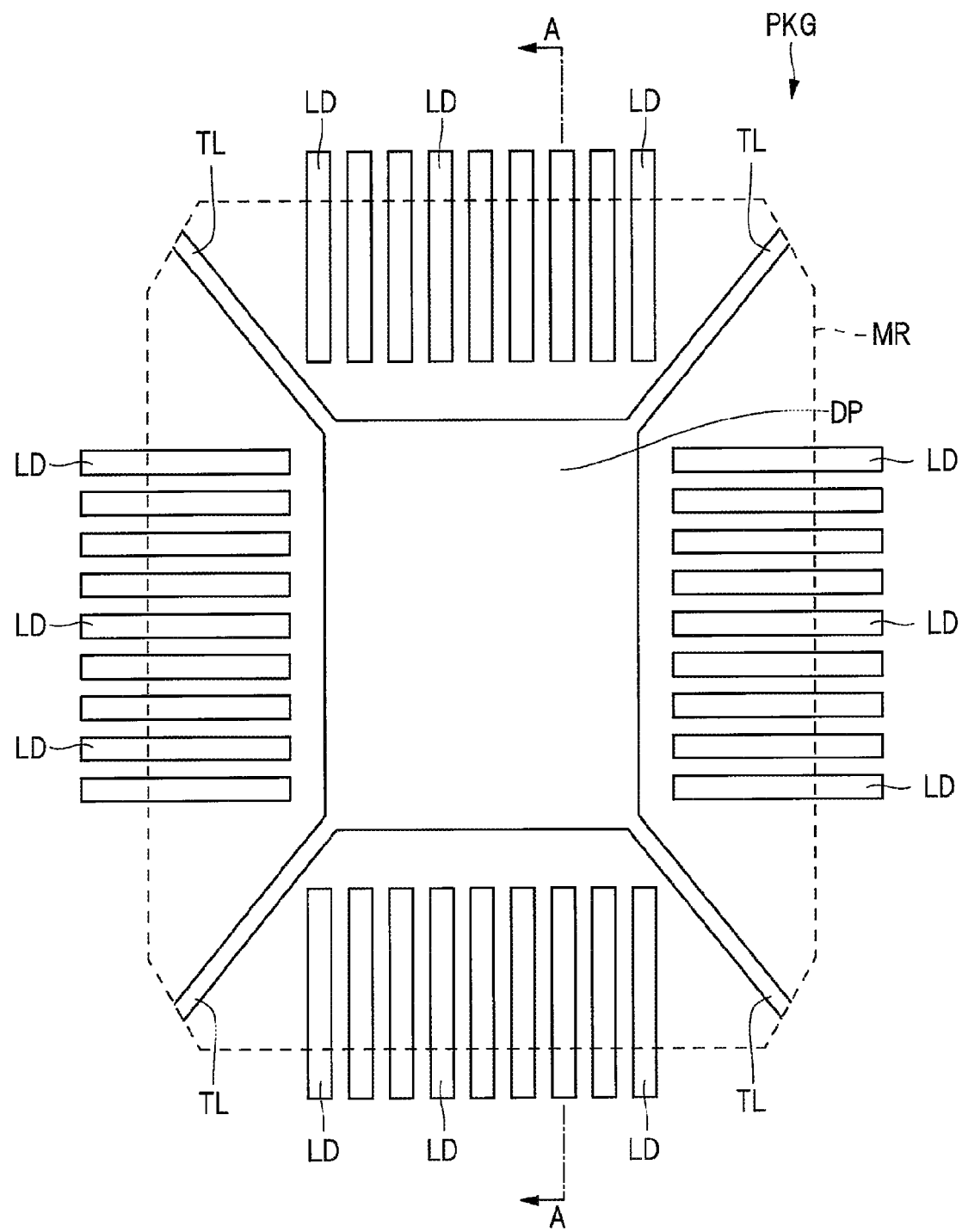
Figure 5:
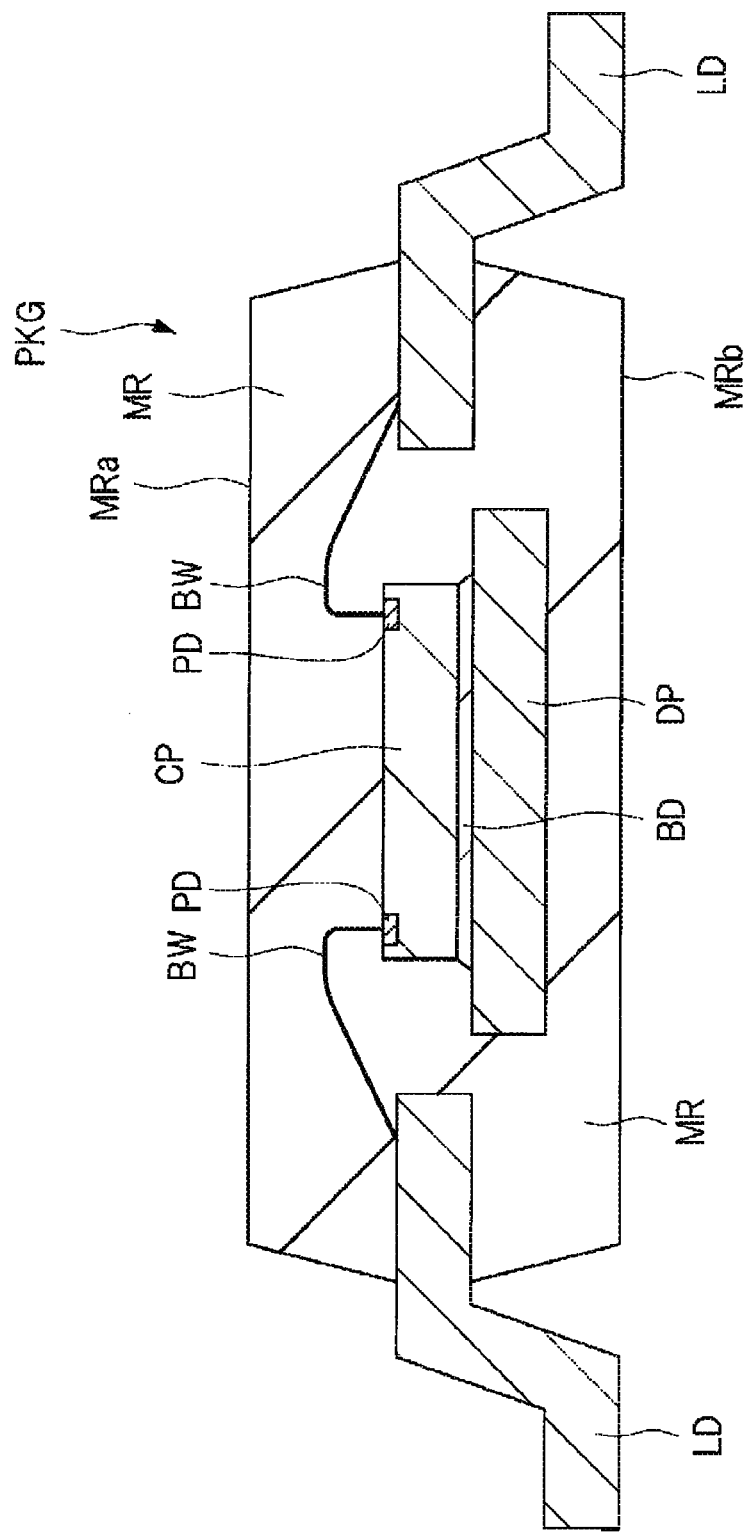
FIG. 5 is a cross-sectional view of the semiconductor device according to the embodiment.

FIG. 1 is a top view of a semiconductor device PKG according to an embodiment, FIGS. 2 to 4 are plan perspective views of the semiconductor device PKG, and FIG. 5 is a cross-sectional view of the semiconductor device PKG. In FIG. 2, there is illustrated a plan perspective view of an upper surface side of a semiconductor device PKG viewed through a sealing portion MR. In FIG. 3, there is illustrated a plan perspective view of the upper surface side of the semiconductor device PKG of FIG. 2 further viewed through (omitting) a wire BW. In FIG. 4, there is illustrated a plan perspective view of the upper surface side of the semiconductor device PKG of FIG. 3 further viewed through (omitting) a semiconductor chip CP. Note that, in FIGS. 2 to 4, a position of an outer periphery of the sealing portion MR is indicated with a dotted line. Furthermore, FIG. 5 substantially corresponds to a cross-section of the semiconductor device PKG at a position of a line A-A in FIGS. 1 to 4.

The semiconductor device (semiconductor package) PKG according to this embodiment illustrated in FIGS. 1 to 5 is a semiconductor device of a resin-sealed semiconductor package type, and in this case, it is a semiconductor device of a Quad Flat Package (QFP) type. A configuration of the semiconductor device PKG will be described below with reference to FIGS. 1 to 5.

The semiconductor device PKG according to this embodiment illustrated in FIGS. 1 to 5 includes: the semiconductor chip CP; a die pad DP over which the semiconductor chip CP is mounted; a plurality of leads LD formed of a conductor; a plurality of wires BW electrically connecting a plurality of pad electrodes PD of the semiconductor chip CP to the plurality of leads LD; and the sealing portion MR sealing these components.

The sealing portion (sealing resin portion, sealing body) MR as a sealing body is made of a resin material such as a thermosetting resin material, for example, and a filler and the like may be also included. For example, it is possible to form the sealing portion MR by using an epoxy resin including the filler and the like. Other than the epoxy-based resin, for reasons of achieving low stress and the like, for example, it is also possible to use a biphenyl-based thermosetting resin added with a phenol-based curing agent, silicone rubber, the filler, and the like as a material of the sealing portion MR.

The sealing portion MR includes an upper surface MRa which is one of main surfaces, a lower surface MRb which is the other main surface opposite to the upper surface MRa, and side surfaces MRc1, MRc2, MRc3, and MRc4 intersecting with the upper surface MRa and the lower surface MRb. That is, an external appearance of the sealing portion MR is a thin plate-shape surrounded by the upper surface MRa, the lower surface MRb, and the side surfaces MRc1, MRc2, MRc3, and MRc4. Note that, in a plan view, each of the side surfaces MRc1, MRc2, MRc3, and MRc4 of the sealing portion MR may be also regarded as a side of the sealing portion MR.

A planar shape of the upper surface MRa and the lower surface MRb of the sealing portion MR is formed into a rectangular shape, for example, and a corner of this rectangle (planar rectangle) may be rounded. In addition, it is also possible to chamfer any of four corners of this rectangle (planar rectangle). In a case where each planar shape of the upper surface MRa and the lower surface MRb of the sealing portion MR is formed into a rectangle, a planar shape of the sealing portion MR intersecting with a thickness thereof becomes a rectangle. Among the side surfaces MRc1, MRc2, MRc3, and MRc4 of the sealing portion MR, the side surface MRc1 and the side surface MRc3 face each other, and the side surface MRc2 and the side surface MRc4 face each other, while the side surface MRc1 intersects with the side surfaces MRc2 and MRc4 and the side surface MRc3 intersects with the side surfaces MRc2 and MRc4.

The plurality of leads (lead portions, external terminals) LD are composed of a conductor and are preferably made of a metal material such as copper (Cu) and a copper alloy. A part of each of the plurality of leads LD is sealed within the sealing portion MR, and the other part thereof is protruded to the outside of the sealing portion MR from the side surface of the sealing portion MR. Hereinafter, the part of each of the leads LD positioned within the sealing portion MR is referred to as an inner lead portion, and the other part of each of the leads LD positioned outside of the sealing portion MR is referred to as an outer lead portion.

Note that the semiconductor device PKG according to this embodiment has a structure in which the other part of each of the leads LD (outer lead portion) is protruded from the side surface of the sealing portion MR, and hereinafter, descriptions will be given based on this structure; however, it is not to be limited to this structure. For example, it is also possible to use a configuration (QFN-type configuration) in which each of the leads LD is scarcely protruded from the side surface of the sealing portion MR and a part of each of the leads LD is exposed from the lower surface MRb of the sealing portion MR and the like.

The plurality of leads LD provided in the semiconductor device PKG are disposed around the semiconductor chip CP and accordingly, are disposed around the die pad DP. Specifically, the plurality of leads LD provided in the semiconductor device PKG are constituted by the plurality of leads LD disposed on a side surface MRc1 side of the sealing portion MR, the plurality of leads LD disposed on a side surface MRc2 side of the sealing portion MR, the plurality of leads LD disposed on a side surface MRc3 side of the sealing portion MR, and the plurality of leads LD disposed on aside surface MRc4 side of the sealing portion MR. The outer lead portion of each of the leads LD is protruded to the outside of the sealing portion MR from the corresponding side surface of the sealing portion MR. The outer lead portion of each of the leads LD is folded and bent such that a lower surface in the vicinity of an end portion of the outer lead portion positions on substantially the same plane as the lower surface MRb of the sealing portion MR. The outer lead portion of the lead LD functions as an external connection terminal portion (external terminal) of the semiconductor device PKG. Accordingly, the lead LD may be regarded as the external terminal of the semiconductor device PKG.

A die pad (chip mounting portion, tab) DP is a chip mounting portion over which the semiconductor chip CP is mounted. A planar shape of the die pad DP is formed into a rectangular shape, for example. The semiconductor chip CP is disposed over the die pad DP. The sealing portion MR seals the die pad DP and the semiconductor chip CP mounted thereover. The plurality of leads LD are disposed around the die pad DP.

In a case of FIG. 5, the die pad DP is sealed within the sealing portion MR, and the die pad DP is not exposed from the lower surface MRb of the sealing portion MR; however, it is also possible that a lower surface of the die pad DP is exposed from the lower surface MRb of the sealing portion MR.

The die pad DP is composed of a conductor and is preferably made of a metal material such as copper (Cu) and a copper alloy. More preferably, the die pad DP and the plurality of leads LD, which constitute the semiconductor device PKG, are formed of the same material (the same metal material). Accordingly, it is easier to fabricate a lead frame to which the die pad DP and the plurality of leads LD are connected, and it is easier to manufacture the semiconductor device PKG using the lead frame.

A suspension lead TL is integrally formed at each of four corners of the rectangle constituting the planar shape of the die pad DP. Each of the suspension leads TL is integrally formed with the die pad DP and is formed of the same material as the die pad DP. Each of the suspension leads TL is integrally formed with each of the four corners of an outer edge of the die pad DP, and each of the suspension leads TL extends within the sealing portion MR until an end portion thereof on a side opposite to a side where each of the suspension leads TL is connected to the die pad DP reaches a side surface at each of the four corners (corner portion) of the sealing portion MR having the planar rectangular shape. A part of the suspension leads TL that is protruded from the sealing portion MR after the sealing portion MR has been formed is cut off, and a cut section (end face) generated by cutting the suspension lead TL is exposed from the side surface at each of the four corners of the sealing portion MR.

Over an upper surface of the die pad DP, the semiconductor chip CP is mounted in a state where a front surface (upper surface) thereof faces upward and a back surface (lower surface) thereof faces the die pad DP. The back surface of the semiconductor chip CP is adhered (bonded) and fixed to the upper surface of the die pad DP via a bonding material (bonding material layer, adhesive layer) BD. The semiconductor chip CP is sealed within the sealing portion MR and is not exposed from the sealing portion MR. As the bonding material BD, a conductive bonding material or an insulative bonding material may be used, and for example, it is possible to use a paste-type bonding material, a film-shaped adhesive sheet, solder, and the like.

The semiconductor chip CP is manufactured, for example, by forming various semiconductor elements or semiconductor integrated circuits in a main surface of a semiconductor substrate (semiconductor wafer) made of single-crystal silicon or the like and then, separating the semiconductor substrate into each semiconductor chip through dicing and the like. The semiconductor chip CP has a rectangular (quadrangular) planar shape intersecting with a thickness thereof.

In a front surface of the semiconductor chip CP, a plurality of pad electrodes (pad, bonding pad, terminal) PD are formed. Note that the "pad electrode" may be also simply referred to as a "pad."

Here, of two main surfaces opposite to each other of the semiconductor chip CP, the main surface on a side where the plurality of pad electrodes PD are formed is referred to as the front surface of the semiconductor chip CP, and the main surface on an opposite side of the front surface and facing the die pad DP is referred to as the back surface of the semiconductor chip CP.

The front surface of the semiconductor chip CP has a rectangular planar shape having sides (chip sides) SD1, SD2, SD3, and SD4. Note that, on the front surface of the semiconductor chip CP, the side SD1 and the side SD3 face each other, the side SD2 and the side SD4 face each other, the side SD1 and the side SD3 are parallel to each other, the side SD2 and the side SD4 are parallel to each other, the side SD1 is orthogonal to the sides SD2 and SD4, and the side SD3 is orthogonal to the sides SD2 and SD4.

In the semiconductor chip CP, the side SD1 is a side along the side surface MRc1 of the sealing portion MR, the side SD2 is a side along the side surface MRc2 of the sealing portion MR, the side SD3 is a side along the side surface MRc3 of the sealing portion MR, and the side SD4 is a side along the side surface MRc4 of the sealing portion MR.

In a plan view, the side SD1 of the semiconductor chip CP faces (the inner lead portions of) the plurality of leads LD disposed on the side surface MRc1 side of the sealing portion MR, and the side SD2 of the semiconductor chip CP faces (the inner lead portions of) the plurality of leads LD disposed on the side surface MRc2 side of the sealing portion MR. Furthermore, in the plan view, the side SD3 of the semiconductor chip CP faces (the inner lead portions of) of the plurality of leads LD disposed on the side surface MRc3 side of the sealing portion MR, and the side SD4 of the semiconductor chip CP faces (the inner lead portions of) the plurality of leads LD disposed on the side surface MRc4 side of the sealing portion MR.

The plurality of pad electrodes PD of the semiconductor chip CP are electrically connected to the plurality of leads LD via the plurality of wires BW, respectively.

Specifically, in the front surface of the semiconductor chip CP, the plurality of pad electrodes PD disposed along the side SD1 are electrically connected to the plurality of leads LD disposed on the side surface MRc1 side of the sealing portion MR via the plurality of wires BW, respectively. In addition, in the front surface of the semiconductor chip CP, the plurality of pad electrodes PD disposed along the side SD2 are electrically connected to the plurality of leads LD disposed on the side surface MRc2 side of the sealing portion MR via the plurality of wires BW, respectively. Moreover, in the front surface of the semiconductor chip CP, the plurality of pad electrodes PD disposed along the side SD3 are electrically connected to the plurality of leads LD disposed on the side surface MRc3 side of the sealing portion MR via the plurality of wires BW, respectively. Further, in the front surface of the semiconductor chip CP, the plurality of pad electrodes PD disposed along the side SD4 are electrically connected to the plurality of leads LD disposed on the side surface MRc4 side of the sealing portion MR via the plurality of wires BW, respectively.

The wires (bonding wires) BW are conductive connection members, and more specifically, are conductive wires. Since the wires BW are made of metal, the wires BW may be also regarded as metal wires (thin metallic wires). As the wires BW, gold (Au) wires, copper (Cu) wires, aluminum (Al) wires, and the like may be suitably used.

Note that, since the gold (Au) wires are comparatively soft, a wire sweep described below may easily occur in the gold wire, whereby an effect of applying this embodiment is particularly large in a case where the gold (Au) wires are used as the wires BW.

Each of the wires BW is sealed within the sealing portion MR and is not exposed from the sealing portion MR. In each of the leads LD, a connection part to the wires BW is the inner lead portion, which is positioned within the sealing portion MR.

As described below, the semiconductor chip CP is designed as a common semiconductor chip for manufacturing multiple types of semiconductor packages each having the different number of pins. In FIGS. 2 and 3, the number of the leads LD provided in the semiconductor device PKG is smaller than the number of the pad electrodes PD provided in the semiconductor chip CP. This is because FIGS. 2 and 3 correspond to a case of FIG. 28 described below, not to a case of FIG. 26 described below. Accordingly, among the plurality of pad electrodes PD of the semiconductor chip CP illustrated in FIGS. 2 and 3, there are a valid pad and an invalid pad (unused pad) mixed together.

Each of the leads LD of the semiconductor device PKG is electrically connected to any of the pad electrodes PD provided in the semiconductor chip CP via each of the wires BW. That is, the wire BW has one end connected to the pad electrode PD of the semiconductor chip CP and the other end connected to (the inner lead portion of) the lead LD. Accordingly, the pad electrode PD is electrically connected to the lead LD via the wire BW.

Each of the valid pads among the plurality of pad electrodes PD of the semiconductor chip CP is electrically connected to each of the leads LD by each of the wires BW. Meanwhile, each of the invalid pads (unused pads) among the plurality of pad electrodes PD of the semiconductor chip CP may not be connected to each of the wires BW; however, at least one of the invalid pads is electrically connected to each of the leads LD by each of the wires BW. That is, among the pad electrodes PD, each of the valid pads is always connected to the wire BW, but each of the invalid pads may be or may not be connected to the wire BW. In this embodiment, at least one of the invalid pads provided in the semiconductor chip CP is connected to the wire BW.

A connection relation among the pad electrodes PD of the semiconductor chip CP, the wires BW, and the leads LD will be described below in detail.

<Manufacturing Process of Semiconductor Device>

Figure 6:
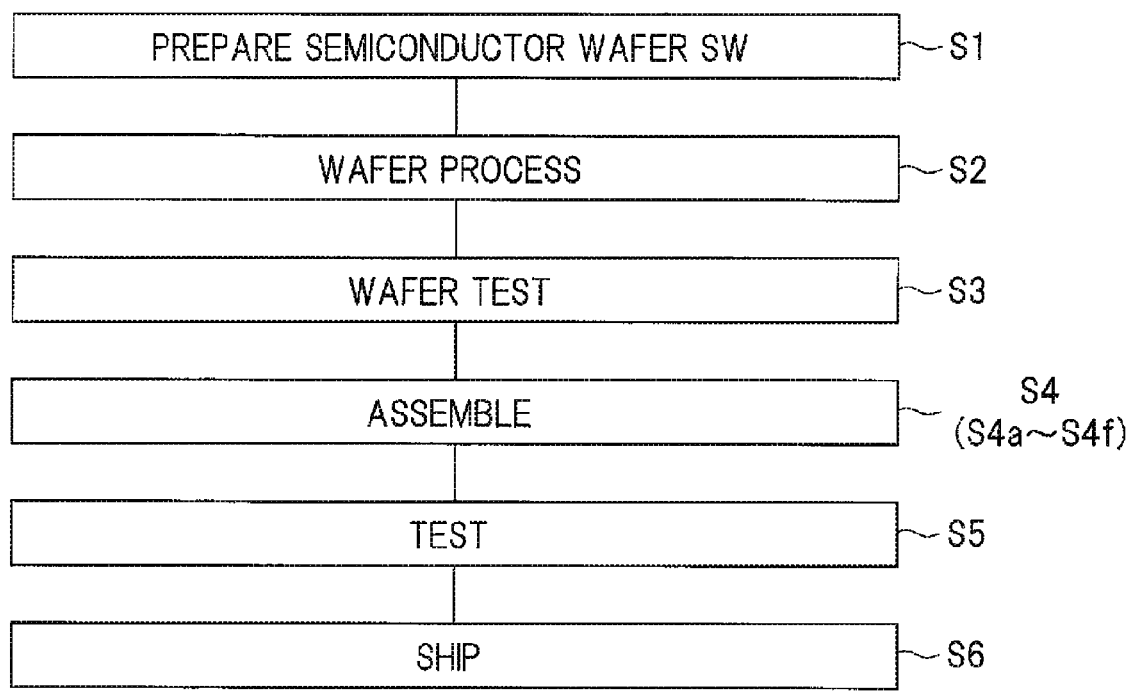
FIG. 6 is a process flowchart illustrating a manufacturing process of the semiconductor device according to the embodiment.
Figure 7:
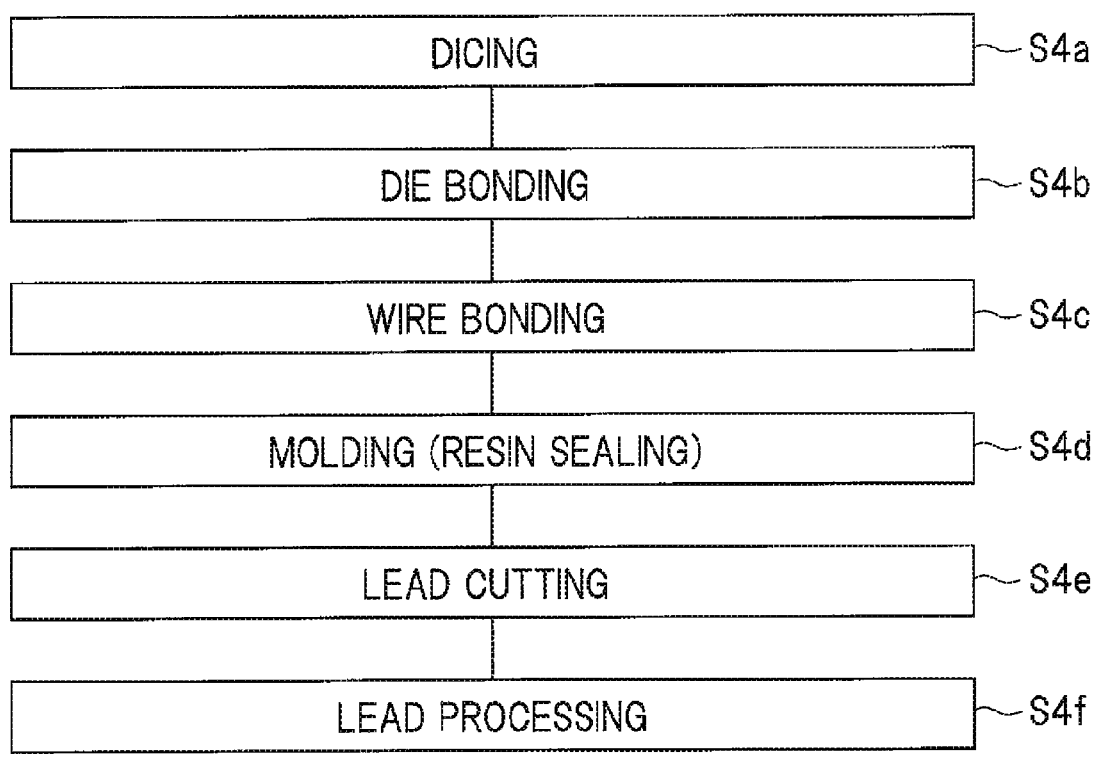
FIG. 7 is a process flowchart illustrating a detail of an assembling process of the semiconductor device according to the embodiment.

Next, the manufacturing process of the semiconductor device PKG illustrated in FIGS. 1 to 5 will be described. FIG. 6 is a process flowchart illustrating the manufacturing process of the semiconductor device PKG illustrated in FIGS. 1 to 5. FIG. 7 is a process flowchart illustrating a detail of an assembling process in step S4 of the process flowchart in FIG. 6. In addition, FIGS. 8 to 19 are plan views or cross-sectional views for describing the manufacturing process of the semiconductor device PKG.

First, a semiconductor wafer (semiconductor substrate) SW is prepared (step S1 of FIG. 6). The semiconductor wafer SW is made of single-crystal silicon or the like, for example, and has a substantially circular planar shape, for example. Then, a wafer process is performed on the semiconductor wafer SW (step S2 of FIG. 6).

Here, in general, the wafer process is a process in which various semiconductor elements or semiconductor integrated circuits are formed in a main surface or a front surface layer portion of the semiconductor wafer SW, a wiring structure including one or more wiring layers are formed in the semiconductor wafer SW, and a front surface protection film is further formed over the wiring structure such that an individual electrical test can be performed on each of a plurality of semiconductor chip regions CPR formed in the semiconductor wafer SW by using a probe and the like. The wafer process is also referred to as a front-end process.

Figure 8:
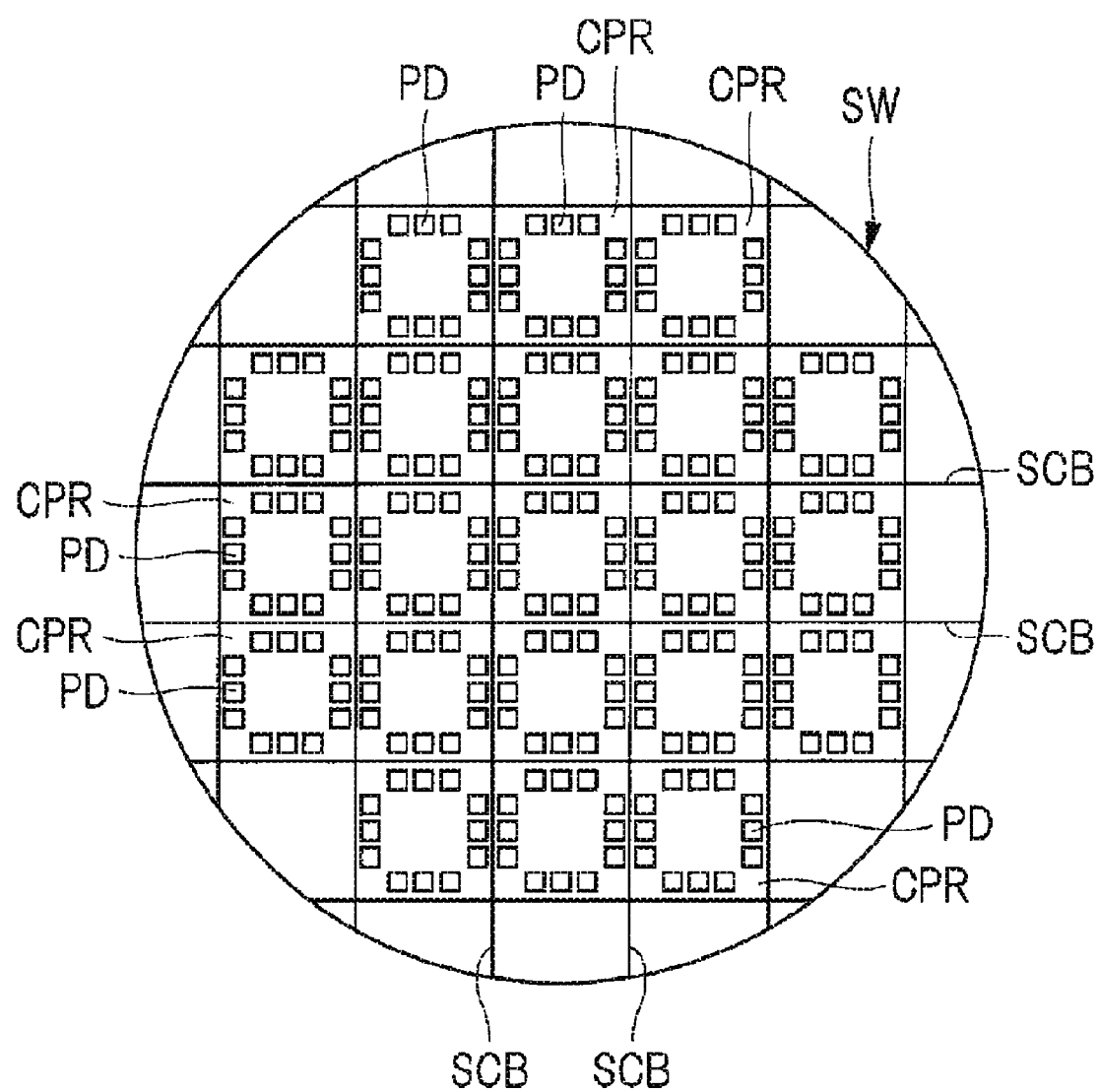
FIG. 8 is a plan view for describing the manufacturing process of the semiconductor device according to the embodiment.
Figure 9:
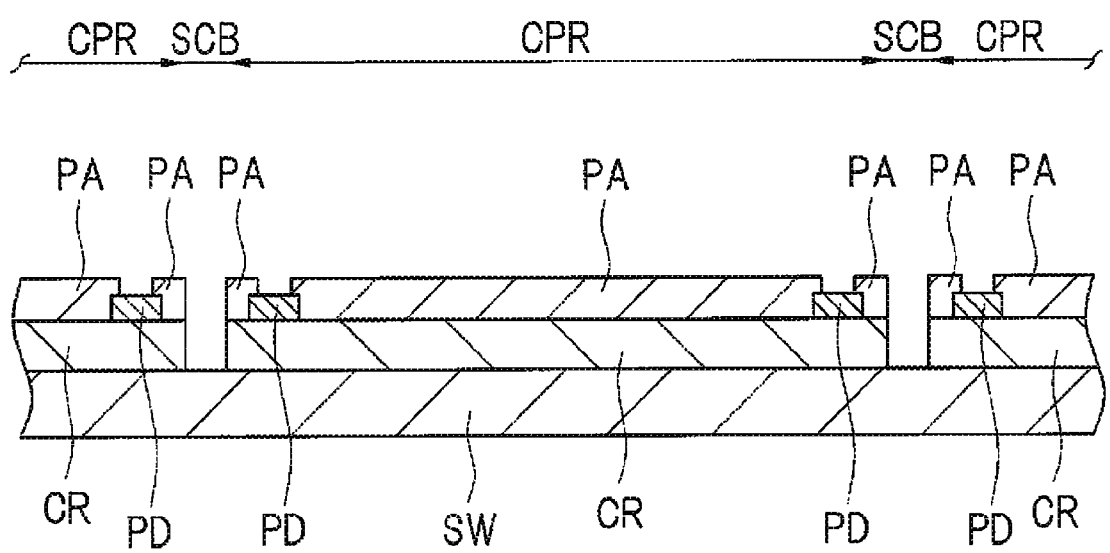
FIG. 9 is a cross-sectional view for describing the manufacturing process of the semiconductor device according to the embodiment.

FIG. 8 corresponds to a plan view of the semiconductor wafer SW at a stage where the wafer process of step S2 has been completed, and FIG. 9 corresponds to a cross-sectional view of a main part of the semiconductor wafer SW at the stage where the wafer process of step S2 has been completed.

As illustrated in FIGS. 8 and 9, a main surface of the semiconductor wafer SW includes a plurality of semiconductor chip regions (semiconductor element forming regions, unit integrated circuit regions) CPR and a scribing region (scribing line) SCB between the semiconductor chip regions CPR. The semiconductor chip regions CPR correspond to regions that each becomes an individually-diced semiconductor chip (corresponding to the above-described semiconductor chip CP) when the semiconductor wafer SW is diced in a dicing step described below. The semiconductor chip regions CPR are two-dimensionally disposed (arranged) on the main surface of the semiconductor wafer SW systematically (in an array). The semiconductor chip regions CPR have the same size (of the planar shape) and structure with each other and each has a rectangular planar shape. The scribing region SCB is a region sandwiched by the adjacent semiconductor chip regions CPR, that is, a region between the semiconductor chip regions CPR, and the scribing regions SCB are present in a lattice shape relative to the main surface of the semiconductor wafer SW. In other words, a region surrounded by the scribing regions SCB corresponds to the semiconductor chip region CPR.

Also, in FIG. 9, there is illustrated a semiconductor integrated circuit region CR as a region in which a semiconductor element, an interlayer insulating film, and a wiring layer are formed over the semiconductor wafer SW, that is, as a region in which a semiconductor integrated circuit is formed. Over this semiconductor integrated circuit region CR, a protection film (insulating film, passivation film) PA for front surface protection is formed. The semiconductor integrated circuit region CR and the protection film PA are formed in each of the semiconductor chip regions CPR of the semiconductor wafer SW, not in the scribing regions SCB. An opening portion is provided in the protection film PA, and the pad electrode PD is exposed from the opening portion. The pad electrode PD is formed in an uppermost wiring layer of a multilayer wiring structure formed over the main surface of the semiconductor wafer SW. In each of the semiconductor chip regions CPR, a plurality of the pad electrode PD are disposed along an outer periphery of each of the semiconductor chip regions CPR and are each electrically connected to the semiconductor integrated circuit, which is formed in the semiconductor chip region CPR, via the wiring layer (internal wiring layer) and the like.

In the wafer process of step S2, the semiconductor integrated circuit is formed in each of the semiconductor chip regions CPR over the main surface of the semiconductor wafer SW. That is, in step S2, the semiconductor element (e.g. transistor element), the interlayer insulating film, and the wiring layer, or the semiconductor integrated circuit region CR is formed in each of the semiconductor chip regions CPR over the main surface of the semiconductor wafer SW, and the protection film PA is further formed. Accordingly, step S2 may be regarded as a step of forming the semiconductor integrated circuit in each of the plurality of semiconductor chip regions CPR of the semiconductor wafer SW to be the semiconductor chip later. It is preferred that the protection film PA be formed in the semiconductor chip region CPR but not in the scribing region SCB. Accordingly, it is possible to perform cutting of the semiconductor wafer SW easily in the dicing step of the semiconductor wafer SW described below.

Configurations of the respective semiconductor chip regions CPR are the same with each other. In each of the semiconductor chip regions CPR, there is formed a circuit configuration that is the same as the circuit configuration of the semiconductor chip CP illustrated in FIG. 25 described later. That is, each of the semiconductor chip regions CPR includes a plurality of pad electrodes PD and input output circuit units 1 respectively connected thereto, a control circuit unit 2, a decoder circuit unit 3, a storage circuit unit 4, and an internal circuit unit 5, which will be described later.

Next, a probe test (wafer test) is performed by using the pad electrodes PD in each of the semiconductor chip regions CPR (step S3 of FIG. 6). The probe test of step S3 is a test (inspection) performed before the semiconductor wafer SW is cut in the dicing step described below. Since it is a test performed on the semiconductor wafer SW, it can be regarded as the wafer test.

In a testing step of step S3, it is possible to perform an electrical test on each of the semiconductor chip regions CPR of the semiconductor wafer SW. Specifically, in each of the semiconductor chip regions CPR of the semiconductor wafer SW, the electrical test is performed on each of the semiconductor chip regions CPR by applying a test probe (probe needle, probe) to the exposed pad electrodes PD. Based on a result of this probe test, it is possible to sort out whether each of the semiconductor chip regions CPR of the semiconductor wafer SW is good or not, or to feedback data of the measurement result of the probe test to each manufacturing process, whereby the result can be used for improving a yield and reliability. Accordingly, it is preferred that the probe test be performed although it may be omitted.

Next, an assembling step of the semiconductor device PKG is performed (step S4 of FIG. 6). Specifically, the assembling step of step S4 can be performed as follows (steps S4a to S4f).

First, after a back grinding step and the like in which the back surface of the semiconductor wafer SW is ground is performed as necessary, the semiconductor wafer SW is diced (cut), whereby the semiconductor wafer SW is separated (divided) into individual semiconductor chips (step S4a of FIG. 7). In this step, for example, in a state where the back surface of the semiconductor wafer SW is fixed to a dicing sheet, a dicing blade rotating at a high speed is moved along the scribing region SCB from a front surface side of the semiconductor wafer SW, whereby the semiconductor wafer SW is cut (diced) along the scribing region SCB between the plurality of semiconductor chip regions CPR. By dicing, the semiconductor wafer SW is separated (divided) into individual semiconductor chip regions CPR, and each of the semiconductor chip regions CPR becomes an individually-diced semiconductor chip. The diced semiconductor chip corresponds to the semiconductor chip CP, which is used in a die bonding step to be performed later. In this manner, the semiconductor chip (CP) is obtained from each of the semiconductor chip regions CPR of the semiconductor wafer SW.

Figure 10:
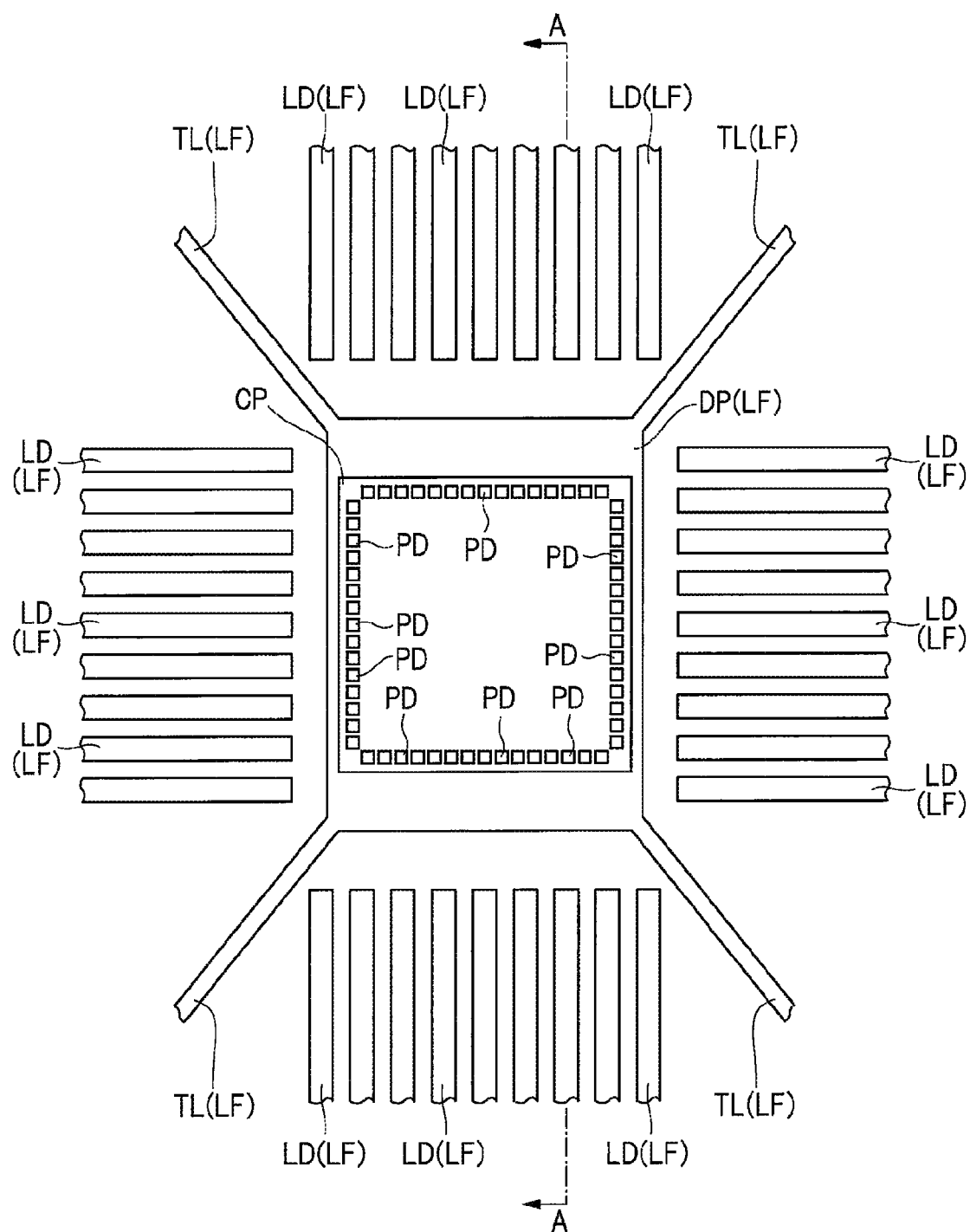
FIG. 10 is a plan view for describing the manufacturing process of the semiconductor device according to the embodiment.
Figure 11:
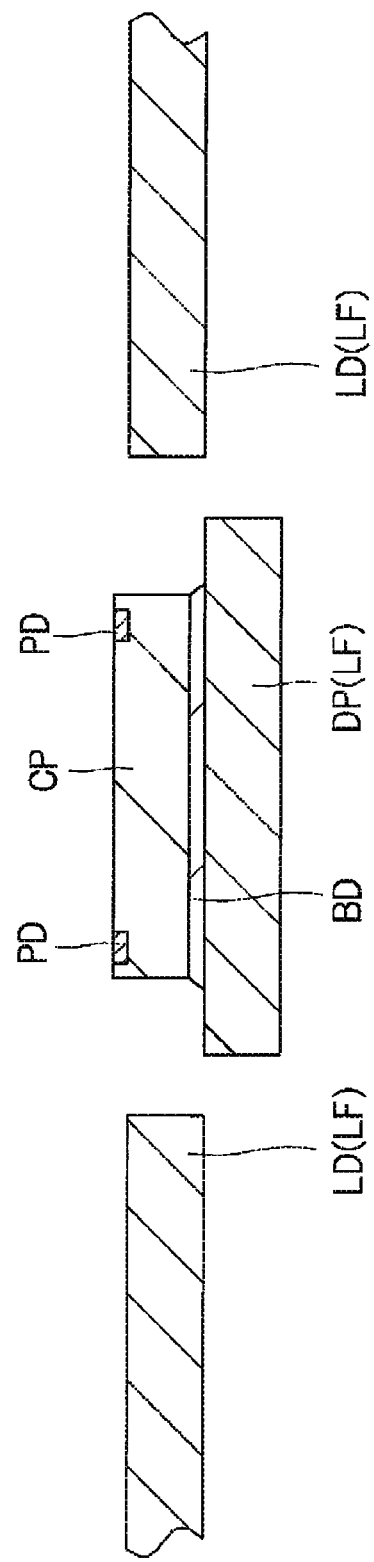
FIG. 11 is a cross-sectional view for describing the manufacturing process of the semiconductor device according to the embodiment.

Next, the die bonding step of the semiconductor chip CP is performed, and as illustrated in FIGS. 10 and 11, the semiconductor chip CP is mounted over the die pad DP included in a lead frame LF and is bonded thereto via the bonding material BD (step S4b of FIG. 7). In this step, the semiconductor chip CP is mounted over the upper surface of the die pad DP via the bonding material BD such that the front surface in which the pad electrodes PD of the semiconductor chip CP are formed faces upward and such that the back surface of the semiconductor chip faces the upper surface of the die pad DP. That is, in step S4b, the back surface of the semiconductor chip CP is bonded to the upper surface of the die pad DP via the bonding material BD. FIG. 10 corresponds to a plan view at a stage where the die bonding step of step S4b has been completed, and FIG. 11 substantially corresponds to a cross-sectional view cut along the line A-A of FIG. 10.

Note that the lead frame LF integrally includes a frame (not illustrated), the plurality of leads LD connected to the frame, and the die pad DP connected to the frame via the plurality of suspension leads TL.

Figure 12:
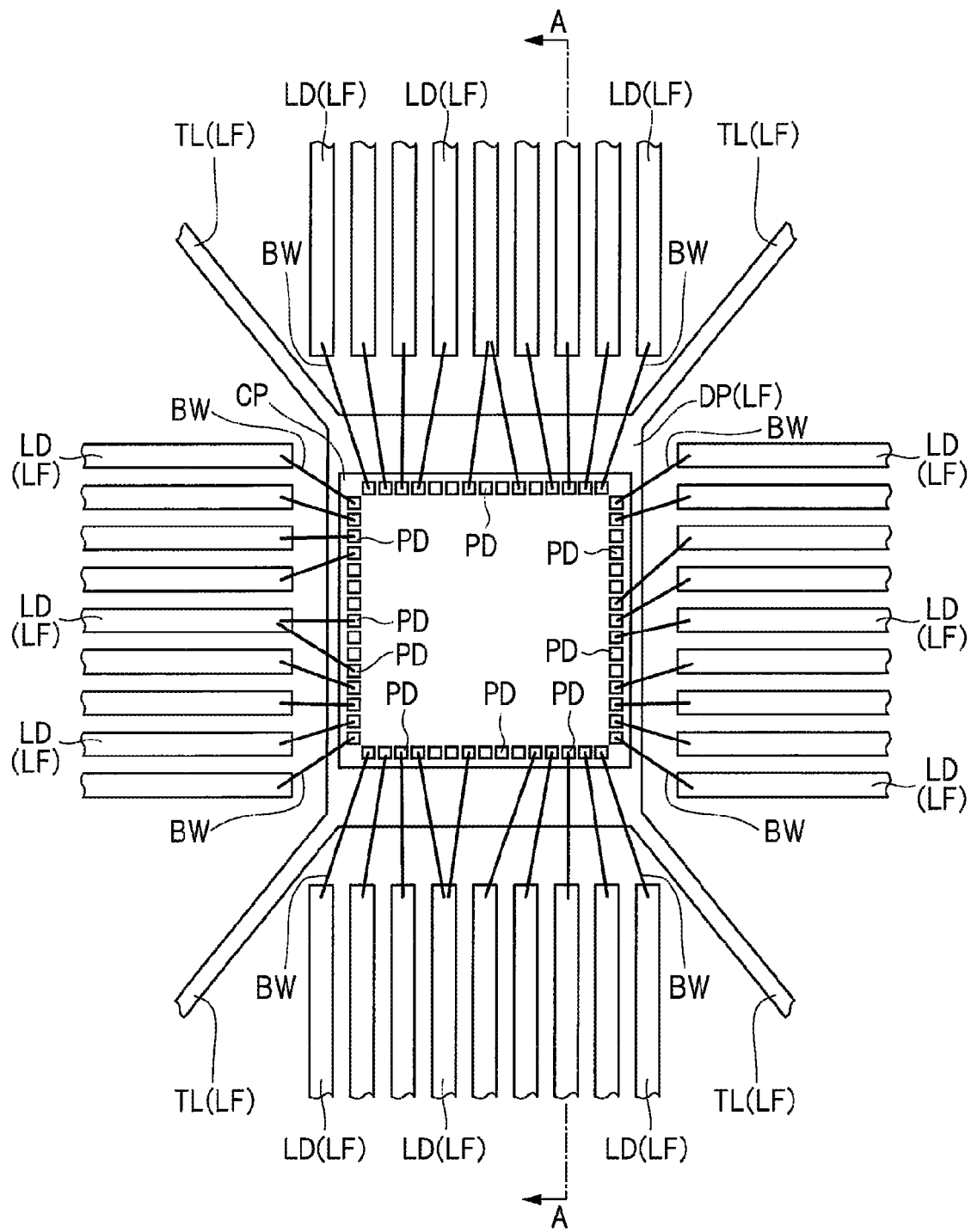
FIG. 12 is a plan view for describing the manufacturing process of the semiconductor device according to the embodiment.
Figure 13:
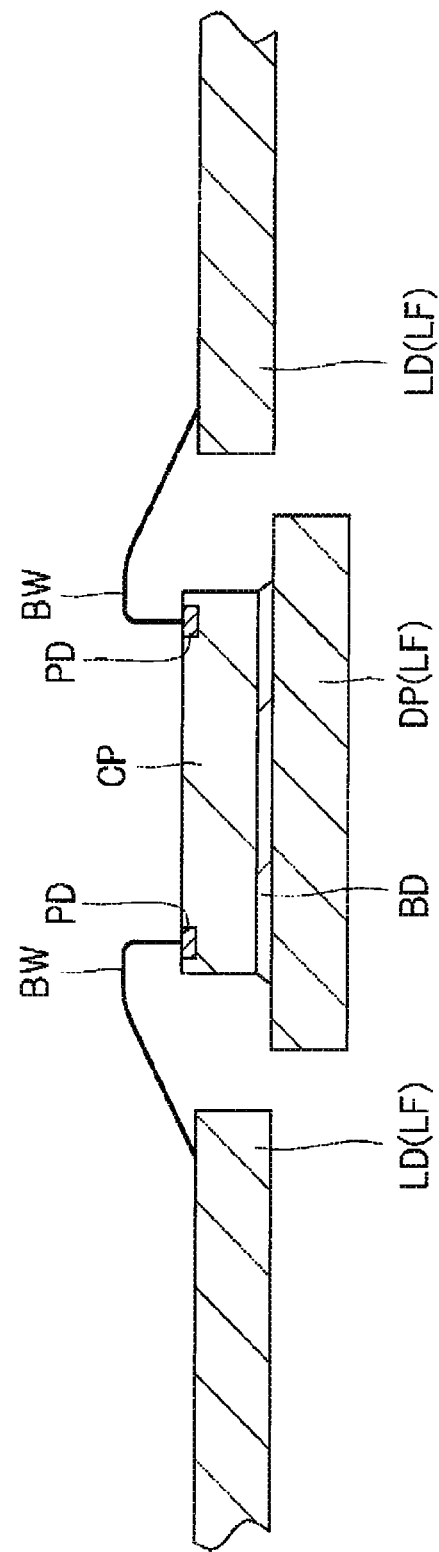
FIG. 13 is a cross-sectional view for describing the manufacturing process of the semiconductor device according to the embodiment.

Next, a wire bonding step is performed as illustrated in FIGS. 12 and 13 (step S4c of FIG. 7). In step S4c, the plurality of pad electrodes PD of the semiconductor chip CP are electrically connected to the plurality of leads LD of the lead frame LF via the plurality of wires BW, respectively. Each of the wires BW has one end connected to each of the pad electrodes PD of the semiconductor chip CP and the other end connected to each of the leads LD of the lead frame LF. FIG. 12 corresponds to a plan view at a stage where the wire bonding step of step S4c has been completed, and FIG. 13 substantially corresponds to a cross-sectional view cut along the line A-A of FIG. 12.

In the wire bonding step of step S4c, there are also formed wires BW1, BW3, BW4, and BW5 illustrated in FIGS. 28 and 31 described later. That is, a pad electrode PD1 is electrically connected to a lead LD1 via the wire BW1, a pad electrode PD2 is electrically connected to a lead LD3 via the wire BW5, a pad electrode PD3 is electrically connected to the lead LD3 via the wire BW3, and a pad electrode PD4 is electrically connected to a lead LD4 via the wire BW4.

Figure 14:
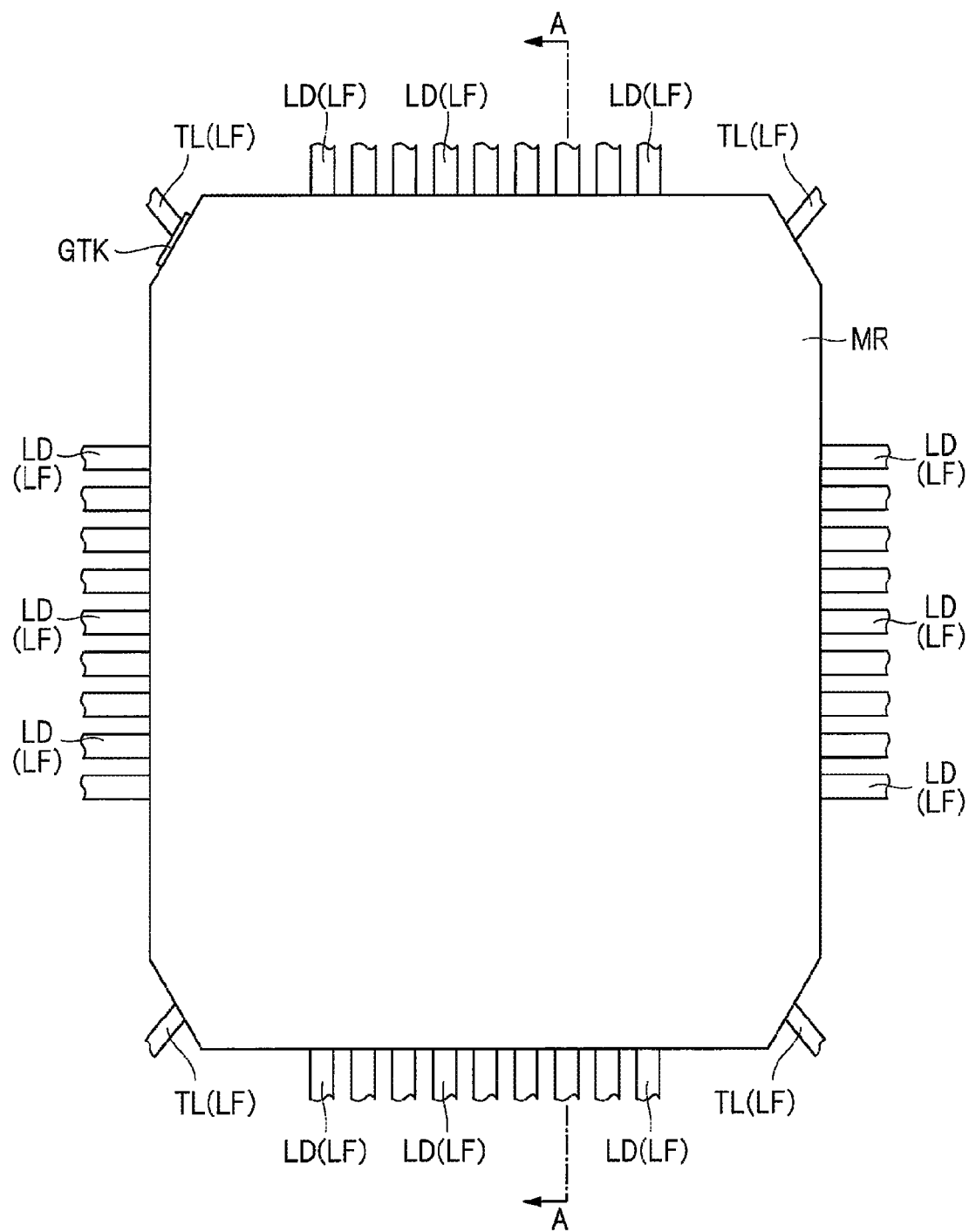
FIG. 14 is a plan view for describing the manufacturing process of the semiconductor device according to the embodiment.
Figure 15:
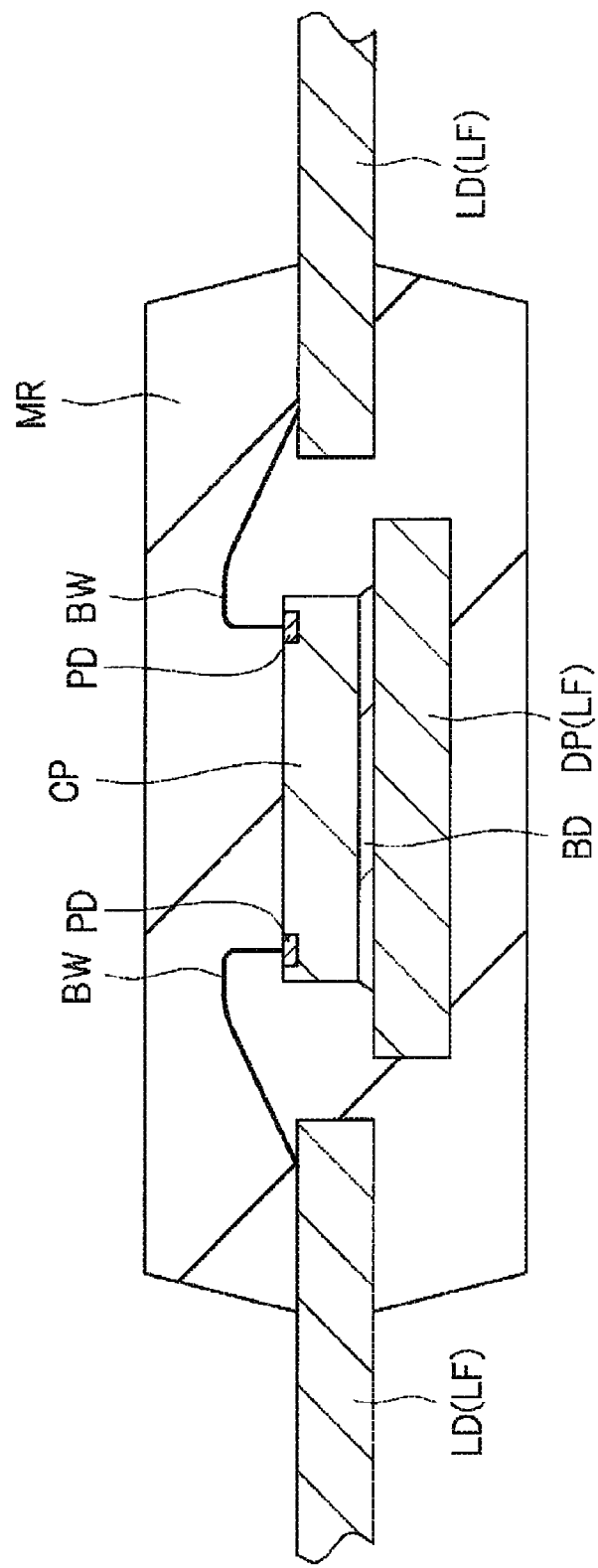
FIG. 15 is a cross-sectional view for describing the manufacturing process of the semiconductor device according to the embodiment.

Next, by performing resin sealing in a molding step (resin molding step), the semiconductor chip CP and the plurality of wires BW connected thereto are sealed with the sealing portion (sealing body, sealing resin portion) MR (step S4d of FIG. 7). In this molding step of step S4d, there is formed the sealing portion MR sealing the semiconductor chip CP, the die pad DP, the inner lead portions of the plurality of leads LD, the plurality of wires BW and the plurality of suspension leads TL. FIG. 14 corresponds to the plan view at a stage where the molding step of step S4d has been completed, and FIG. 15 substantially corresponds to a cross-sectional view cut along the line A-A in FIG. 14.

Figure 16:
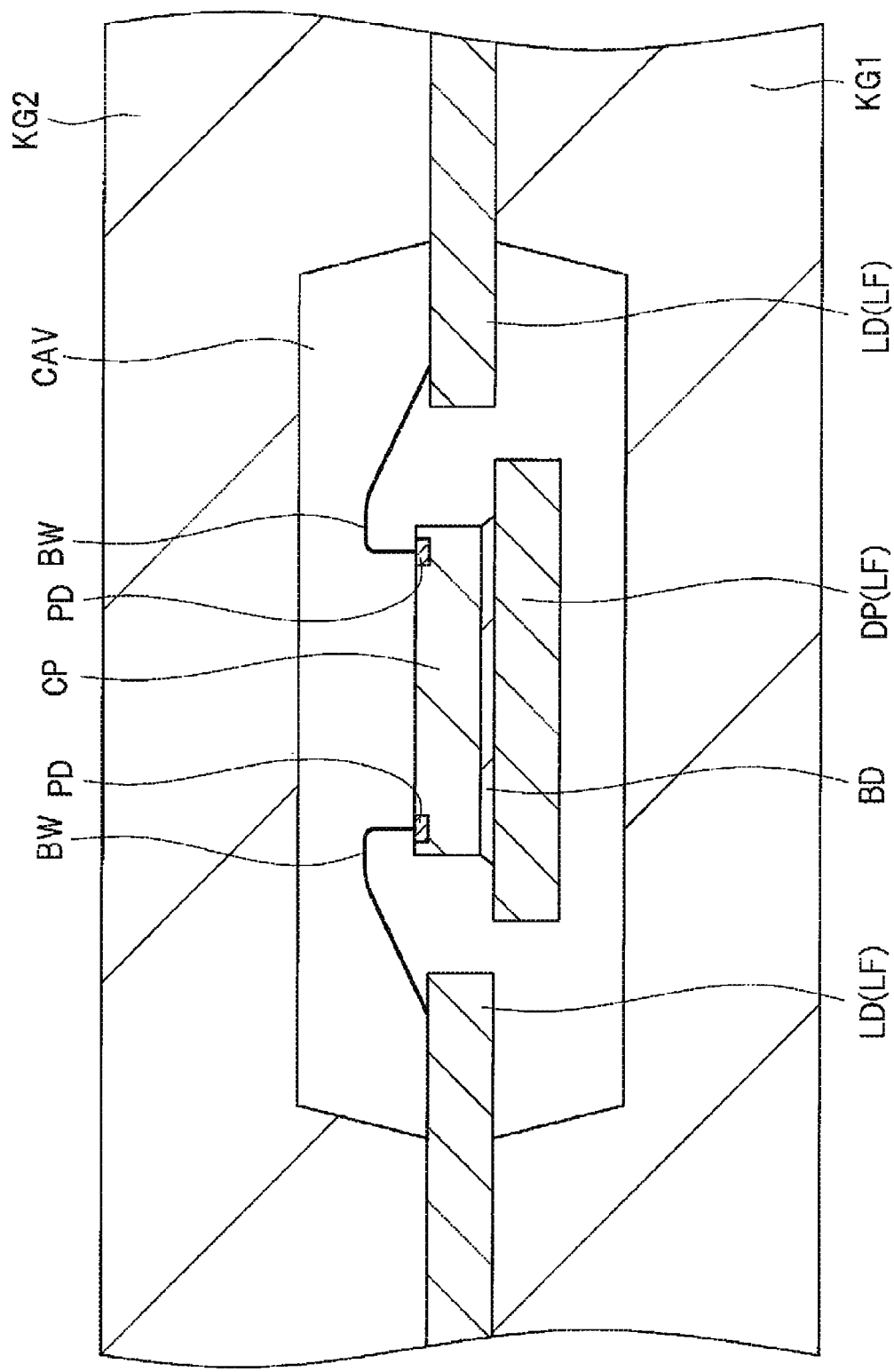
FIG. 16 is a cross-sectional view for describing the manufacturing process of the semiconductor device according to the embodiment.
Figure 17:
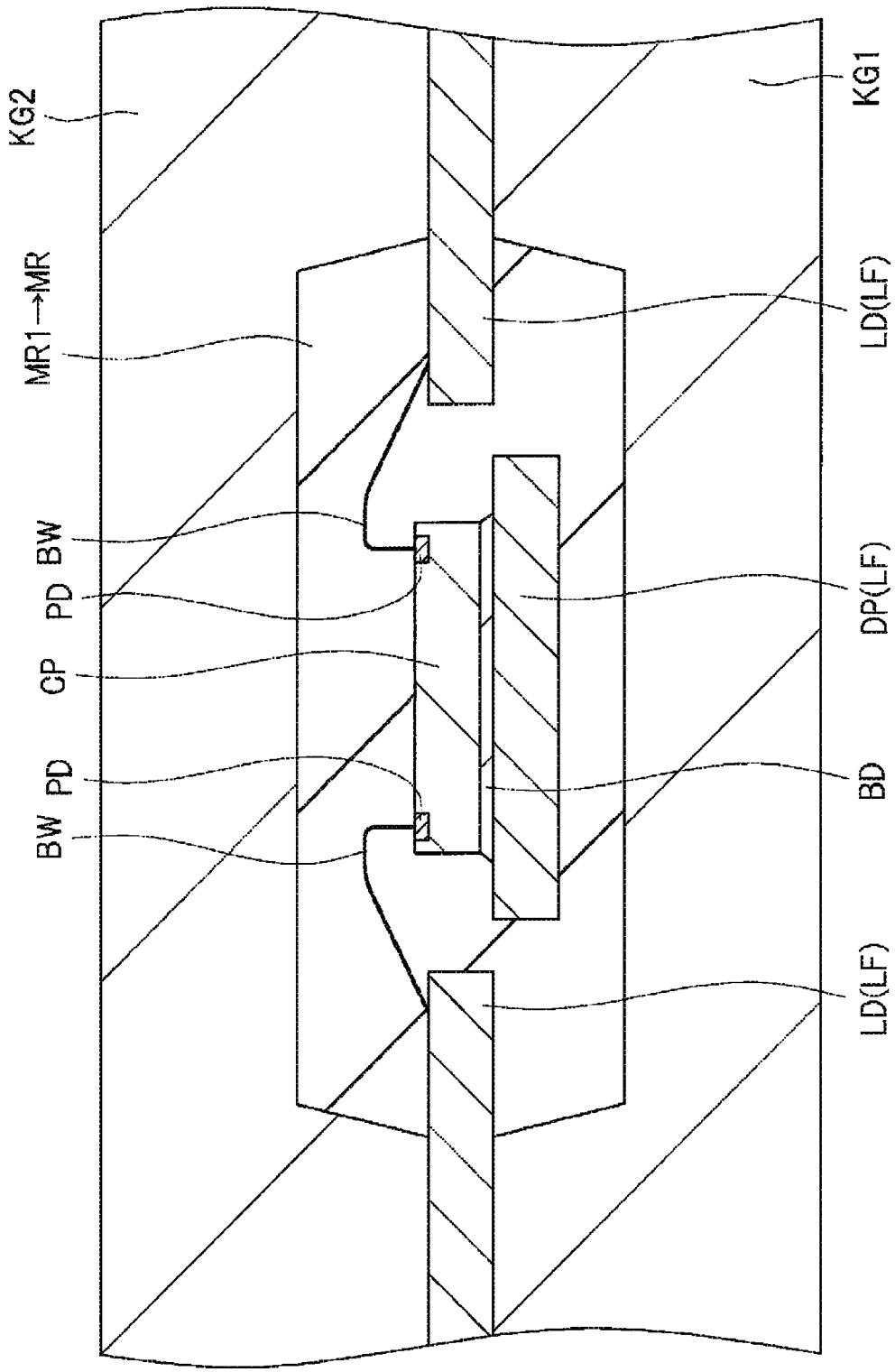
FIG. 17 is a cross-sectional view for describing the manufacturing process of the semiconductor device according to the embodiment.

Specifically, the molding step of step S4d can be performed in the following (FIGS. 16 and 17). FIGS. 16 and 17 are explanatory diagrams of the molding step and illustrate a cross-section equivalent to FIG. 15.

That is, the lead frame LF, on which the processes up to the wire bonding step of step S4c have been performed, is disposed on a metal mold (lower metal mold) KG1 as illustrated in FIG. 16, and the lead frame LF is sandwiched (clamped) and fixed by the metal mold KG1 and the metal mold (upper metal mold) KG2. In this case, the outer lead portion of the lead LD is sandwiched by an upper surface of the metal mold KG1 and a lower surface of the metal mold KG2; however, the die pad DP, the semiconductor chip CP, the wires BW, and the inner lead portion of the leads LD are disposed inside a cavity CAV of the metal molds KG1 and KG2. Then, from a resin injection gate (an injection port corresponding to a gate GT of FIG. 32 described later) provided to the metal mold KG2, a resin material MR1 for forming the sealing portion MR is introduced (filled, injected) into the cavity CAV of the metal molds KG1 and KG2 as illustrated in FIG. 17. This resin material MR1 is made of a resin material such as a thermosetting resin material, for example, and a filler and the like may be also included. For example, it is possible to use an epoxy resin including the filler and the like as the resin material MR1. Then, the resin material MR1, which has been introduced into the cavity CAV of the metal molds KG1 and KG2, is cured by heating and the like. The sealing portion MR is formed of the resin material MR1 that has been cured. Subsequently, the metal molds KG1 and KG2 are released, and the lead frame LF in which the sealing portion MR has been formed is taken out. Accordingly, a structural body illustrated in FIGS. 14 and 15 described above is obtained.

In this manner, the molding step of step S4d can be performed.

The sealing portion MR that has been formed has a resin injection mark GTK (see FIG. 14). This resin injection mark GTK corresponds to a mark of the resin injection gate (injection port) when the resin material MR1 for forming the sealing portion MR is injected into the cavity CAV of the metal molds KG1 and KG2 in the molding step of step S4d. Accordingly, a position where the resin injection mark GTK is formed in the sealing portion MR corresponds to a position of injecting the resin material MR1 (position of the resin injection gate) when the resin material MR1 is injected into the cavity CAV of the metal molds KG1 and KG2 to form the sealing portion MR.

Next, after a plating process is performed as necessary on the outer lead portions of the leads LD exposed from the sealing portion MR, the leads LD and the suspension leads TL are cut at a predetermined position outside the sealing portion MR and are separated from the frame of the lead frame LF (step S4e of FIG. 7).

Figure 18:
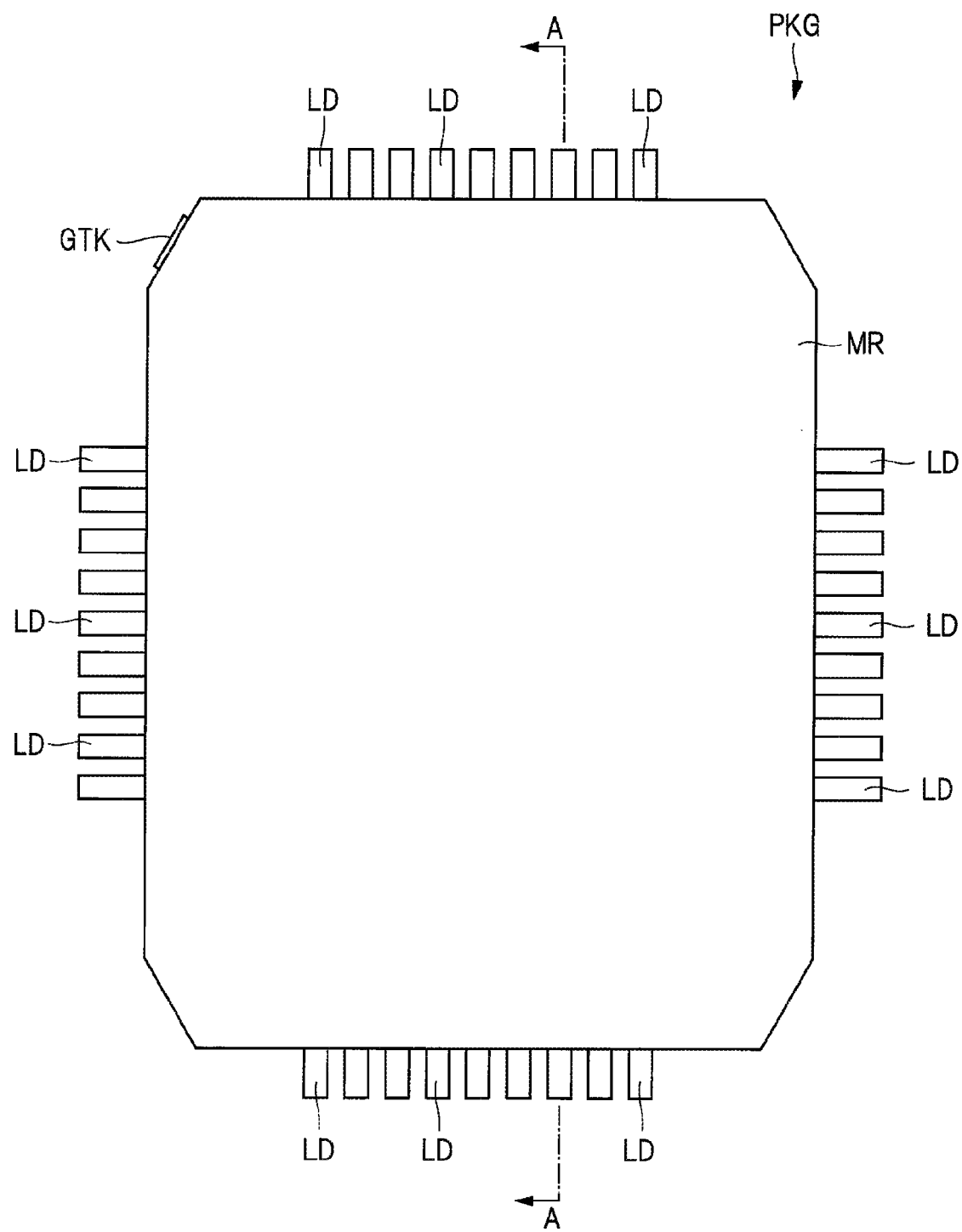
FIG. 18 is a plan view for describing the manufacturing process of the semiconductor device according to the embodiment.
Figure 19:
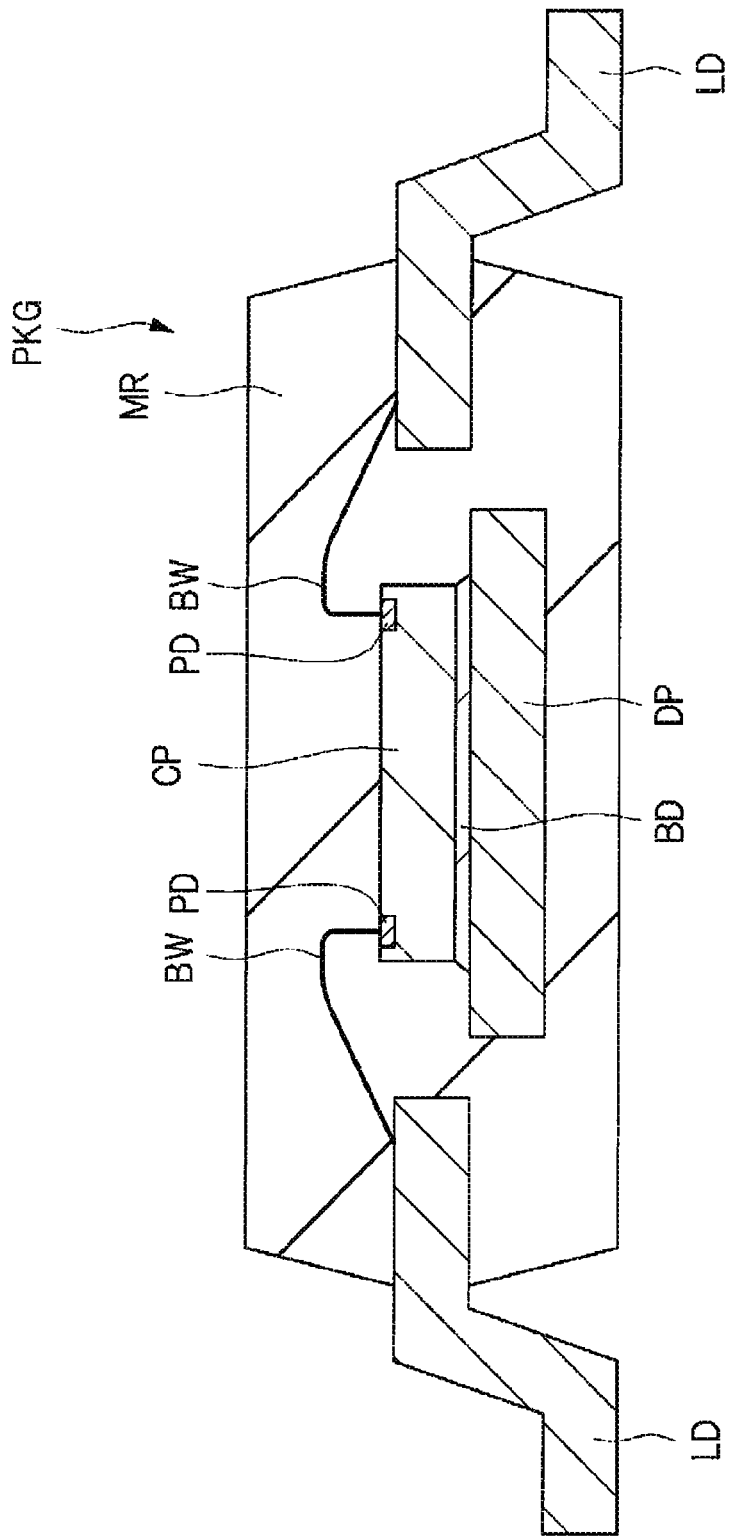
FIG. 19 is a cross-sectional view for describing the manufacturing process of the semiconductor device according to the embodiment.

Next, as illustrated in FIGS. 18 and 19, the outer lead portions of the leads LD that protrude from the sealing portion MR are folded and bent (lead processing, lead forming) (step S4f of FIG. 7). FIG. 18 corresponds to a plan view at a stage where a lead processing step of step S4f has been completed, and FIG. 19 substantially corresponds to a cross-sectional view cut along the line A-A in FIG. 18.

Accordingly, by performing steps S4a to S4f, the assembling step of the semiconductor device PKG of step S4 described above is performed. In this manner, the semiconductor device PKG is manufactured.

Next, a test (inspection) of the semiconductor device PKG is performed (step S5 of FIG. 6). Various tests are conducted in a testing step of step S5, and a defective product is sorted out and removed. The testing step of step S5 can be performed, for example, by inserting the leads LD, which are external terminals of the semiconductor device PKG, into a testing socket and by conducting an electrical test.

Then, the semiconductor device PKG is shipped (step S6 of FIG. 6).

<Background of Study>

Next, a background of study performed by the present inventors will be described.

For a semiconductor device such as a general-purpose microcomputer product, for example, a large number of types of semiconductor package products are required according to customer needs and purposes. However, in a case where a semiconductor chip included in the semiconductor package products is changed according to the types of semiconductor package products, it is necessary to prepare as many types of semiconductor chips as the types of semiconductor package products. This may impose a heavy load on designing and manufacturing of the semiconductor chip and may cause an increase of manufacturing costs of the semiconductor chip and the semiconductor package using the semiconductor chip.

Accordingly, it has been considered to manufacture the multiple types of semiconductor package products by using a common semiconductor chip (corresponding to the semiconductor chip CP). For example, it has been considered to manufacture the multiple types of semiconductor package products each having the different number of pins (the number of terminals) by using the common semiconductor chip. In one example, a 100-pin semiconductor package product, a 144-pin semiconductor package product, a 176-pin semiconductor package product, and a 224-pin semiconductor package product are manufactured by using the common semiconductor chip. Note that the number of pins of the semiconductor package corresponds to the number of external terminals (e.g. leads) provided in the semiconductor package.

In a case where the multiple types of semiconductor package products each having the different number of pins are manufactured by using the common semiconductor chip (hereinafter, referred to as a common chip), the number of pads (corresponding to the pad electrodes PD) of the common chip is designed in accordance with the number of pins of the semiconductor package product having the largest number of pins.

Accordingly, in a case where the 224-pin semiconductor package product is manufactured, all of 224 pads of the common chip are valid pads; however, in a case where the 100-pin, 144-pin, or 176-pin semiconductor package product is manufactured, 224 pads of the common chip include the valid pads and invalid pads (unused pads) mixed together. Each of the valid pads of the common chip is electrically connected to each of the external terminals (leads) via a corresponding wire. In this case, the valid pads of the common chip are pads capable of transmitting a signal to the outside (for example, a motherboard on which this semiconductor package product is mounted, another semiconductor package product, and the like) of the common chip. The invalid pads of the common chip are forcibly put into a state (invalid state, or an off state) not capable of transmitting a signal to the outside (outside of the common chip) by a circuit in the common chip.

By manufacturing the multiple types of semiconductor package products each having the different number of pins by using the common chip, it is not necessary to change the type of semiconductor chip in manufacturing the multiple types of semiconductor package products each having the different number of pins, whereby it is possible to reduce the manufacturing costs of the semiconductor chip and the semiconductor package using the semiconductor chip.

Assuming that the multiple types of semiconductor package products each having the different number of pins are manufactured by using the common chip in this manner, except for a case where the semiconductor package product having the maximum number of pins (herein, 224 pins) is manufactured, the 224 pads of the common chip include the invalid pads (unused pads).

Now, in manufacturing the semiconductor package, after the respective pads of the semiconductor chip are connected to the respective external terminals via the respective wires in a wire bonding step, a molding step is performed in which the semiconductor chip, the wires, and the external terminals are sealed with a resin. Specifically, after the wire bonding step, the semiconductor chip, the wires, and the external terminals are disposed in a cavity of metal molds for molding (corresponding to the metal molds KG1 and KG2), a resin material for molding (corresponding to the resin material MR1) is injected into the cavity, and the resin material that has been injected is cured, whereby a resin sealing portion (corresponding to the sealing portion MR) is formed. The semiconductor chip, the wires, and a part of the external terminals are sealed with the resin sealing portion and are protected.

When the resin material for molding is injected into the cavity of the metal molds for molding, there is a possibility that the resin material that has been injected collides with a wire and deforms the wire and that the deformed wire contacts an adjacent wire. A phenomenon in which the resin material that has been injected into the cavity of the metal molds for molding collides with the wire and deforms the wire in a resin sealing step (molding step) is hereinafter referred to as a "wire sweep." The wire sweep occurs when the resin material that has been injected into the cavity of the metal molds for molding collides with the wire at a high speed. The wire sweep is more likely to occur when the speed of the resin material is high at a time of collision. In a case where the resin material is cured in a state where the wire sweep occurs and the adjacent wires are in contact with each other, the adjacent wires are in a short-circuit state, and accordingly, it is necessary to remove such a semiconductor package in an inspection conducted after the semiconductor package has been manufactured. This result in reducing a manufacturing yield of the semiconductor package and increasing the manufacturing cost of the semiconductor package.

Figure 20:
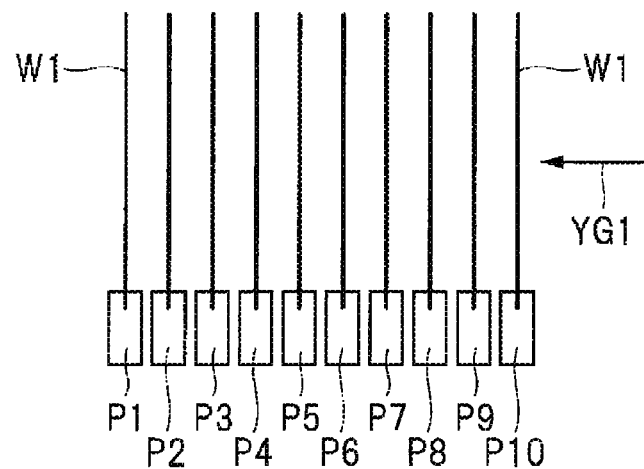
FIG. 20 is a plan view of a main part schematically illustrating a stage where a wire bonding step is performed in a case where a semiconductor package product is manufactured by using a common chip.
Figure 21:
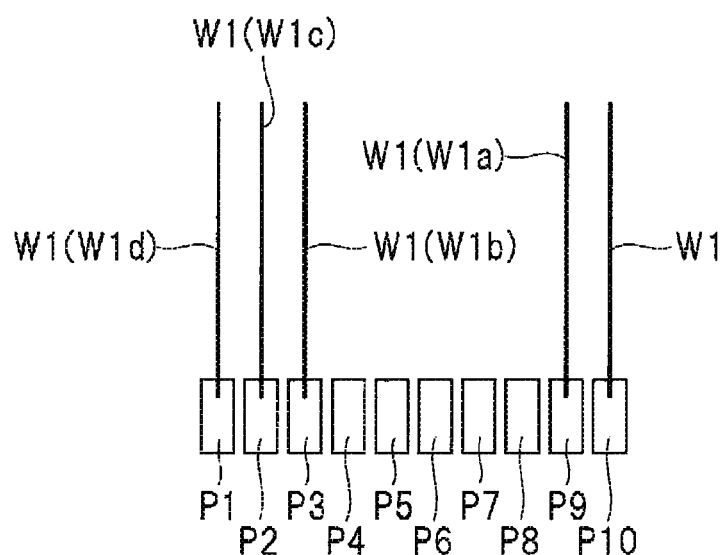
FIG. 21 is a plan view of another main part schematically illustrating a stage where a wire bonding step is performed in a case where a semiconductor package product is manufactured by using the common chip.

FIGS. 20 and 21 are plan views of main parts each schematically illustrating a stage where a wire bonding step is performed in a case where a semiconductor package product is manufactured by using a common chip. In FIGS. 20 and 21, FIG. 20 corresponds to a case where the 224-pin semiconductor package product is manufactured by using the common chip having 224 pads, and FIG. 21 corresponds to a case where the 100-pin semiconductor package product is manufactured by using the common chip having 224 pads. Note that, also in a case where the 144-pin or 176-pin semiconductor package product is manufactured, a basic idea is the same as that of FIG. 21.

In each of FIGS. 20 and 21, a part of the pads (in this case, 10 pads denoted by reference characters P1 to P10) among 224 pads (corresponding to the pad electrodes PD) of the common chip is illustrated. In the case of FIG. 20, all of 10 pads P1 to P10 illustrated are the valid pads and are each connected to a corresponding lead (corresponding to the lead LD, not illustrated in FIG. 20) via a corresponding wire W1 (corresponding to the wire BW). In the case of FIG. 21, among 10 pads P1 to P10, five pads P1, P2, P3, P9, and P10 are the valid pads and are each connected to the corresponding lead (corresponding to the lead LD, not illustrated in FIG. 21) via the corresponding wire W1 (corresponding to the wire BW), while five pads P4, P5, P6, P7, and P8 are the invalid pads and each have no corresponding lead, whereby no wires are connected thereto. That is, since the number of leads (number of pins) is smaller in the case of FIG. 21 than in the case of FIG. 20, the invalid pads (unused pads) corresponding to the decreased number of leads are generated among the pads of the common chip.

In the case of FIG. 20, all of the pads P1 to P10 of the common chip are the valid pads and are each connected to the corresponding lead via the corresponding wire W1, whereby an interval between the adjacent wires W1 is relatively small. In a case where the resin sealing step is performed in such state, the wire sweep is less likely to occur. This is because the resin material injected into the cavity of the metal molds travels along a resin traveling direction YG1 indicated with an arrow in FIG. 20 and collides with 10 wires W1 connected to the respective pads P1 to P10 in order; however, since momentum of traveling is weakened each time the resin material collides with the wires W1, a speed of the resin material is not increased so much when colliding with any of the wires W1, and the wires W1 are less likely to be deformed.

Figure 22:
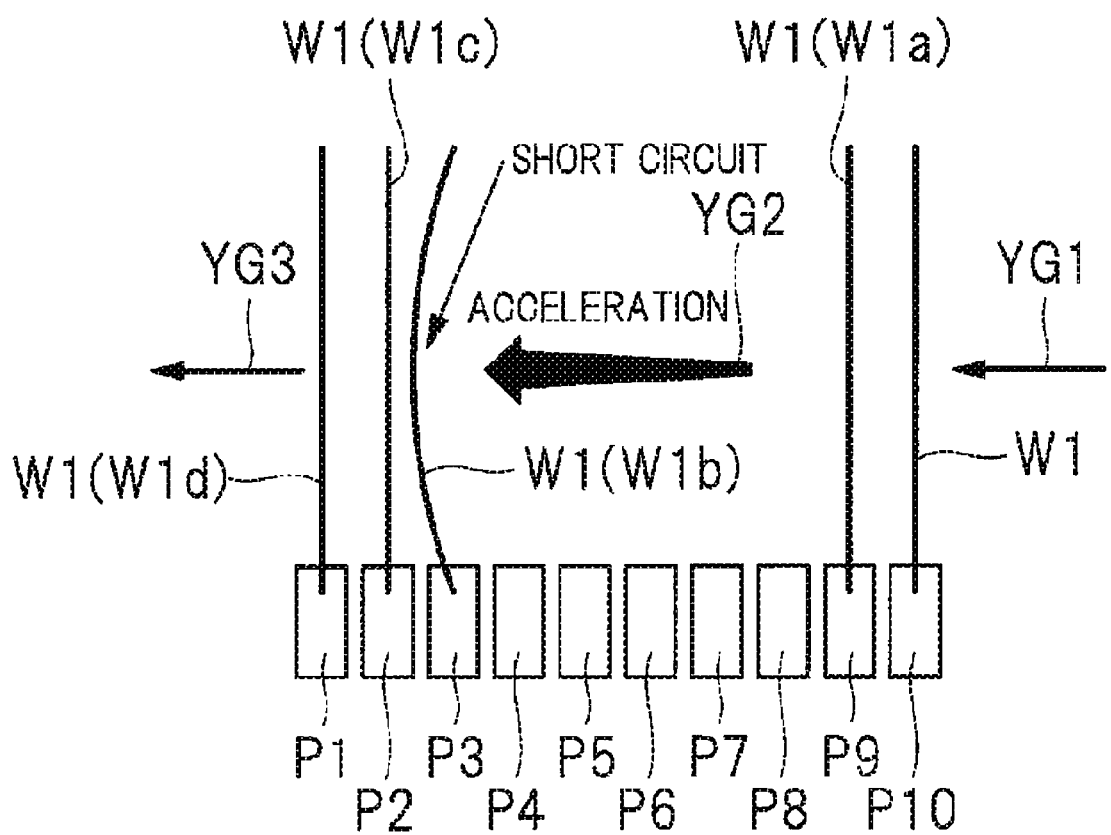
FIG. 22 is an explanatory diagram in a case where a resin sealing step is performed in a state of FIG. 21.

In contrast, in the case of FIG. 21, the pads P1, P2, P3, P9, and P10 are the valid pads and are each connected to the corresponding lead via the corresponding wire W1, while the pads P4 to P8 are the invalid pads (unused pads) and each have no corresponding leads, whereby no wires are connected thereto. Accordingly, in the case of FIG. 21, among the five wires W1 connected to the pads P1, P2, P3, P9, and P10, the interval between a wire W1a, which is connected to the pad P9, and a wire W1b, which is connected to the pad P3, is significantly large. In a case where the resin sealing step is performed in such state, the wire sweep is likely to occur in the wire W1b, which is connected to the pad P3. This will be described with reference to FIG. 22. FIG. 22 is an explanatory diagram in a case where the resin sealing step is performed in a state of FIG. 21.

The resin material that has been injected into the cavity of the metal molds travels along resin traveling directions YG1, YG2, and YG3 in FIG. 22 and collides with five respective wires W1 connected to the pads P1, P2, P3, P9, and P10 in order. In this case, the resin material flowing toward the wire W1b connected to the pad P3 after colliding with the wire W1a connected to the pad P9 is accelerated before colliding with the wire W1b since a distance between the wire W1a and the wire W1b is large, and the resin material collides with the wire W1b at a considerably fast speed and deforms the wire W1b, causing the wire sweep in the wire W1b. When the wire W1b is deformed and contacts an adjacent wire W1c, an electrical short circuit between the wire W1b connected to the pad P3 and the wire W1c connected to the pad P2 is caused, whereby the manufacturing yield of the semiconductor device is reduced.

As an effective method as a countermeasure against the wire sweep, there is a method in which an interval (pitch) between the pads of the semiconductor chip is increased, and this method is referred to as a first method. In the first method, by increasing the interval (pitch) between the pads, the interval between the adjacent wires is inevitably increased as well, and accordingly, even in a case where the wire sweep occurs and the wire is deformed, the deformed wire is less likely to contact the adjacent wire, and the wire sweep is less likely to cause the short circuit between the wires. Accordingly, the first method is a method effective for suppressing an adverse effect in a case where the wire sweep occurs (short circuit between the wires) rather than a method effective for suppressing an occurrence of the wire sweep.

Figure 23:
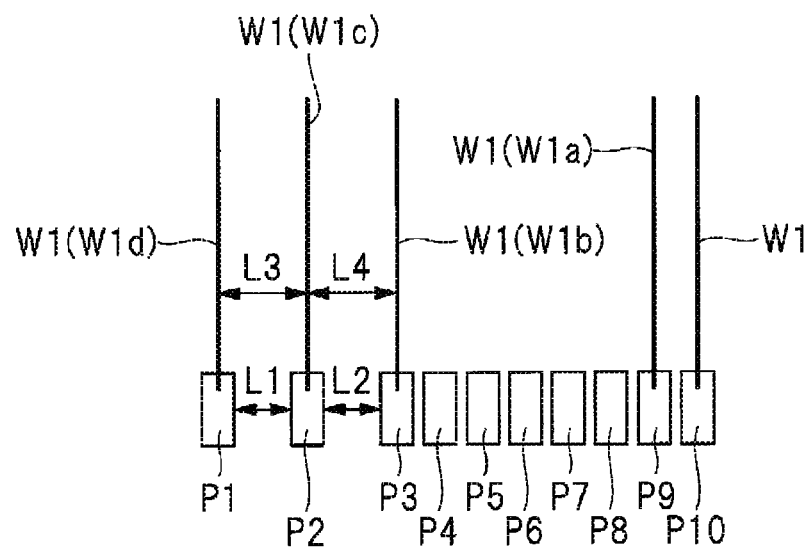
FIG. 23 is an explanatory diagram describing a case where a first method is applied to a configuration of FIG. 21 as a countermeasure against wire sweep.

FIG. 23 corresponds to a case where the first method is applied to a configuration of FIG. 21. Accordingly, in FIG. 23, an interval L1 between the pads P1 and P2, and an interval L2 between the pads P2 and P3 are made larger than the intervals in the case of FIG. 21, and accordingly, an interval L3 between wires W1d and W1c respectively connected to the pads P1 and P2, and an interval L4 between wires W1c and W1b respectively connected to the pads P2 and P3 become also larger than the intervals in the case of FIG. 21. Accordingly, in the case of FIG. 23, even when the wire sweep occurs and the wire W1b is deformed, since the interval L4 between the wires W1b and W1c is large, the wire W1b that has been deformed is less likely to contact the adjacent wire W1c. Thus, in the case of FIG. 23, occurrence of the wire sweep is less likely to cause the short circuit between the wires, whereby it is possible to suppress a reduction of the manufacturing yield of the semiconductor device due to the wire sweep.

However, since the first method is a method in which the interval (pitch) between the pads of the semiconductor chip is increased, it causes an increase in size of the semiconductor chip. The increase in the size of the semiconductor chip, or enlargement of the semiconductor chip causes enlargement of the semiconductor package manufactured by using such semiconductor chip as well as an increase of the manufacturing cost.

As an effective method as a countermeasure against the wire sweep, there is a method in which a dummy pad is provided in the semiconductor chip and a dummy wire is connected to the dummy pad, and this method is referred to as a second method. In the second method, by providing the dummy pad in the semiconductor chip and by connecting the dummy wire to the dummy pad, the interval between the wires (including the dummy wire) is decreased due to the dummy wire that has been disposed, compared to the case in which the dummy wire is not disposed. Accordingly, in the resin sealing step, the resin material injected into the cavity of the metal molds for molding is slowed down when colliding with a wire next to the dummy wire since it is decelerated by colliding with the dummy wire, whereby the wire is less likely to be deformed. Accordingly, the second method is a method effective for suppressing an occurrence of the wire sweep.

Figure 24:
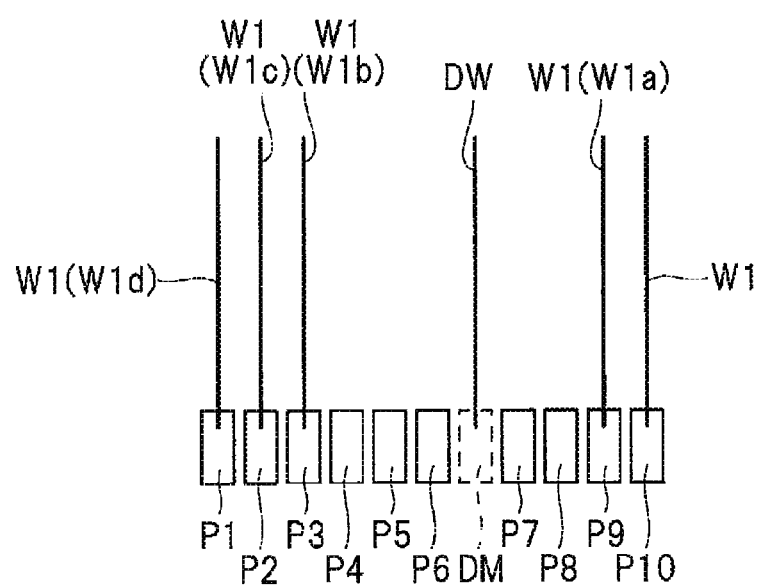
FIG. 24 is an explanatory diagram describing a case where a second method is applied to the configuration of FIG. 21 as the countermeasure against wire sweep.

FIG. 24 corresponds to a case where the second method is applied to the configuration of FIG. 21. Accordingly, in FIG. 24, a dummy pad DM is provided between the pads P6 and P7, and the dummy pad DM is connected to the lead via a dummy wire DW.

In the cases of FIGS. 21 and 22, the resin material that travels along the resin traveling direction YG1 collides with the wire W1a and flows along the resin traveling direction YG2 toward the wire W1b; however, since the distance between the wire W1a and the wire W1b is large, the resin material is accelerated before colliding with the wire W1b, and collides with the wire W1b at a considerably fast speed, and deforms the wire W1b.

In contrast, in a case of FIG. 24 in which the dummy pad DM and the dummy wire DW are provided, the resin material collides with the wire W1a, once collides with the dummy wire DW, then flows toward the wire W1b, and collides with the wire W1b. Since the resin material is decelerated by once colliding with the dummy wire DW, a speed of the resin material colliding with the wire W1b in the case of FIG. 24 is slower than a speed of the resin material colliding with the wire W1b in the cases of FIGS. 21 and 22. Accordingly, in the case of FIG. 24, since the speed of the resin material at the time of collision is slower, the wire W1b is less likely to be deformed even when the resin material collides therewith, whereby it is possible to suppress the wire sweep from occurring in the wire W1b. Thus, it is possible to suppress a reduction of the manufacturing yield of the semiconductor device due to the wire sweep.

However, since the second method is the method in which the dummy pad is provided in the semiconductor chip, it causes an increase in size of the semiconductor chip. This is because the dummy pad DM is a pad simply added such that the dummy wire DW can be disposed, is not connected to the circuit within the common chip, and is a completely unnecessary pad electrically. Adding the dummy pad DM for preventing a wire sweep causes an increase in the size of the semiconductor chip, or enlargement of the semiconductor chip. Furthermore, in a case where the dummy pad DM is added to the common chip, the dummy pad DM that has been added is completely unnecessary when the 224-pin semiconductor package is manufactured by using the common chip. That is, in a case where the dummy pad DM is added to the common chip such that occurrence of the wire sweep can be prevented when the 100-pin semiconductor package is manufactured by using the common chip, when the 224-pin semiconductor package is manufactured by using the common chip, the dummy pad DM that has been added is superfluous and may cause enlargement of the common chip. The increase in the size of the semiconductor chip or enlargement of the semiconductor chip causes enlargement of the semiconductor package manufactured by using the semiconductor chip and also causes an increase of the manufacturing cost.

That is, although both of the first method and the second method are effective as a countermeasure against the wire sweep, the methods cause the increase in the size of the semiconductor chip, whereby it is against demands such as downsizing and cost cutting of the semiconductor package strongly demanded in recent years.

<Circuit Configuration of Semiconductor Chip>

Figure 25:
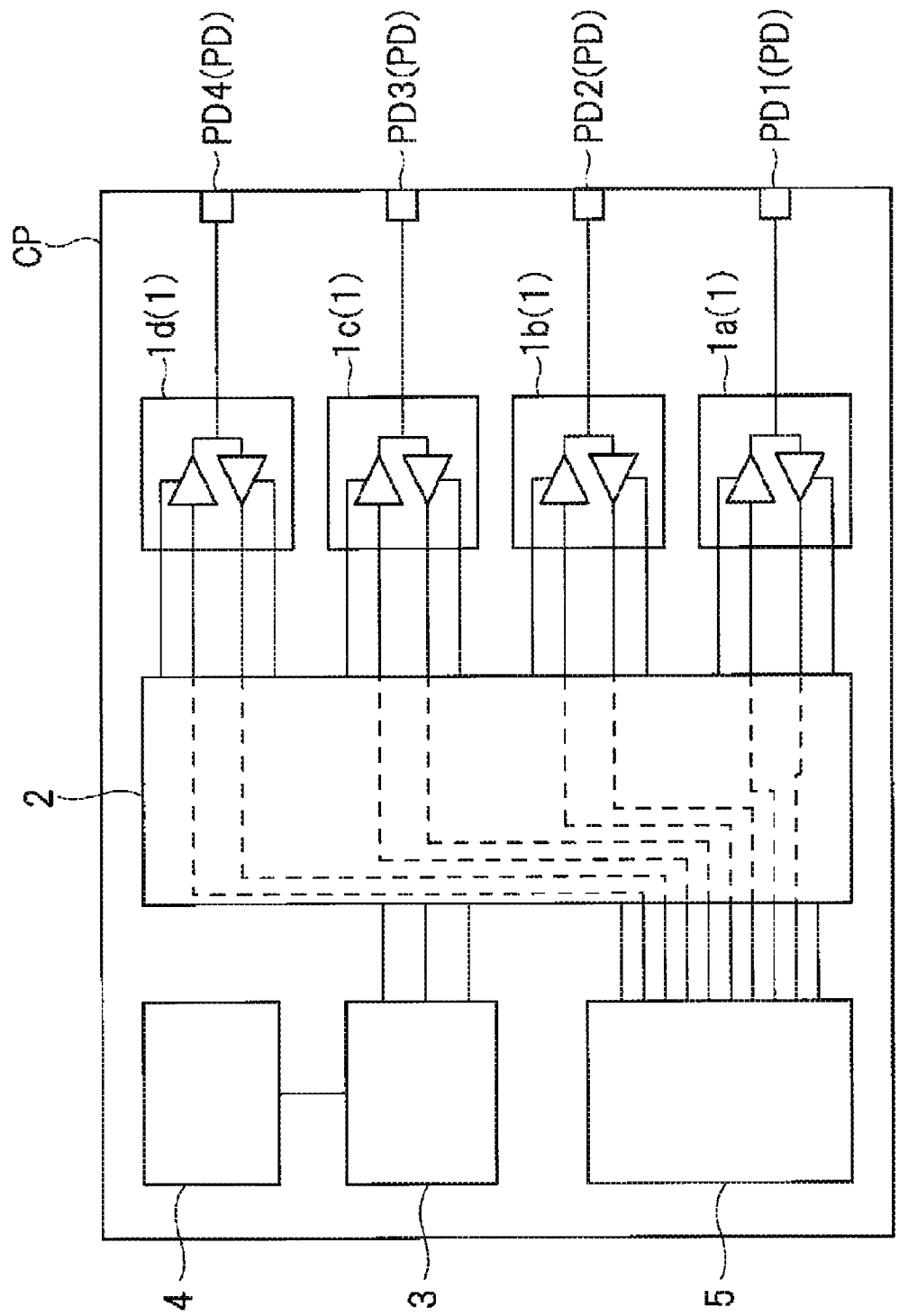
FIG. 25 is a circuit block diagram illustrating a circuit configuration of a semiconductor chip used in the semiconductor device according to the embodiment.

FIG. 25 is a circuit block diagram illustrating a circuit configuration of the semiconductor chip CP.

As illustrated in FIG. 25, the semiconductor chip CP includes an input output circuit unit (I/O circuit unit, I/O buffer circuit unit) 1 that is connected to each of the pad electrodes PD. The semiconductor chip CP further includes the control circuit unit 2, the decoder circuit unit 3, the storage circuit unit 4, and an internal circuit unit 5.

In FIG. 25, to facilitate understanding, four pad electrodes PD and four input output circuit units 1 corresponding thereto are illustrated; however, the numbers thereof are not limited to four, and in actuality, a larger number of the pad electrodes PD and the input output circuit units 1 corresponding thereto are further formed in the semiconductor chip CP. As described above, in a case where the 100-pin semiconductor package, the 144-pin semiconductor package, the 176-pin semiconductor package, and the 224-pin semiconductor package, for example, are manufactured by using the common semiconductor chip CP, 224 pad electrodes PD and the input output circuit units 1 corresponding thereto are formed in the semiconductor chip CP.

However, note that, in the semiconductor chip CP, all of the pad electrodes PD are connected to the respective input output circuit units 1. Accordingly, a pad electrode not connected to the corresponding input output circuit unit 1 is not provided in the semiconductor chip CP. Note that the above-described dummy pad DM is a completely unnecessary pad electrically, and any component equivalent to the input output circuit unit 1 is not connected thereto. Accordingly, in the semiconductor chip CP, any component equivalent to the above-described dummy pad DM is not formed.

In the semiconductor chip CP, each of the pad electrodes PD is connected to the internal circuit unit 5 via the input output circuit unit 1 connected to the pad electrode PD. That is, the input output circuit unit 1 is interposed between each of the pad electrodes PD and the internal circuit unit 5. The input output circuit unit 1 controls transmission of a signal between each of the pad electrodes PD and the internal circuit unit 5. That is, the input output circuit unit 1 is capable of controlling a signal that is input from the pad electrodes PD into the semiconductor chip CP to be input in the internal circuit unit 5 via the input output circuit unit 1 or a signal that is output from the internal circuit unit 5 to be output to the outside of the semiconductor chip CP from the pad electrodes PD via the input output circuit unit 1.

The control circuit unit 2 is connected to the input output circuit unit 1 to control the input output circuit unit 1. That is, package information (information) stored in the storage circuit unit 4 is decoded by the decoder circuit unit 3, and the control circuit unit 2 controls the input output circuit unit 1 based on the package information that has been decoded.

The storage circuit unit 4 is constituted by a non-volatile memory such as a flash memory, for example.

Specifically, in the storage circuit unit 4 of the semiconductor chip CP, as the package information, a package code (package information) indicating the number of pins of the semiconductor package (PKG) manufactured by using the semiconductor chip CP is stored. The decoder circuit unit 3 is a circuit that decodes the package code that is read from the storage circuit unit 4. The decoder circuit unit 3 decodes the package code which is read from the storage circuit unit 4, generates a decoding signal corresponding to the number of pins indicated by the package code, and outputs the signal to the control circuit unit 2. Based on the decoding signal of the decoder circuit unit 3, each of the input output circuit units 1 is switched between an enabled state and a forcibly-disabled state by the control circuit unit 2. When the input output circuit unit 1 is set to the enabled state by the control circuit unit 2, the pad electrode PD connected to the input output circuit unit 1 becomes the valid pad, whereby it is possible to transmit the signal that is input from the pad electrode PD into the internal circuit unit 5 via the input output circuit unit 1 or to output the signal that is transmitted from the internal circuit unit 5 to the outside of the semiconductor chip CP from the pad electrode PD via the input output circuit unit 1. When the input output circuit unit 1 is set to the disabled state by the control circuit unit 2, the pad electrode PD connected to the input output circuit unit 1 becomes the invalid pad (unused), whereby it is not possible to transmit the signal that is input from the pad electrode PD into the internal circuit unit 5 via the input output circuit unit 1 and to output the signal that is from the internal circuit unit 5 from the pad electrode PD via the input output circuit unit 1.

The control circuit unit 2 is a circuit that selects/controls each control terminal (enable input/output and the like) of the input output circuit unit 1. In addition, the control circuit unit 2 selects a transmission path of input data or output data between a central processing unit (CPU) or a peripheral IP (intellectual property core (IP core)) included in the internal circuit unit 5 and the input output circuit unit 1. Also, the storage circuit unit 4 stores the package code; however, it may further store information other than the package code. The internal circuit unit 5 is a circuit in which transmission of a signal is performed with a circuit outside the semiconductor chip CP via the pad electrodes PD and may include, for example, the CPU, the peripheral IP, and the like. The internal circuit unit 5 may also include a plurality of circuit units (circuit blocks).

Also, in FIG. 25, as the pad electrodes PD included in the semiconductor chip CP, four pad electrodes PD1, PD2, PD3, and PD4 are illustrated, and it is assumed that the pad electrodes PD1, PD2, PD3, and PD4 are the pad electrodes PD disposed along any side of four sides (the sides SD1, SD2, SD3, and SD4 illustrated in FIG. 3) of the semiconductor chip CP. That is, the pad electrodes PD1, PD2, PD3, and PD4 are disposed in the front surface of the semiconductor chip CP in the order of the pad electrodes PD1, PD2, PD3, and PD4 along any side of the sides SD1, SD2, SD3, and SD4. Accordingly, the pad electrodes PD2 and PD3 are disposed between the pad electrodes PD1 and the pad electrodes PD4, and of the pad electrodes PD2 and PD3, the pad electrode PD2 is disposed closer to the pad electrode PD1, and the pad electrode PD3 is disposed closer to the pad electrode PD4. That is, the pad electrode PD2 is disposed between the pad electrode PD3 and the pad electrode PD1, and the pad electrode PD3 is disposed between the pad electrode PD4 and the pad electrode PD2.

One input output circuit unit 1 is provided to one pad electrode PD. The input output circuit unit 1 provided to the pad electrode PD1 is referred to as an input output circuit unit 1*a*, the input output circuit unit 1 provided to the pad electrode PD2 is referred to as an input output circuit unit 1*b*, the input output circuit unit 1 provided to the pad electrode PD3 is referred to as an input output circuit unit 1*c*, and the input output circuit unit 1 provided to the pad electrode PD4 is referred to as an input output circuit unit 1*d*. The input output circuit unit 1*a* is connected to the pad electrode PD1, and the pad electrode PD1 is connected to the internal circuit unit 5 via the input output circuit unit 1*a*. In addition, the input output circuit unit 1*b* is connected to the pad electrode PD2, and the pad electrode PD2 is connected to the internal circuit unit 5 via the input output circuit unit 1*b*. Moreover, the input output circuit unit 1*c* is connected to the pad electrode PD3, and the pad electrode PD3 is connected to the internal circuit unit 5 via the input output circuit unit 1*c*. Further, the input output circuit unit 1*d* is connected to the pad electrode PD4, and the pad electrode PD4 is connected to the internal circuit unit 5 via the input output circuit unit 1*d*. The above is the same in FIGS. 26 to 28 described below.

<Configuration of Semiconductor Device>

Figure 26:
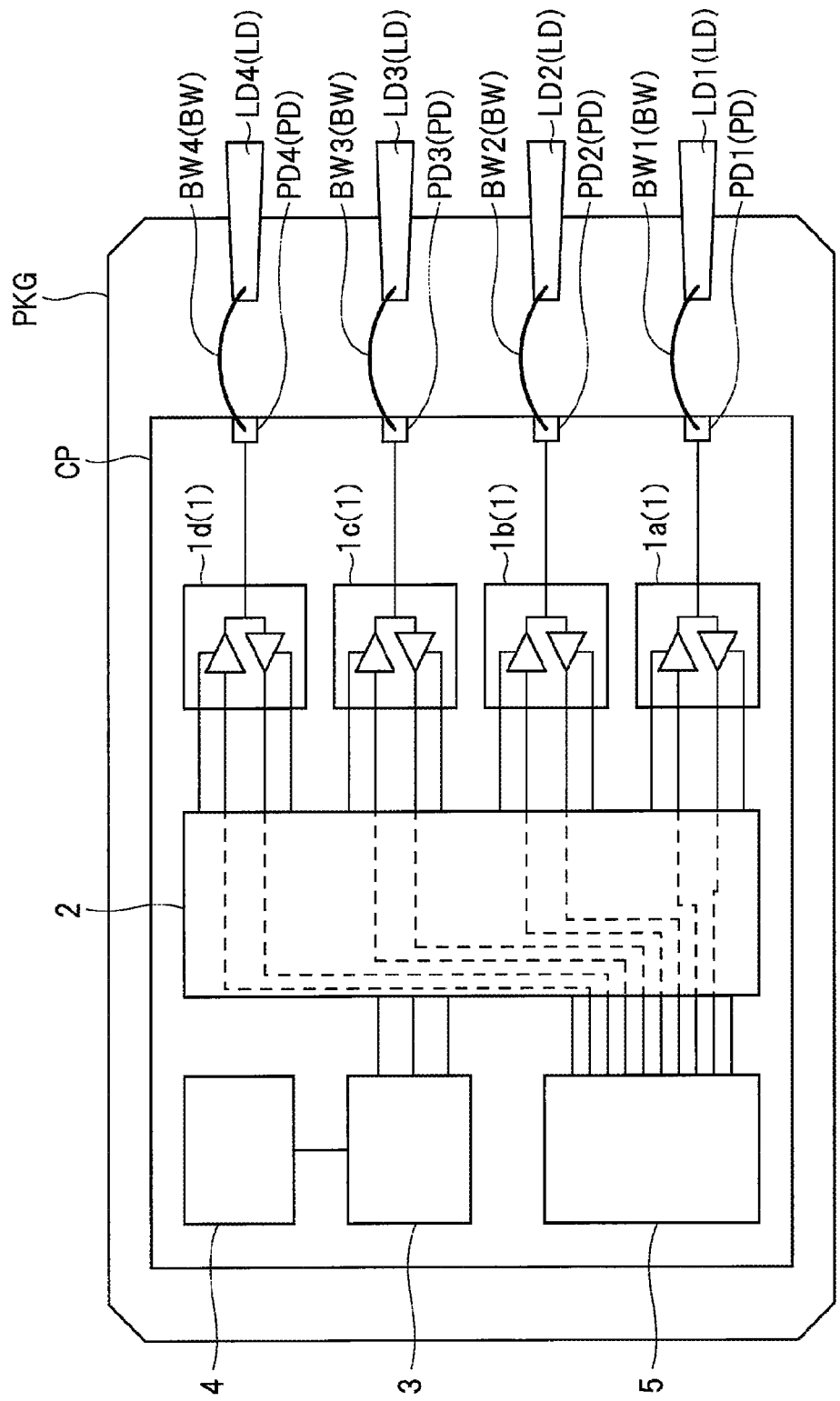
FIG. 26 is a circuit block diagram illustrating a circuit configuration in a case where a semiconductor package is manufactured by using the semiconductor chip of FIG. 25.
Figure 27:
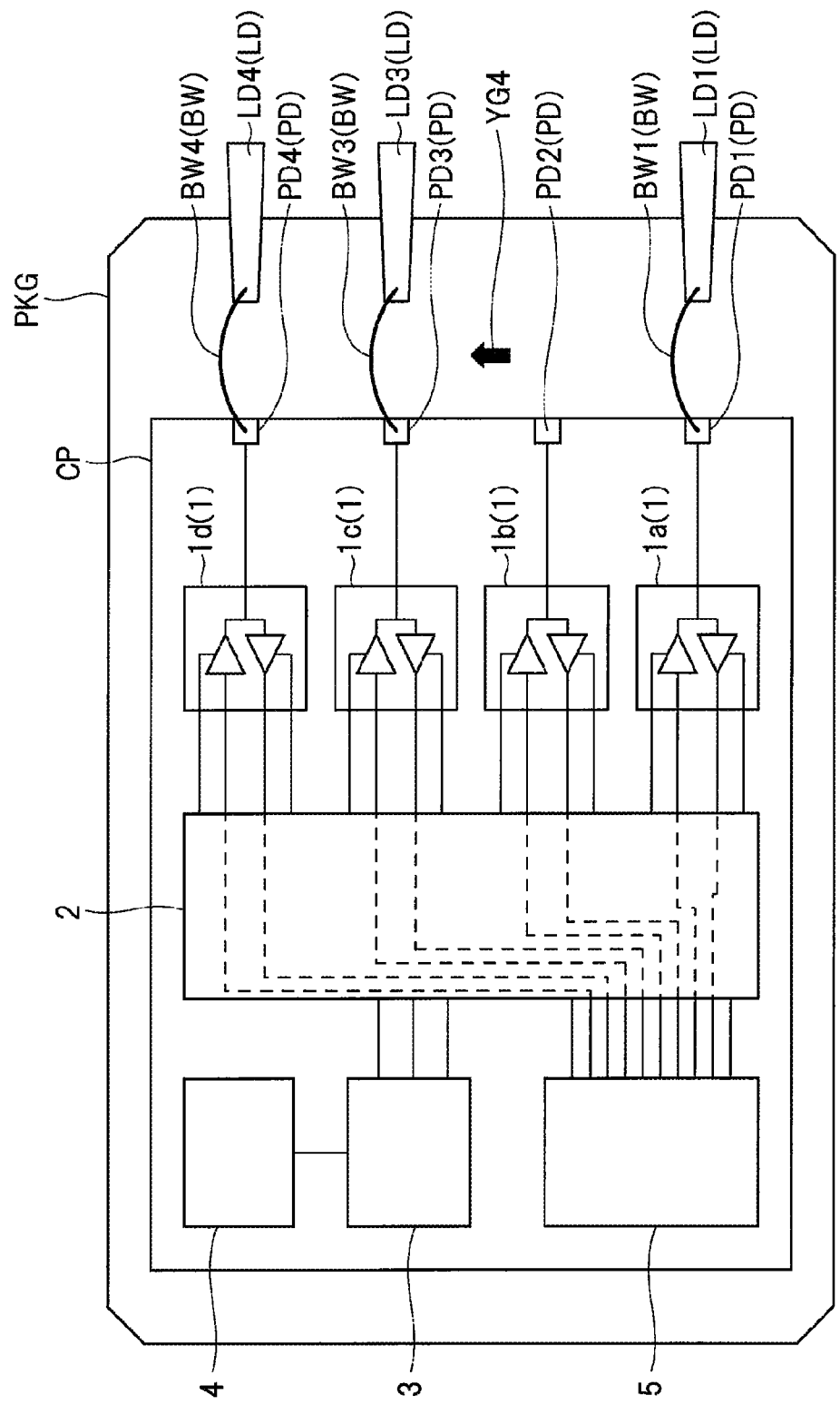
FIG. 27 is a circuit block diagram illustrating a circuit configuration in another case where a semiconductor package is manufactured by using the semiconductor chip of FIG. 25.
Figure 28:
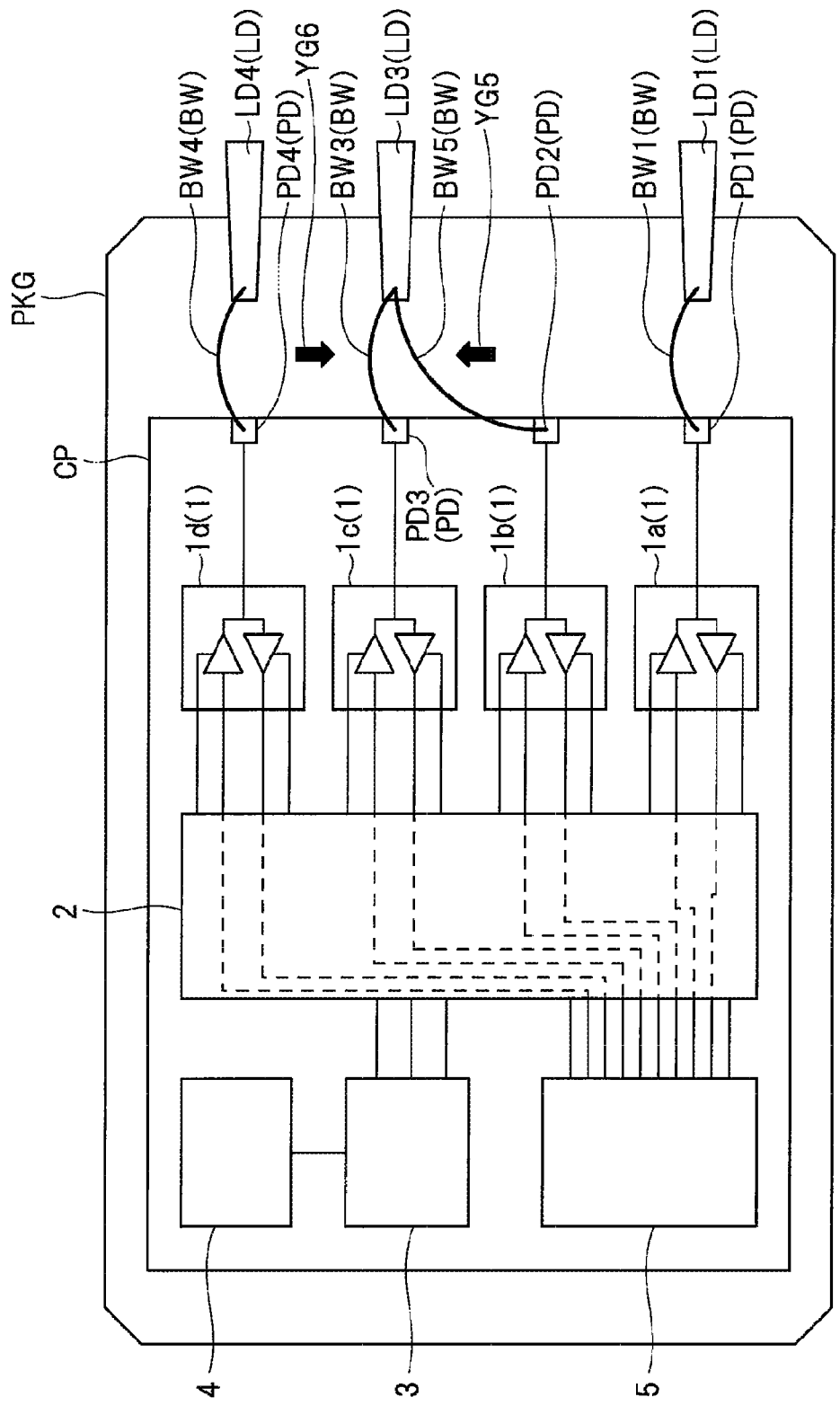
FIG. 28 is a circuit block diagram illustrating a circuit configuration in still another case where a semiconductor package is manufactured by using the semiconductor chip of FIG. 25.

FIGS. 26 to 28 are circuit block diagrams each illustrating a circuit configuration in a case where a semiconductor package (PKG) is manufactured by using the semiconductor chip CP of FIG. 25. FIG. 26 corresponds to a case where the 224-pin semiconductor package (PKG) is manufactured, and FIGS. 27 and 28 correspond to a case where the 100-pin, 144-pin, or 176-pin semiconductor package (PKG) is manufactured. Note that the technical idea according to this embodiment is not applied to the case of FIG. 27 and in contrast, the technical idea according to this embodiment is applied to the case of FIG. 28.

As described above, the multiple types of semiconductor packages each having the different number of pins are manufactured by using a single type of the semiconductor chip CP. That is, in manufacturing the multiple types of semiconductor packages each having the different number of pins, the semiconductor chip is made common, and the common semiconductor chip corresponds to the semiconductor chip CP. In this case, by way of example, there will be described a case in which the 224-pin semiconductor package, the 176-pin semiconductor package, the 144-pin semiconductor package, and the 100-pin semiconductor package are manufactured by using the semiconductor chip CP. As described above, the number of pins of the semiconductor package corresponds to the number of external terminals (here, leads LD) provided in the semiconductor package.

First, the case of FIG. 26 will be described.

The case of FIG. 26 corresponds to a case where, among the multiple types of semiconductor packages that can be manufactured by using the common semiconductor chip CP, the semiconductor package having the maximum number of pins (here, the 224-pin semiconductor package) is manufactured by using the common semiconductor chip CP. In this case, all of the plurality of pad electrodes PD provided in the semiconductor chip CP are the valid pads, and the pad electrodes PD are electrically connected to the respective leads LD via the respective wires BW. This is because, among the multiple types of semiconductor packages that can be manufactured by using the common semiconductor chip CP, the number of the pad electrodes PD provided in the semiconductor chip CP is designed according to the semiconductor package having the maximum number of pins (here, the 224-pin semiconductor package). In a case where the 224-pin semiconductor package is manufactured by using the semiconductor chip CP, the pad electrodes PD of the semiconductor chip CP correspond to the leads LD on a one-to-one basis, and each of the pad electrodes PD of the semiconductor chip CP is electrically connected to each of the leads LD of the semiconductor package PKG via each of the wires BW. That is, one end of each of the wires BW is connected to each of the pad electrodes PD of the semiconductor chip CP, and the other end of each of the wires BW is connected to each of the leads LD.

In this case, the valid pad corresponds to a pad (pad electrode) via which it is possible to input a signal into a circuit within the semiconductor chip CP or to output a signal from a circuit of the semiconductor chip CP. In the semiconductor packages having any of the numbers of pins manufactured by using the semiconductor chip CP, the number of leads LD of the semiconductor package (PKG) is identical to the number of valid pads of the semiconductor chip CP, and each of the valid pads of the semiconductor chip CP is electrically connected to each of the corresponding leads LD by each of the wires BW. Accordingly, in the semiconductor packages PKG having any of the numbers of pins manufactured by using the semiconductor chip CP, it is possible to input a signal into the circuit within the semiconductor chip CP from each of the leads LD via the wire BW and the valid pad connected to the lead LD or to output a signal from the circuit within the semiconductor chip CP to the lead LD via the valid pad and the wire BW connected to the valid pad.

Accordingly, all of the four pad electrodes PD1, PD2, PD3, and PD4 illustrated in FIG. 26 are the valid pads, and there are the leads LD (LD1, LD2, LD3, and LD4) corresponding thereto. That is, the lead LD1 corresponds to the pad electrode PD1, and the pad electrode PD1 is electrically connected to the lead LD1 via the wire BW1. The lead LD2 corresponds to the pad electrode PD2, and the pad electrode PD2 is electrically connected to the lead LD2 via the wire BW2. In addition, the lead LD3 corresponds to the pad electrode PD3, and the pad electrode PD3 is electrically connected the lead LD3 via the wire BW3. The lead LD4 corresponds to the pad electrode PD4, and the pad electrode PD4 is electrically connected to the lead LD4 via the wire BW4. In this case, the wire BW1 corresponds to the wire BW that connects the lead LD1 to the pad electrode PD1. The wire BW2 corresponds to the wire BW that connects the lead LD2 to the pad electrode PD2. The wire BW3 corresponds to the wire BW that connects the lead LD3 to the pad electrode PD3. The wire BW4 corresponds to the wire BW that connects the lead LD4 to the pad electrode PD4.

In the case of FIG. 26, between the lead LD1 and the internal circuit unit 5 of the semiconductor chip CP, a signal is transmitted via the wire BW1, the pad electrode PD1, and the input output circuit unit 1a. Also, between the lead LD2 and the internal circuit unit 5 of the semiconductor chip CP, a signal is transmitted via the wire BW2, the pad electrode PD2, and the input output circuit unit 1b. Also, between the lead LD3 and the internal circuit unit 5 of the semiconductor chip CP, a signal is transmitted via the wire BW3, the pad electrode PD3, and the input output circuit unit 1c. Also, between the lead LD4 and the internal circuit unit 5 of the semiconductor chip CP, a signal is transmitted via the wire BW4, the pad electrode PD4, and the input output circuit unit 1d.

Next, cases of FIGS. 27 and 28 will be described.

The cases of FIGS. 27 and 28 correspond to cases where, among the multiple types of semiconductor packages that can be manufactured by using the common semiconductor chip CP, the semiconductor package having the smaller number of pins (here, the 176-pin, 144-pin, or 100-pin semiconductor package) than the semiconductor package having the maximum number of pins (here, the 224-pin semiconductor package) is manufactured by using the common semiconductor chip CP. In these cases, the pad electrodes PD provided in the semiconductor chip CP include the valid pads and the invalid pads (unused pad) mixed together. This is because, among the multiple types of semiconductor packages that can be manufactured by using the common semiconductor chip CP, the number of the pad electrodes PD provided in the semiconductor chip CP is designed according to the semiconductor package having the maximum number of pins (here, 224 pins), and the number of valid pads of the semiconductor chip CP is determined by the number of pins of the semiconductor package to be manufactured. When the number of pins of the semiconductor package is small, even though the total number of the pad electrodes PD of the semiconductor chip CP does not change, the number of valid pads among the pad electrodes PD becomes small and the pad electrodes PD that are not the valid pads become the invalid pads (unused pads).

Between the cases of FIGS. 27 and 28, among four pad electrodes PD1, PD2, PD3, and PD4 illustrated in FIGS. 27 and 28, the pad electrodes PD1, PD3, and PD4 are the valid pads while the pad electrode PD2 is the invalid pad (unused pad). Compared to the case of FIG. 26, the number of leads LD is small in the cases of FIGS. 27 and 28, and the number of valid pads of the semiconductor chip CP corresponds to the number of leads LD.

For example, in a case where the number of pad electrodes PD of the semiconductor chip CP is designed to be 224 and the 224-pin semiconductor package is manufactured by using the semiconductor chip CP, all of 224 pad electrodes PD of the semiconductor chip CP are the valid pads. However, in a case where the 176-pin semiconductor package product is manufactured by using the semiconductor chip CP, among 224 pad electrodes PD of the semiconductor chip CP, 176 pad electrodes PD are the valid pads while the remaining 48 pad electrodes PD are the invalid pads. Also, in a case where the 144-pin semiconductor package product is manufactured by using the semiconductor chip CP, among 224 pad electrodes PD of the semiconductor chip CP, 144 pad electrodes PD are the valid pads while the remaining 80 pad electrodes PD are the invalid pads. Also, in a case where the 100-pin semiconductor package product is manufactured by using the semiconductor chip CP, among 224 pad electrodes PD of the semiconductor chip CP, 100 pad electrodes PD are the valid pads while the remaining 124 pad electrodes PD are the invalid pads. Accordingly, in the case where the 224-pin semiconductor package product is manufactured (corresponding to the case of FIG. 26), all of the pad electrodes PD of the semiconductor chip CP are the valid pads; however, in the case where the 100-pin, 144-pin, or 176-pin semiconductor package is manufactured (corresponding to the cases of FIGS. 27 and 28), the pad electrodes PD of the semiconductor chip CP include the valid pads and the invalid pads mixed together.

Among the pad electrodes PD of the semiconductor chip CP, the valid pads (here, the pad electrodes PD1, PD3, and PD4) are capable of transmitting a signal between the pad electrodes PD (valid pads) and the internal circuit unit 5 via the input output circuit unit 1, and the valid pads are electrically connected to the leads LD via the wires BW, respectively. Accordingly, transmission of a signal is performed between the internal circuit unit 5 of the semiconductor chip CP and the lead LD via the wire BW, the valid pads (pad electrodes PD1, PD3, and PD4), and the input output circuit unit 1.

In contrast, for the invalid pad (here, the pad electrode PD2) among the pad electrodes PD of the semiconductor chip CP, the input output circuit unit 1 interposed between the invalid pad and the internal circuit unit 5 is controlled by the control circuit unit 2 such that the transmission of a signal is impossible between the pad electrode PD (invalid pad) and the internal circuit unit 5. Specifically, the information stored in the storage circuit unit 4 is decoded by the decoder circuit unit 3, and the control circuit unit 2 controls the input output circuit unit 1 based on the information that has been decoded. The input output circuit unit 1 interposed between the invalid pad and the internal circuit unit 5 is controlled by the control circuit unit 2 such that the transmission of a signal is impossible between the invalid pad and the internal circuit unit 5. Accordingly, during operation of the semiconductor device PKG, that is, while a power supply voltage is supplied to the semiconductor device PKG, the invalid pad of the semiconductor chip CP is controlled in a state in which it is not possible to output a signal from a circuit within the semiconductor chip CP from the invalid pad or to transmit a signal, which has been input from the invalid pad, to a circuit within the semiconductor chip CP. That is, in the semiconductor chip CP, the invalid pad corresponds to a pad electrode controlled in a state in which it can function neither as an input terminal or an output terminal during the operation of the semiconductor device PKG.

Then, in a case where the 224-pin semiconductor package is manufactured by using the semiconductor chip CP, the package information indicating that it is the 224-pin semiconductor package is stored in the storage circuit unit 4 of the semiconductor chip CP. In this case, the package information stored in the storage circuit unit 4 is decoded by the decoder circuit unit 3, the control circuit unit 2 controls the input output circuit unit 1 based on the package information that has been decoded, and all of the pad electrodes PD (here, the pad electrodes PD1, PD2, PD3, and PD4) function as the valid pads.

In contrast, in a case where the semiconductor package having the smaller number of pins than 224 pins, for example, the 100-pin semiconductor package, is manufactured, the package information indicating that it is the 100-pin semiconductor package is stored in the storage circuit unit 4 of the semiconductor chip CP. In this case, the package information stored in the storage circuit unit 4 is decoded by the decoder circuit unit 3, the control circuit unit 2 controls the input output circuit unit 1 based on the package information that has been decoded, and a part of the pad electrodes PD (here, the pad electrodes PD1, PD3, and PD4) function as the valid pads while the remaining pad electrodes PD (here, the pad electrode PD2) are set as the invalid pads.

The valid pads of the semiconductor chip CP are capable of inputting a signal into a circuit within the semiconductor chip CP or outputting a signal from a circuit of the semiconductor chip CP via the valid pads. Then, the valid pads of the semiconductor chip CP are pads to be electrically connected to the leads LD serving as the external terminals. The valid pads are used for outputting a signal that is output from the valid pad to the outside of the semiconductor package from the lead LD or inputting a signal that is input into the lead LD from the outside of the semiconductor package to the circuit within the semiconductor chip CP from the valid pad. That is, the valid pads of the semiconductor chip CP are pads used as signal transmission paths, and in other words, these are pads used for inputting a signal into the circuit within the semiconductor chip CP or outputting a signal from the circuit within the semiconductor chip CP.

Accordingly, in both of the cases of FIGS. 27 and 28, the valid pads (here, the pad electrodes PD1, PD3, and PD4) of the semiconductor chip CP are electrically connected to the leads LD (LD1, LD3, and LD4) via the wires BW (BW1, BW3, and BW4), respectively. Specifically, the pad electrode PD1 is electrically connected to the lead LD1 via the wire BW1, the pad electrode PD3 is electrically connected to the lead LD3 via the wire BW3, and the pad electrode PD4 is electrically connected to the lead LD4 via the wire BW4. That is, a connection relation of the pad electrodes PD1, PD3, and PD4, the corresponding leads LD1, LD3, and LD4, and the wires BW1, BW3, and BW4 connecting therebetween is the same in the cases of FIGS. 26, 27 and 28.

Accordingly, the signal transmission paths between the leads LD1, LD3, and LD4 and the internal circuit unit 5 of the semiconductor chip CP are the same as those in the cases of FIGS. 26, 27, and 28. That is, between the lead LD1 and the internal circuit unit 5 of the semiconductor chip CP, a signal is transmitted via the wire BW1, the pad electrode PD1, and the input output circuit unit 1a. Also, between the lead LD3 and the internal circuit unit 5 of the semiconductor chip CP, a signal is transmitted via the wire BW3, the pad electrode PD3, and the input output circuit unit 1c. Also, between the lead LD4 and the internal circuit unit 5 of the semiconductor chip CP, a signal is transmitted via the wire BW4, the pad electrode PD4, and the input output circuit unit 1d. Accordingly, it is possible to input a signal into the circuit within the semiconductor chip CP from the leads LD (LD1, LD3, and LD4) via the wires BW (BW1, BW3, and BW4) connected to the respective leads LD, and the respective valid pads, or to output a signal to the respective leads LD from the circuit within the semiconductor chip CP via the respective valid pads and the wires BW (BW1, BW3, and BW4) connected to the respective valid pads.

In this manner, in any of the cases of FIGS. 26, 27 and 28, the leads LD function as the external terminals of the semiconductor package, and the transmission of a signal is performed between the internal circuit unit 5 of the semiconductor chip CP and the leads LD via the wires BW, the valid pads (pad electrodes PD), and the input output circuit units 1.

Compared to the case of FIG. 26, however, the number of the leads LD serving as the external terminals is small in the cases of FIGS. 27 and 28, and the lead LD2 corresponding to the pad electrode PD2 is not present. Reflecting this, the pad electrode PD2 is the valid pad in the case of FIG. 26; however, the pad electrode PD2 is the invalid pad (unused pad) in the cases of FIGS. 27 and 28. Then, the wire BW is not connected to the invalid pad (pad electrode PD2) in the case of FIG. 27; however, in the case of FIG. 28, one end of a wire BW5 is connected to the invalid pad (pad electrode PD2), and the other end of the wire BW5 is connected to the lead LD3. That is, in the case of FIG. 28, one end of each of two wires BW3 and BW5 is connected to the lead LD3, and the other end of the wire BW3 of the two wires is connected to the valid pad (pad electrode PD3) of the semiconductor chip CP while the other end of the wire BW5 of the other of the two wires is connected to the invalid pad (pad electrode PD2) of the semiconductor chip CP. In this case, the wire BW5 corresponds to the wire BW connecting the lead LD3 to the pad electrode PD2.

Accordingly, in the case of FIG. 28, as a connection path between the lead LD3 and the semiconductor chip CP, there are a path that connects the lead LD3 to the pad electrode PD3 (valid pad) of the semiconductor chip CP via the wire BW3 and a path that connects the lead LD3 to the pad electrode PD2 (invalid pad) of the semiconductor chip CP via the wire BW5.

However, the path in which a signal is transmitted between the lead LD3 and the semiconductor chip CP is the path that connects the pad electrode PD3 (valid pad) of the semiconductor chip CP to the lead LD3 via the wire BW3. The path that connects the pad electrode PD2 (invalid pad) of the semiconductor chip CP to the lead LD3 via the wire BW5 does not function as the path in which a signal is transmitted between the semiconductor chip CP and the lead LD3. This is because the input output circuit unit 1b connected to the pad electrode PD2 (invalid pad) is forcibly fixed to a state in which transmission of a signal is impossible by the control circuit unit 2, and accordingly, it is not possible for the pad electrode PD2 (invalid pad) to contribute as the signal transmission path.

That is, comparing the case of FIG. 27 to the case of FIG. 28, there is a difference from the case of FIG. 27 in that the wire BW5 connecting the invalid pad of the semiconductor chip CP to the lead LD3 is added in the case of FIG. 28. The wire BW5 does not function as the signal transmission path between the semiconductor chip CP and the lead LD3 and is a wire that has electrically no meaning. In this embodiment, however, to suppress or prevent the above-described wire sweep, the wire BW5, which has electrically no meaning, is added as illustrated in FIG. 28. That is, since the wire BW5, which has electrically no meaning, is added in the case of FIG. 28, it is possible to obtain an effect of suppressing or preventing an occurrence of the above-described wire sweep compared to the case of FIG. 27.

That is, in the case of FIG. 27, in the resin sealing step (corresponding to the molding step of step S4d), the resin material MR1 that has been injected into the cavity CAV of the metal molds KG1 and KG2 travels along a resin traveling direction YG4 denoted by an arrow in FIG. 27 and collides with the wire BW1, the wire BW3, and the wire BW4 in order. In this case, since an interval between the wire BW1 and the wire BW3 is large reflecting that the pad electrode PD2, which is the invalid pad, is not connected to the wire BW, the resin material MR1 that collides with the wire BW1 and flows toward the wire BW3 is considerably accelerated before colliding with the wire BW3, whereby the resin material MR1 collides with the wire BW3 at a considerably high speed. Accordingly, there is a possibility that the wire BW3 is deformed and the wire sweep occurs in the wire BW3. This may cause a reduction of the manufacturing yield of the semiconductor package.

In contrast, in the case of FIG. 28, in the resin sealing step (corresponding to the molding step of step S4d), the resin material MR1 that has been injected into the cavity CAV of the metal molds KG1 and KG2 travels along a resin traveling direction YG5 denoted by an arrow in FIG. 28 and collides with the wire BW1, the wire BW5, the wire BW3, and the wire BW4 in order. In this case, the resin material MR1 that collides with the wire BW1 and flows toward the wire BW3 once collides with the wire BW5, which is disposed between the wire BW1 and the wire BW3, then flows toward the wire BW3, and collides with the wire BW3. Since the resin material MR1 is decelerated by once colliding with the wire BW5, a speed of the resin material MR1 that collides with the wire BW3 in the case of FIG. 28 is slower than a speed of the resin material MR1 that collides with the wire BW3 in the case of FIG. 27. Accordingly, since the speed of the resin material MR1 at the time of collision is slower in the case of FIG. 28, the wire BW3 is less likely to be deformed even when the resin material MR1 collides with the wire BW3, and it is possible to suppress or prevent the wire sweep from occurring in the wire BW3.

Now, a case where a resin traveling direction is opposite to the resin traveling direction YG5 will be considered. In this case, the resin material MR1 that has been injected into the cavity CAV of the metal molds KG1 and KG2 in the resin sealing step in FIG. 28 travels along a resin traveling direction YG6 and collides with the wire BW4, the wire BW3, the wire BW5, and the wire BW1 in order. In this case, the resin material MR1 that collides with the wire BW3, then flows toward the wire BW1 once collides with the wire BW5, which is disposed between the wire BW3 and the wire BW1, flows toward the wire BW1, and collides with the wire BW1 Since the resin material MR1 is decelerated by once colliding with the wire BW5, a speed of the resin material MR1 that collides with the wire BW1 in the case of FIG. 28 is slower than a speed of the resin material MR1 that collides with the wire BW1 in the case of FIG. 27. Accordingly, since the speed of the resin material MR1 at the time of collision is slower in the case of FIG. 28, the wire BW1 is less likely to be deformed even when the resin material MR1 collides with the wire BW1, and it is possible to suppress or prevent the wire sweep from occurring in the wire BW1.

Thus, since it is possible to suppress or prevent the wire sweep from occurring in the wire BW3 or the wire BW1, it is possible to suppress or prevent the reduction of the manufacturing yield of the semiconductor device due to the wire sweep. Accordingly, it is possible to improve the manufacturing yield of the semiconductor device (semiconductor package).

In this embodiment, the invalid pad (pad electrode PD2) of the semiconductor chip CP is connected to the lead LD3 via the wire BW5, and the wire BW5 which does not function as the signal transmission path is used so as to prevent the wire sweep from occurring in the wire BW3 which functions as the signal transmission path.

Furthermore, in the cases of FIGS. 27 and 28, the pad electrode PD2 is the invalid pad of the semiconductor chip CP; however, in the case of FIG. 26, the pad electrode PD2 is the valid pad of the semiconductor chip CP. That is, since the present embodiment is configured such that the multiple types of semiconductor packages each having the different number of pins can be manufactured by using the semiconductor chip CP, the pad electrode PD2 is configured in such a way that it can be switched to be the valid pad or the invalid pad. Accordingly, in a case where the 100-pin semiconductor package is manufactured by using the semiconductor chip CP, for example, although the pad electrode PD2 is the invalid pad and is electrically an unnecessary pad, in a case where the 224-pin semiconductor package is manufactured by using the semiconductor chip CP, the pad electrode PD2 is the valid pad and is electrically a necessary pad. Thus, even when the pad electrode PD2 is used as the invalid pad in the semiconductor package that has been manufactured, the pad electrode PD2 is the necessary pad in designing and manufacturing the semiconductor chip CP. Accordingly, in the case of FIG. 28, the pad electrode PD2 has been added not as a completely unnecessary pad but a necessary pad in terms of designing. The semiconductor chip CP has a circuit configuration allowing the pad electrode PD2 to be used as both the valid pad and the invalid pad by switching therebetween, and the pad electrode PD2 is fixed and is used as the invalid pad in the semiconductor device PKG.

Accordingly, even though the pad electrode PD2 is the invalid pad and is electrically unnecessary in the case of FIG. 28, not providing the semiconductor chip CP with the pad electrode PD2 makes it impossible to manufacture the 224-pin semiconductor package by using the common semiconductor chip CP, whereby it is not possible to remove the pad electrode PD2 in the case of FIG. 28. Thus, even though the pad electrode PD2 serving as the invalid pad is present in the case of FIG. 28, presence of the pad electrode PD2 does not cause the increase in the size of the semiconductor chip CP and does not cause the enlargement of the semiconductor chip CP.

In this manner, in this embodiment, the problem of the wire sweep is solved by connecting the wire BW5 to the pad electrode PD2 serving as the invalid pad, in the case of FIG. 28; however, this method is different from the method of providing the dummy pad DM described with reference to FIG. 24.

In the method of providing the dummy pad DM, the pad which is not connected to the circuit within the common chip is provided as the dummy pad DM. Accordingly, in a case where the 224-pin semiconductor package is manufactured by using the common chip added with the dummy pad DM, the dummy pad DM that has been added is completely unnecessary. Accordingly, this may cause the enlargement of the semiconductor chip.

In contrast, in this embodiment, the wire sweep is prevented by connecting the wire BW5 to the pad electrode PD2 of the semiconductor chip CP in the case of FIG. 28; however, in a case where the 224-pin semiconductor package is manufactured by using the common semiconductor chip CP as in FIG. 26, the pad electrode PD2 is used as the valid pad and becomes the signal transmission path. Accordingly, the pad electrode PD2 of the semiconductor chip CP is the necessary pad electrode even without considering the problem of preventing the wire sweep, and in this embodiment in which the wire sweep is prevented by using the pad electrode PD2, it can be said that the pad electrode PD2 does not cause the increase in the size of the semiconductor chip CP. Thus, in this embodiment, it is possible to downsize the semiconductor chip CP and to downsize the semiconductor package manufactured by using the semiconductor chip CP, whereby it is possible to achieve a reduction of the manufacturing cost.

In this manner, in this embodiment, it has been considered to manufacture the multiple types of semiconductor packages each having the different number of pins by using the common semiconductor chip. It has been noticed that the problem of the wire sweep does not occur in a case where the semiconductor package having the maximum number of pins is manufactured; however, the problem of the wire sweep occurs in a case where the semiconductor package having the small number of pins is manufactured due to occurrence of the invalid pad (unused pad). Noticing this has led to achievement of this embodiment. Then, in manufacturing the semiconductor package having the small number of pins causing the problem of the wire sweep, by using the invalid pad that inevitably occurs, the problem of the wire sweep is solved by connecting one end of the wire (BW5) to the invalid pad (pad electrode PD2) and by connecting the other end of the wire (BW5) to the lead (LD3). Accordingly, it is possible to suppress or prevent the wire sweep, whereby it is possible to improve the manufacturing yield of the semiconductor device (semiconductor package) as well as to downsize the semiconductor chip and to downsize the semiconductor device (semiconductor package) manufactured by using the semiconductor chip.

Also, in this embodiment, the other end of the wire BW (here, the wire BW5) which has one end connected to the invalid pad (here, the pad electrode PD2) is connected to the lead LD (here, the lead LD3) which is electrically connected to the valid pad via the wire BW. That is, the wire (here, the wire BW5) for preventing the wire sweep has one end connected to the invalid pad and has the other end connected to the lead LD (here, the lead LD3) serving as the signal transmission path. Accordingly, to provide the wire (here, the wire BW5) for preventing the wire sweep, it is not necessary to add not only any unnecessary pad electrode such as the above-described dummy pad DM but also any unnecessary lead. Since it is not necessary to provide any unnecessary lead, it is possible to achieve downsizing of the semiconductor package (PKG). Furthermore, since it is not necessary to provide any unnecessary lead, it is possible to manufacture the semiconductor package (PKG) by using a general-purpose lead frame, whereby it is possible to reduce the manufacturing cost as well.

Furthermore, in this embodiment, it is assumed that the multiple types of semiconductor packages each having the different number of pins are manufactured by using the common semiconductor chip CP, whereby each of the pad electrodes PD of the semiconductor chip CP is configured such that each of the pad electrodes PD of the semiconductor chip CP is connected to the circuit (internal circuit unit 5) within the semiconductor chip CP and is capable of being switched between the valid pad and the invalid pad.

FIG. 29 is a circuit diagram for describing a specific method for switching the pad electrode PD to be the valid pad or the invalid pad. In addition, FIGS. 30(a) to 30(h) are explanatory diagrams illustrating exemplary configurations of a region RG1 surrounded by a dotted line in FIG. 29. FIG. 29 is a view in which a part of FIG. 25 is extracted and more specifically illustrated. In FIG. 29, a part surrounded by a two-dot chain line is included in the control circuit unit 2 of FIG. 25 described above.

Each of the pad electrodes PD is connected to the input output circuit unit 1, and the pad electrode PD is connected to the internal circuit unit 5 via the input output circuit unit 1. Since the input output circuit unit 1 is interposed between the pad electrode PD and the internal circuit unit 5, it is possible to control transmission of a signal between the pad electrode PD and the internal circuit unit 5 by the input output circuit unit 1.

The control circuit unit 2 includes selection circuits (multiplexers) 2a, 2b, 2c, and 2d relative to each of the input output circuit units 1. Specifically, as illustrated in FIG. 29, the selection circuit 2a and the selection circuit 2b are connected in multistage between the internal circuit unit 5 and a control terminal on an output side of the input output circuit unit 1, and the selection circuit 2b is provided to a side closer to the input output circuit unit 1. Furthermore, the selection circuit 2c and the selection circuit 2d are connected in multistage between the internal circuit unit 5 and a control terminal on an input side of the input output circuit unit 1, and the selection circuit 2d is provided to the side closer to the input output circuit unit 1.

In the selection circuit 2a, a signal (11) from the internal circuit unit 5 and a ground potential are input, and one of them is output therefrom and is input into the selection circuit 2b. While a selection signal is not input into the selection circuit 2a, the selection circuit 2a outputs the ground potential, and when the selection signal (signal 12)

is input into the selection circuit 2a, the selection circuit 2a outputs the signal (11) that has been input from the internal circuit unit 5.

The output from the selection circuit 2a and the ground potential are input into the selection circuit 2b, and one of them is output therefrom and is input into the control terminal on the output side of the input output circuit unit 1. While a selection signal is not input into the selection circuit 2b, the selection circuit 2b outputs the input from the selection circuit 2a, and when the selection signal (a decoding signal from the decoder circuit unit 3) is input into the selection circuit 2b, the selection circuit 2b outputs the ground potential. The output from the selection circuit 2b is input into the control terminal on the output side of the input output circuit unit 1 (control terminal of an output circuit unit). While the ground potential is supplied to the control terminal on the output side of the input output circuit unit 1, the input output circuit unit 1 is in a state incapable of transmitting a signal from the internal circuit unit 5 to the pad electrode PD via the input output circuit unit 1.

A signal (14) from the internal circuit unit 5 and the ground potential are input into the selection circuit 2c, and one of them is output therefrom and is input into the selection circuit 2d. While a selection signal is not input into the selection circuit 2c, the selection circuit 2c outputs the ground potential, and when the selection signal (signal 15) is input into the selection circuit 2c, the selection circuit 2c outputs the signal (14) that has been input from the internal circuit unit 5.

The output from the selection circuit 2c and the ground potential are input into the selection circuit 2d, and one of them is output therefrom and is input into the control terminal on the input side of the input output circuit unit 1. While a selection signal is not input into the selection circuit 2d, the selection circuit 2d outputs the input from the selection circuit 2c, and when the selection signal (decoding signal from the decoder circuit unit 3) is input into the selection circuit 2d, the selection circuit 2d outputs the ground potential. The output from the selection circuit 2d is input into the control terminal on the input side of the input output circuit unit 1 (control terminal of an input circuit unit). While the ground potential is supplied to the control terminal on the output side of the input output circuit unit 1, the input output circuit unit 1 is in a state incapable of transmitting a signal from the internal circuit unit 5 to the pad electrode PD via the input output circuit unit 1.

In FIG. 29, when the signal 11 is input into the selection circuit 2a from the CPU, the peripheral IP, or the like included in the internal circuit unit 5 as a control signal (control signal of the input output circuit unit 1) and the signal 12 is input into the selection circuit 2a as a selection signal (function selection signal), the signal 11 is output from the selection circuit 2a and is input into the selection circuit 2b. In this case, when the signal (decoding signal) from the decoder circuit unit 3 is not input into the selection circuit 2b as the selection signal, the signal 11, which has been input into the selection circuit 2b, is output from the selection circuit 2b and is input into the control terminal on the output side of the input output circuit unit 1, and the input output circuit unit 1 is in a state capable of transmitting a signal from the internal circuit unit 5 to the pad electrode PD via the input output circuit unit 1. In this state, a signal 13 (output signal) is transmitted from the internal circuit unit 5 to the pad electrode PD via the input output circuit unit 1 and is further output to the outside of the semiconductor device PKG via the wire BW and the lead LD connected to the pad electrode PD. In this manner, it is possible to transmit the signal 13 (output signal) from the internal circuit unit 5 of the semiconductor chip CP to the pad electrode PD via the input output circuit unit 1 and to output the signal 13 from the pad electrode PD.

Input is performed basically in the same manner as the output. That is, in FIG. 29, when the signal 14 is input into the selection circuit 2c from the CPU, the peripheral IP, or the like included in the internal circuit unit 5 as a control signal (control signal of the input output circuit unit 1) and the signal 15 is input into the selection circuit 2c as a selection signal (function selection signal), the signal 14 is output from the selection circuit 2c and is input into the selection circuit 2d. In this case, when the signal (decoding signal) from the decoder circuit unit 3 is not input into the selection circuit 2d as the selection signal, the signal 14, which has been input into the selection circuit 2d, is output from the selection circuit 2d and is input into the control terminal on the input side of the input output circuit unit 1, and the input output circuit unit 1 is in a state capable of transmitting a signal from the pad electrode PD to the internal circuit unit 5 via the input output circuit unit 1. In this state, a signal 16 (input signal), which has been transmitted via the lead LD and the wire BW, is input into the pad electrode PD and is transmitted to the internal circuit unit 5 via the input output circuit unit 1. In this manner, it is possible to transmit the signal 16 (input signal), which has been input from the pad electrode PD, to the internal circuit unit 5 of the semiconductor chip CP.

The control circuit unit 2 is a circuit that selects/controls a path (transmission path) of write data from the CPU, the peripheral IP, and the like included in the internal circuit unit 5, an input/output enable signal, or read data from the pad electrode PD.

However, when the signal (decoding signal) from the decoder circuit unit 3 is input into each of the selection circuits 2b and 2d, the ground potential is output from each of the selection circuits 2b and 2d regardless of whether or not the signals 11 and 14 are input into the respective selection circuits 2b and 2d. The ground potential that has been output from each of the selection circuits 2b and 2d is input into the control terminal on the output side and the control terminal on the input side of the input output circuit unit 1. When the ground potential is input into the control terminal on the output side and the control terminal on the input side of the input output circuit unit 1, the input output circuit unit 1 is in a state incapable of transmitting a signal between the internal circuit unit 5 and the pad electrode PD via the input output circuit unit 1. In this state, it is not possible to output a signal from the pad electrode PD, and even when a signal is input into the pad electrode PD, it is not possible to transmit the signal to the internal circuit unit 5. That is, the input output circuit unit 1 and the pad electrode PD connected thereto are not capable of functioning as the signal transmission path, whereby the pad electrode PD becomes the invalid pad.

That is, when the signal from the decoder circuit unit 3 is input into each of the selection circuits 2b and 2d, the input output circuit unit 1 to which the selection circuits 2b and 2d are connected is forcibly put into a disabled state, whereby the pad electrode PD connected to the input output circuit unit 1 becomes the invalid pad. Conversely, when the signal from the decoder circuit unit 3 is not input into each of the selection circuits 2b and 2d, the input output circuit unit 1 to which the selection circuits 2b and 2d are connected is capable of functioning as a normal input output circuit, whereby the pad electrode PD connected to the input output circuit unit 1 becomes the valid pad. Thus, according to the signal from the decoder circuit unit 3, it is possible to switch the pad electrode PD to be the valid pad or the invalid pad by the control circuit unit 2.

This switching between the valid pad and the invalid pad will be described more specifically.

The package code (package information) indicating the number of pins of the semiconductor package manufactured by using the semiconductor chip CP is stored in the storage circuit unit 4 of the semiconductor chip CP. Accordingly, the storage circuit unit 4 of the semiconductor chip CP used in the 224-pin semiconductor package stores the package code indicating 224 pins, and the storage circuit unit 4 of the semiconductor chip CP used in the 176-pin semiconductor package stores the package code indicating 176 pins. Furthermore, the storage circuit unit 4 of the semiconductor chip CP used in the 144-pin semiconductor package stores the package code indicating 144 pins, and the storage circuit unit 4 of the semiconductor chip CP used in the 100-pin semiconductor package stores the package code indicating 100 pins. The package code stored in the storage circuit unit 4 is an 8-bit code, for example; however, it is not limited to the 8-bit, and it may be also a 2-bit or a 4-bit code, for example.

The package code stored in the storage circuit unit 4 is input into the decoder circuit unit 3 and is decoded by the decoder circuit unit 3. The decoder circuit unit 3 outputs a signal (decoding signal) corresponding to the package code that has been input from the storage circuit unit 4 to the control circuit unit 2.

In this case, when the package code indicates 100 pins, a signal (decoding signal) output to the control circuit unit 2 by the decoder circuit unit 3 is denoted by reference character pkg100. Also, when the package code indicates 144 pins, a signal (decoding signal) output to the control circuit unit 2 by the decoder circuit unit 3 is denoted by reference character pkg144. Also, when the package code indicates 176 pins, a signal (decoding signal) output to the control circuit unit 2 by the decoder circuit unit 3 is denoted by reference character pkg176.

When the package code indicates 224 pins, the decoder circuit unit 3 does not output a signal (decoding signal to be input into the selection circuits 2*b* and 2*d*) to the control circuit unit 2. This is because, when the package code indicates 224 pins, all of the plurality of pad electrodes PD included in the semiconductor chip CP are the valid pads, whereby there is no input output circuit unit 1 or pad electrode PD to be forcibly disabled by the control circuit unit 2.

Now, there is considered a case where a configuration of a region RG1 surrounded by a dotted line in FIG. 29 is a configuration of FIG. 30(*a*). When any of the signals pkg100, pkg144, and pkg176 is input into a logic circuit unit (OR circuit, OR logic circuit) 2*e* from the decoder circuit unit 3, the signal is output from the logic circuit unit 2*e* and is input into each of the selection circuits 2*b* and 2*d* as a selection signal. In this case, as described above, the ground potential is output from each of the selection circuits 2*b* and 2*d*, and the ground potential is input into the control terminal on the output side and the control terminal on the input side of the input output circuit unit 1. The input output circuit unit 1 is forcibly put into the disabled state, and the pad electrode PD connected to the input output circuit unit 1 becomes the invalid pad.

Accordingly, the pad electrode PD to which the configuration of FIG. 30(*a*) is applied becomes the valid pad in a case where the 224-pin semiconductor package is manufactured but becomes the invalid pad in a case where any of the 100-pin, 144-pin, or 176-pin semiconductor package is manufactured.

Furthermore, there is considered a case where the configuration of the region RG1 surrounded by the dotted line in FIG. 29 is a configuration of FIG. 30(*b*). In this case, when either of the signals pkg 100 or pkg 144 is input into the logic circuit unit 2*e* from the decoder circuit unit 3, the signal is output from the logic circuit unit 2*e* and is input into each of the selection circuits 2*b* and 2*d* as a selection signal. In this case, as described above, the ground potential is output from each of the selection circuits 2*b* and 2*d* and is input into the control terminal on the output side and the control terminal on the input side of the input output circuit unit 1. The input output circuit unit 1 is forcibly put into the disabled state, and the pad electrode PD connected to the input output circuit unit 1 becomes the invalid pad.

Accordingly, the pad electrode PD to which the configuration of FIG. 30(*b*) is applied becomes the valid pad in a case where either of the 224-pin or 176-pin semiconductor package is manufactured but becomes the invalid pad in a case where either of the 100-pin or 144-pin semiconductor package is manufactured.

Similarly, the pad electrode PD to which a configuration of FIG. 30(*c*) is applied becomes the valid pad in a case where either of the 224-pin or 144-pin semiconductor package is manufactured but becomes the invalid pad in a case where either of the 100-pin or 176-pin semiconductor package is manufactured. Furthermore, the pad electrode PD to which a configuration of FIG. 30(*d*) is applied becomes the valid pad in a case where either of the 224-pin or 100-pin semiconductor package is manufactured but becomes the invalid pad in a case where either of the 144-pin or 176-pin semiconductor package is manufactured.

Furthermore, there is considered a case where the configuration of the region RG1 surrounded by the dotted line in FIG. 29 is a configuration of FIG. 30(*e*). In this case, when the signal pkg100 is output from the decoder circuit unit 3, the signal is input into each of the selection circuits 2*b* and 2*d* as a selection signal. In this case, as described above, the ground potential is output from each of the selection circuits 2*b* and 2*d*, and the ground potential is input into the control terminal on the output side and the control terminal on the input side of the input output circuit unit 1. The input output circuit unit 1 is forcibly put into the disabled state, and the pad electrode PD connected to the input output circuit unit 1 becomes the invalid pad.

Accordingly, the pad electrode PD to which the configuration of FIG. 30(*e*) is applied becomes the valid pad in a case where any of the 224-pin, 176-pin, or 144-pin semiconductor package is manufactured but becomes the invalid pad in a case where the 100-pin semiconductor package is manufactured.

Similarly, the pad electrode PD to which a configuration of FIG. 30(*f*) is applied becomes the valid pad in a case where any of the 224-pin, 176-pin, or 100-pin semiconductor package is manufactured but becomes the invalid pad in a case where the 144-pin semiconductor package is manufactured. Furthermore, the pad electrode PD to which a configuration of FIG. 30(*g*) is applied becomes the valid pad in a case where any of the 224-pin, 144-pin, or 100-pin semiconductor package is manufactured but becomes the invalid pad in a case where the 176-pin semiconductor package is manufactured.

Furthermore, there is considered a case where the configuration of the region RG1 surrounded by the dotted line in FIG. 29 is a configuration of FIG. 30(*h*), that is, a case where there is no configuration of the region RG1. In this case, the signal (decoding signal) from the decoder circuit unit 3 is not input into each of the selection circuits 2b and 2d as a selection signal. In this case, the pad electrode PD does not become the invalid pad and is always the valid pad.

Accordingly, the pad electrode PD to which the configuration of FIG. 30(*h*) is applied becomes the valid pad in a case where any of the 224-pin, 176-pin, 144-pin, or 100-pin semiconductor package is manufactured.

Thus, in a case where the 224-pin, 176-pin, 144-pin, and 100-pin semiconductor packages are manufactured by using the common semiconductor chip CP, any of eight types of configurations of FIGS. 30(*a*) to 30(*h*) may be applied to each of the pad electrodes PD at a designing stage of the semiconductor chip CP, and the package code may be stored in the storage circuit unit 4 in manufacturing the semiconductor package. Note that the package code (package information) is information (code) corresponding to the number of pins of the semiconductor package to be manufactured. Then, the package code stored in the storage circuit unit 4 may be decoded by the decoder circuit unit 3, and based on the package code that has been decoded, the control circuit unit 2 may control each of the input output circuit units 1, and it may be independently set whether or not each of the pad electrodes PD connected to each of the input output circuit units 1 is the valid pad or the invalid pad.

Furthermore, the plurality of selection circuits connected in multistage in the control circuit unit 2 are connected to each of the input output circuit units 1, and the signal (decoding signal) that is output from the decoder circuit unit 3 is input into the selection circuit in the last stage (corresponding to the selection circuit closest to the input output circuit unit 1) among the plurality of selection circuits connected in multistage. For example, in the case of FIG. 29, the selection circuit 2a and the selection circuit 2b are connected in multistage between the internal circuit unit 5 and the output side of the input output circuit unit 1, and the selection circuit 2c and the selection circuit 2d are connected in multistage between the internal circuit unit 5 and the input side of the input output circuit unit 1. Then, on the output side of the input output circuit unit 1, the signal that is output from the decoder circuit unit 3 is input into the selection circuit 2b in the last stage of the selection circuits 2a and 2b connected in multistage. Also, on the input side of the input output circuit unit 1, the signal that is output from the decoder circuit unit 3 is input into the selection circuit 2d in the last stage (on a side closer to the input output circuit unit 1), of the selection circuits 2c and 2d connected in multistage.

Accordingly, in controlling the input output circuit unit 1 by the control circuit unit 2, control (selection) by the signal (decoding signal) that is output from the decoder circuit unit 3 is given the highest priority. Accordingly, it is possible to forcibly put the input output circuit unit 1 into the disabled state by the signal (decoding signal) that is output from the decoder circuit unit 3, whereby it is possible to forcibly set the pad electrode PD connected to the input output circuit unit 1 as the invalid pad.

Thus, by storing the package code indicating the number of pins of the semiconductor package to be manufactured in the storage circuit unit 4, it is possible to forcibly set the pad electrode
PD to be the invalid pad among the plurality of pad electrodes PD included in the semiconductor chip CP as the invalid pad according to the package code. Unless the package code stored in the storage circuit unit 4 is rewritten, the pad electrode PD that is set as the invalid pad in the semiconductor chip CP is not changed into the valid pad or the pad electrode PD that is set as the valid pad in the semiconductor chip CP is not changed into the invalid pad. Furthermore, after the package code indicating the number of pins of the semiconductor package to be manufactured is written in the storage circuit unit 4, the package code stored in the storage circuit unit 4 is not rewritten. Accordingly, the pad electrode PD that is set as the invalid pad in the semiconductor chip CP is not changed into the valid pad during operation of the semiconductor package or the pad electrode PD that is set as the valid pad in the semiconductor chip CP is not changed into the invalid pad during the operation of the semiconductor package.

Next, timing to perform writing of the package code (package information) in the storage circuit unit 4 will be described. In manufacturing the semiconductor device PKG, the writing of the package code (package information) in the storage circuit unit 4 is performed; however, it is preferred that a writing step thereof be performed in the wafer testing step of step S3 described above or the testing step of step S5 described above.

By performing the writing of the package code in the storage circuit unit 4 in the wafer test step of step S3 or in the testing step of step S5 in which the electrical test is performed, it is possible to easily and precisely perform the writing of the package code.

In a case where the writing of the package code in the storage circuit unit 4 is performed in the wafer test step of step S3, it is preferred that the writing of the package code be performed after implementing test items; however, it is also possible to perform the writing of the package code before implementing the test items or to perform the writing of the package code in the middle of implementing the test items.

Also, in a case where the writing of the package code in the storage circuit unit 4 is performed in the testing step of step S5, it is preferred that the writing of the package code be performed after implementing the test items; however, it is also possible to perform the writing of the package code before implementing the test items or to perform the writing of the package code in the middle of implementing the test items.

In the case where the writing of the package code in the storage circuit unit 4 is performed in the wafer test step of step S3 described above, it corresponds to performing the writing of the package code in the storage circuit unit 4 before the semiconductor wafer SW is cut (diced) in step S4*a*.

After the wafer process of step S2 is performed and before the semiconductor wafer SW is cut in step S4*a*, the semiconductor wafer SW has the plurality of semiconductor chip regions CPR, and each of the semiconductor chip regions CPR has the same circuit configuration as the circuit configuration of the semiconductor chip CP of FIG. 25 described above. In a case where the writing of the package code in the storage circuit unit 4 is performed before the semiconductor wafer SW is cut (diced) in step S4*a*, the package code is written with respect to the plurality of semiconductor chip regions CPR of the semiconductor wafer SW in each of the storage circuit unit 4 of the plurality of semiconductor chip regions CPR of the semiconductor wafer SW. At that time, the package code is written in the storage circuit unit 4 from the pad electrode PD by using the pad electrodes PD in the semiconductor chip regions CPR.

In a case where the writing step of the package code is performed before the semiconductor wafer SW is cut in step S4*a*, it is possible to write the package code in the storage circuit unit 4 in the plurality (two or more, for example, about 32) of semiconductor chip regions CPR at a time, whereby it is possible to reduce the time required for the writing of the package code. Accordingly, it is possible to reduce the time required for manufacturing the semiconductor device PKG. It is also possible to improve throughput of the semiconductor device PKG, whereby it is possible to reduce the manufacturing cost of the semiconductor device.

In the case where the writing of the package code in the storage circuit unit 4 is performed in the testing step of step S5 described above, it corresponds to performing the writing of the package code in the storage circuit unit 4 after the resin sealing step (corresponding to step S4d described above). That is, it corresponds to performing the writing of the package code (package information) in the storage circuit unit 4 after the sealing portion MR is formed in step S4d.

The testing step of step S5 is performed after the assembling step of step S4 is completed. In a case where the writing step of the package code in the storage circuit unit 4 is performed after the assembling step of step S4 is completed, the writing of the package code in the storage circuit unit 4 is performed after various heating steps in a manufacturing process of the semiconductor device. In this case, it is not necessary to perform various heating steps in the manufacturing process of the semiconductor device after the package code is stored in the storage circuit unit 4, whereby it is possible to further improve reliability of the package code stored in the storage circuit unit 4.

Furthermore, in the manufacturing process of the semiconductor device, processing accompanying heating at a relatively high temperature is performed only up to the resin sealing step (corresponding to step S4d described above), and a temperature of the semiconductor chip CP does not become very high thereafter. Accordingly, by performing the writing step of the package code in the storage circuit unit 4 after the resin sealing step (corresponding to step S4d described above), it is not necessary to perform various heating steps in the manufacturing process of the semiconductor device after the package code is stored in the storage circuit unit. Accordingly, it is possible to further improve the reliability of the package code stored in the storage circuit unit 4.

Also, in a case where the writing step of the package code in the storage circuit unit 4 is performed after the assembling step of step S4 is completed (that is, in the testing step of step S5), by using the external terminals (here, leads LD) of the semiconductor device PKG, it is possible to write the package code in the storage circuit unit 4 in the semiconductor chip CP included in the semiconductor device PKG from the external terminals (leads LD).

In addition, before the writing step of the package code in the storage circuit unit 4 is performed, the package code in the storage circuit unit 4 is set to an initial value. The initial value of the package code, for example, may be one for all bits. Furthermore, by setting the initial value of the package code to a package code indicating 224 pins, in a case where the semiconductor package having the number of pins other than 224 (specifically, 100, 144, or 176) is manufactured, the package code indicating the number of pins of the semiconductor package to be manufactured may be written in the storage circuit unit 4 in the wafer test step of step S3 or in the testing step of step S5.

Furthermore, in this embodiment, as an example of manufacturing the semiconductor packages each having the different number of pins by using the common semiconductor chip CP, there is exemplified the case where the 224-pin, 176-pin, 144-pin, and 100-pin semiconductor packages are manufactured by using the common semiconductor chip CP. However, the number of pins of the semiconductor package to be manufactured is not limited to 224, 176, 144, or 100, and this embodiment may be also applied to a case where the semiconductor packages each having any number of pins different from each other by using the common semiconductor chip CP.

Furthermore, as a type of the semiconductor package of the semiconductor device PKG, the semiconductor package of the QFP type has been exemplified; however, it is not limited to the QFP type, and it is also possible to apply various types of the semiconductor package in which a wire is connected to the pad electrode PD of the semiconductor chip CP and resin sealing is implemented thereon. For example, the semiconductor device PKG may be also a semiconductor package of a QFN type. Furthermore, as in a second embodiment described below, it may be also a semiconductor package using a wiring substrate.

<Major Characteristics>

Next, major characteristics of the semiconductor device (PKG) accompanying the technical idea of this embodiment described above will be described with reference to FIG. 31. FIG. 31 is an explanatory diagram conceptually illustrating the semiconductor device PKG according to the present embodiment.

A configuration of FIG. 31 corresponds to the configuration of FIG. 28 described above; however, the configuration of FIG. 31 is a superordinate concept of the configuration of FIG. 28. That is, a switch circuit unit SW in FIG. 31 corresponds to the superordinate concept of a combination of the input output circuit unit 1 and the control circuit unit 2 of FIG. 28.

As illustrated in FIG. 31, the semiconductor device PKG of this embodiment includes the semiconductor chip CP, and the lead LD3 (first external terminal) disposed around the semiconductor chip CP. The semiconductor chip CP includes an internal circuit 5b (first internal circuit), an internal circuit 5c (second internal circuit), and the switch circuit unit SW. In a front surface (main surface) of the semiconductor chip CP, the pad electrode PD2 (first electrode) and the pad electrode PD3 (second electrode) are formed. In the semiconductor chip CP, the pad electrode PD3 is electrically connected to the internal circuit 5c, and transmission of a signal is possible between the internal circuit 5c and the pad electrode PD3. The semiconductor device PKG further includes the wire BW5 (first wire) that electrically connects the pad electrode PD2 of the semiconductor chip CP to the lead LD3, the wire BW3 (second wire) that electrically connects the pad electrode PD3 of the semiconductor chip CP to the lead LD3, and the sealing portion MR (sealing body) that seals the semiconductor chip CP, the wire BW5, and the wire BW3 with a resin.

One of the major characteristics of this embodiment is that the pad electrode PD3 is electrically connected to the internal circuit 5c, and the transmission of a signal is possible between the internal circuit 5c and the pad electrode PD3. This indicates that the pad electrode PD3 is the valid pad capable of functioning as a path for inputting or outputting a signal. Accordingly, it is possible to transmit a signal, which is input into the pad electrode PD3 from the lead LD3 via the wire BW3, to the internal circuit 5c or to output the signal, which is transmitted from the internal circuit 5c to the pad electrode PD, from the pad electrode PD3 and transmit the signal to the lead LD3 via the wire BW3.

Another of the major characteristics of this embodiment is that the switch circuit unit SW is a circuit capable of being set in a first state in which transmission of a signal is possible between the internal circuit 5b and the pad electrode PD2 and in a second state in which transmission of a signal is not possible between the internal circuit 5b and the pad electrode PD2. During the operation of the semiconductor device PKG, the switch circuit unit SW is fixed to the second state. This indicates that the semiconductor chip CP is the semiconductor chip that can be used for manufacturing the multiple types of semiconductor packages and that in the semiconductor device PKG, the pad electrode PD2 is the invalid pad that can function neither as the path for inputting or the path for outputting a signal. The switch circuit unit SW is fixed to the second state during the operation of the semiconductor device PKG, whereby it is not possible to input a signal into the pad electrode PD2 and transmit the signal to the internal circuit 5b or to transmit a signal from the internal circuit 5b to the pad electrode PD2 and output the signal from the pad electrode PD2.

In a case where the semiconductor chip CP is not the common semiconductor chip that can be used for manufacturing the multiple types of semiconductor package products, it is not necessary to provide the semiconductor chip CP with the switch circuit unit SW that can be set in the first state in which transmission of a signal is possible between the internal circuit 5b and the pad electrode PD2 and in the second state in which transmission of a signal is not possible between the internal circuit 5b and the pad electrode PD2. This is because, as long as it is fixed to the second state in which transmission of a signal is not possible between the internal circuit 5b and the pad electrode PD2 during the operation of the semiconductor device PKG, from a viewpoint of a circuit configuration required for the semiconductor device PKG, the circuit configuration (switch circuit unit SW) that enables the first state in which transmission of a signal is possible between the internal circuit 5b and the pad electrode PD2 to be set is considered to be a circuit configuration not necessary for the semiconductor chip CP.

In contrast, in this embodiment, although the semiconductor chip CP has the switch circuit unit SW that can be set in the first state in which transmission of a signal is possible and in the second state in which transmission of a signal is not possible, the switch circuit unit SW is fixed to the second state during the operation of the semiconductor device PKG. This suggests that, although the pad electrode PD2 of the semiconductor chip CP is the invalid pad (unused pad) in the semiconductor device PKG, a case in which the semiconductor package having a configuration in which the pad electrode PD2 of the semiconductor chip CP is used as the valid pad is manufactured has been assumed at the designing stage of the semiconductor chip CP. That is, at the designing stage of the semiconductor chip CP, assuming both of the cases in which the pad electrode PD2 is used as the valid pad and the pad electrode PD2 is used as the invalid pad, it has been configured such that the different types of semiconductor packages can be manufactured by using the common semiconductor chip CP and the pad electrode PD2 is used as the invalid pad in the semiconductor device PKG.

Note that a period during the operation of the semiconductor device PKG corresponds to a period in which the power supply voltage is supplied to the semiconductor device PKG, or a period in which the power supply voltage is supplied to the semiconductor chip CP of the semiconductor device PKG. Accordingly, the switch circuit unit SW is fixed to the second state during the period in which the power supply voltage is supplied to the semiconductor device PKG.

Also, when the power supply voltage is not supplied to the semiconductor device PKG, the semiconductor device PKG and the semiconductor chip CP therein do not operate, and input of a signal into the semiconductor chip CP and output of a signal from the semiconductor chip CP are not performed. Accordingly, in the semiconductor device PKG, no signal is transmitted between the internal circuit 5b and the pad electrode PD2 regardless of whether or not the power supply voltage is supplied.

Still another of the major characteristics of this embodiment is not only that the wire BW3 electrically connecting the pad electrode PD3 (valid pad) of the semiconductor chip CP to the lead LD3 is formed, but also that the wire BW5 electrically connecting the pad electrode PD2 (invalid pad) of the semiconductor chip CP to the lead LD3 is formed, in the semiconductor device PKG.

As it has been described with reference to FIGS. 20 to 22, when the semiconductor packages each having the different number of pins can be manufactured by using the common semiconductor chip, in a case where the semiconductor package having the small number of pins is manufactured by using the common semiconductor chip, the problem of the wire sweep occurs due to occurrence of the invalid pad (unused pad) in the semiconductor chip.

In contrast, in this embodiment, the pad electrode PD3, which is the valid pad, is connected to the lead LD3 via the wire BW3, and the lead LD3 is connected to the pad electrode PD2, which is the invalid pad (unused pad), via the wire BW5. By forming the wire BW5, compared to the case in which the wire BW5 is not formed, it is possible to suppress or prevent the wire sweep from occurring in forming the sealing portion MR. Accordingly, it is possible to improve the manufacturing yield of the semiconductor device. Furthermore, since the wire BW5 for preventing the wire sweep is provided, it is not necessary to add any unnecessary pad electrode (corresponding to the dummy pad DM), whereby it is possible to downsize the semiconductor chip CP as well as to downsize the semiconductor device PKG using the semiconductor chip. It is also possible to reduce the manufacturing cost of the semiconductor device PKG.

Also, in this embodiment, although the lead LD3 is connected to the pad electrode PD3 via the wire BW3 and the lead LD3 is connected to the pad electrode PD2 via the wire BW5, the pad electrode PD2 and the wire BW5 do not function as the signal transmission path. That is, a signal is transmitted between the lead LD3 and the semiconductor chip CP via the pad electrode PD3 and the wire BW3, but a signal is not transmitted therebetween via the pad electrode PD2 and the wire BW5.

Also, the semiconductor chip CP includes the storage circuit unit 4. The storage circuit unit 4 is electrically connected to the switch circuit unit SW, and based on information stored in the storage circuit unit 4 (corresponding to the package code), the switch circuit unit SW is fixed to the second state in which transmission of a signal is not possible between the internal circuit 5b and the pad electrode PD2 (see FIGS. 28 and 31). Since the switch circuit unit SW is fixed to the second state based on the information stored in the storage circuit unit 4 which is incorporated into the semiconductor chip CP, it is possible to easily and precisely achieve fixing of the switch circuit unit SW constantly to the second state during the operation of the semiconductor device PKG.

Also, the switch circuit unit SW includes the control circuit unit 2, and the input output circuit unit 1b (first input output circuit unit) connected to the pad electrode PD2. Then, the switch circuit unit SW is fixed to the second state (second state in which transmission of a signal is not possible between the internal circuit 5b and the pad electrode PD2) by controlling the input output circuit unit 1b by the control circuit unit 2 based on the information stored in the storage circuit unit 4 (see FIGS. 28 and 31). Accordingly, during the operation of the semiconductor device PKG, it is possible to more easily and precisely achieve the fixing of the switch circuit unit SW constantly to the second state.

Moreover, the semiconductor chip CP further includes the decoder circuit unit 3, and the information stored in the storage circuit unit 4 is converted into a signal by the decoder circuit unit 3. The signal converted by the decoder circuit unit 3 is input into the control circuit unit 2, the control circuit unit 2 controls the input output circuit unit 1b based on the signal that has been input into the control circuit unit 2, and accordingly, the switch circuit unit SW is fixed to the second state (see FIGS. 28 and 31).

Furthermore, in the front surface (main surface) of the semiconductor chip CP, the pad electrode PD1 (third electrode) is further formed, and the semiconductor device PKG further includes the lead LD1 (second external terminal) disposed around the semiconductor chip CP, and the wire BW1 (third wire) electrically connecting the pad electrode PD1 to the lead LD1. The pad electrode PD1 is electrically connected to an internal circuit 5a (third internal circuit) of the semiconductor chip CP, and transmission of a signal is possible between the internal circuit 5a and the pad electrode PD1. That is, the pad electrode PD1 is the valid pad. In a plan view, the pad electrode PD1, the pad electrode PD2, and the pad electrode PD3 are disposed along a first side (any of the above-described sides SD1, SD2, SD3, and SD4) of the front surface (main surface) of the semiconductor chip CP, and the pad electrode PD2 is disposed between the pad electrode PD1 and the pad electrode PD3.

In this case, since the pad electrode PD2 is disposed between the pad electrode PD1 and the pad electrode PD3, the wire BW5 connected to the pad electrode PD2 is positioned between the wire BW1 connected to the pad electrode PD1 and the wire BW3 connected to the pad electrode PD3. Since the wire BW5 is formed, compared to the case where the wire BW5 is not formed, it is possible to suppress or prevent the wire sweep from occurring in the wire BW1 or the wire BW3 in forming the sealing portion MR.

In the front surface (main surface) of the semiconductor chip CP, the pad electrode PD4 (fourth electrode) is further formed, and the semiconductor device PKG further includes the lead LD4 (third external terminal) disposed around the semiconductor chip CP, and the wire BW4 (fourth wire) electrically connecting the pad electrode PD4 to the lead LD4. The pad electrode PD4 is electrically connected to an internal circuit 5d (fourth internal circuit) of the semiconductor chip CP, and transmission of a signal is possible between the internal circuit 5d and the pad electrode PD4. That is, the pad electrode PD4 is the valid pad. In the plan view, the pad electrodes PD1, PD2, PD3, and PD4 are disposed along the first side (any of the above-described sides SD1, SD2, SD3, and SD4) of the front surface (main surface) of the semiconductor chip, the pad electrode PD2 is disposed between the pad electrode PD1 and the pad electrode PD3, and the pad electrode PD3 is disposed between the pad electrode PD2 and the pad electrode PD4.

The internal circuits 5a, 5b, 5c, and 5d are included in the above-described internal circuit unit 5, and the internal circuits may or may not relate with each other.

As in FIG. 31, it is also possible to consider the configuration by separating the switch circuit unit SW into switch circuit units SW1, SW2, SW3, and SW4. Each of the switch circuit units SW1, SW2, SW3, and SW4 is included in the switch circuit unit SW and specifically has a configuration in which the control circuit unit 2 and the input output circuit unit 1 illustrated in FIG. 29 described above are combined. In this case, the switch circuit unit SW2 is a circuit capable of being set in the first state in which transmission of a signal is possible between the internal circuit 5b and the pad electrode PD2 and in the second state in which transmission of a signal is not possible between the internal circuit 5b and the pad electrode PD2, and during the operation of the semiconductor device PKG, the switch circuit unit SW2 is fixed to the second state. Accordingly, the switch circuit unit SW2 does not become the first state during the operation of the semiconductor device PKG.

Meanwhile, the switch circuit unit SW1 is a circuit capable of being set in a third state in which transmission of a signal is possible between the internal circuit 5a and the pad electrode PD1 and in a fourth state in which transmission of a signal is not possible between the internal circuit 5a and the pad electrode PD1, and during the operation of the semiconductor device PKG, the switch circuit unit SW1 is capable of switching between the third state and the fourth state and is used by switching therebetween as necessary. Similarly, the switch circuit unit SW3 is a circuit capable of being set in a fifth state in which transmission of a signal is possible between the internal circuit 5c and the pad electrode PD3 and in a sixth state in which transmission of a signal is not possible between the internal circuit 5c and the pad electrode PD3, and during the operation of the semiconductor device PKG, the switch circuit unit SW3 is capable of switching between the fifth state and the sixth state and is used by switching therebetween as necessary. Similarly, the switch circuit unit SW4 is a circuit capable of being set in a seventh state in which transmission of a signal is possible between the internal circuit 5d and the pad electrode PD4 and in an eighth state in which transmission of a signal is not possible between the internal circuit 5d and the pad electrode PD4, during the operation of the semiconductor device PKG, the switch circuit unit SW4 is capable of switching between the seventh state and the eighth state and is used by switching therebetween as necessary.

Furthermore, in the cases of FIGS. 28 and 31, along the first side of the front surface (main surface) of the semiconductor chip CP, the pad electrode PD2 is disposed next to the pad electrode PD1, and the pad electrode PD3 is disposed next to the pad electrode PD2, whereby no pad electrode PD is disposed between the pad electrode PD1 and the pad electrode PD2, and no pad electrode PD is disposed between the pad electrode PD2 and the pad electrode PD3. As another form, along the side where the pad electrodes PD1, PD2, and PD3 are disposed in the front surface (main surface) of the semiconductor chip CP, it is also possible that the pad electrode PD is further disposed either one or both of between the pad electrode PD1 and the pad electrode PD2 and between the pad electrode PD2 and the pad electrode PD3. The pad electrode PD may be the invalid pad, and it may be the invalid pad not connected to the wire BW.

In a case where the invalid pad (unused pad) is further disposed between the pad electrode PD1 and the pad electrode PD2 or between the pad electrode PD2 and the pad electrode PD3, an interval between the wires BW1 and BW3 becomes considerably large in a case where there is no wire BW5, and a risk of the wire sweep occurring in the wire BW1 or the wire BW3 is increased, whereby an effect of preventing the wire sweep by disposing the wire BW5 is very large.

Also, the sealing portion MR has the resin injection mark GTK. A position where the resin injection mark GTK is formed in the sealing portion MR corresponds to an injection position (position of the resin injection gate GT) of the resin material (MR1) when the resin material (MR1) is injected into the cavity (CAV) of the metal molds (KG1 and KG2) to form the sealing portion MR. It is preferred that the wire BW5 be located at a closer position to the resin injection mark GTK than the wire BW3. The wire BW5 being located at the closer position to the resin injection mark GTK than the wire BW3 corresponds to a state where the pad electrode PD2 connected to the wire BW5 is located at a closer position to the resin injection mark GTK than the pad electrode PD3 connected to the wire BW3. Furthermore, the wire BW5 being located at the closer position to the resin injection mark GTK than the wire BW3 means that, when the resin material (MR1) for forming the sealing portion MR is injected into the cavity (CAV) of the metal molds (KG1 and KG2) in the resin sealing step (corresponding to step S4$d$) of forming the sealing portion MR, the resin material (MR1) that has been injected contacts the wire BW3 after contacting the wire BW5. Thus, it is preferred that the resin material (MR1) that has been injected first contact the wire BW5 before contacting the wire BW3. The reason is as follows.

That is, first, there is assumed a case where, when the resin material MR1 for forming the sealing portion MR is injected into the cavity CAV of the metal molds KG1 and KG2, the resin material MR1 that has been injected first contacts the wire BW5 before contacting the wire BW3. This corresponds to a case where a traveling direction of the resin material MR1 that has been injected is the resin traveling direction YG5 in FIGS. 28 and 31. In this case, the resin material MR1 collides with the wire BW3 after colliding with the wire BW5 and being decelerated, whereby it is possible to suppress or prevent the wire BW3 from being deformed. Furthermore, even when the resin material MR1 collides with the wire BW5 and the wire BW5 is deformed toward a side of the wire BW3, a failure does not occur. This is because the wire BW5 and the wire BW3 are already electrically connected via the lead LD3, and an electrical failure does not occur even when the wire BW5 is deformed toward the side of the wire BW3 and contacts the wire BW3.

In contrast, there is assumed a case where, when the resin material MR1 for forming the sealing portion MR is injected into the cavity CAV of the metal molds KG1 and KG2, the resin material MR1 that has been injected first contacts the wire BW3 before contacting the wire BW5. This corresponds to a case where a traveling direction of the resin material MR1 that has been injected is the resin traveling direction YG6 in FIGS. 28 and 31. In this case, the resin material MR1 collides with the wire BW1 after colliding with the wire BW5 and being decelerated, whereby it is possible to suppress or prevent the wire BW1 from being deformed. However, when the resin material MR1 collides with the wire BW5 and the wire BW5 is deformed toward a side of the wire BW1, the wire BW5 may contact the wire BW1. Since the wire BW5 is connected to the lead LD3 and the wire BW1 is connected to the lead LD1, contact between the wire BW5 and the wire BW1 leads to a short circuit between the lead LD3 and the lead LD1, whereby it is necessary to prevent the wire BW5 from contacting the wire BW1. That is, although contact between the wire BW5 and the wire BW3 is not a problem, it is necessary to prevent the contact between the wire BW5 and the wire BW1.

Accordingly, in a case where the resin material MR1 collides with the wire BW1, the wire BW5, and the wire BW3 in order (in the case of the resin traveling direction YG5) in the resin sealing step, it is more preferred that the other end of the wire BW5, which is connected to the pad electrode PD2, be connected to the lead LD3, not to the lead LD1. Conversely, in a case where the resin material MR1 collides with the wire BW3, the wire BW5, and the wire BW1 in order (in the case of the resin traveling direction YG6) in the resin sealing step, it is more preferred that the other end of the wire BW5, which is connected to the pad electrode PD2, be connected to the lead LD1, not to the lead LD3.

That is, in FIGS. 28 and 31, it is possible to connect the other end of the wire BW5, which has one end connected to the pad electrode PD2, to either of the lead LD3 or the lead LD1. Then, in FIGS. 28 and 31, in the case of the resin traveling direction YG5, it is preferred that the other end of the wire BW5, which has the one end connected to the pad electrode PD2, be connected to the lead LD3, and in the case of the resin traveling direction YG6, it is preferred that the other end of the wire BW5, which has the one end connected to the pad electrode PD2, be connected to the lead LD1.

Accordingly, in the resin sealing step, among the wires BW3 and BW5 that are connected to the same lead LD3, it is preferred that the resin material (MR1) that has been injected first contact the wire BW5 (wire connected to the invalid pad) and then the wire BW3 (wire connected to the valid pad). Thus, in the semiconductor device PKG that has been manufactured, among the wires BW3 and BW5 that are connected to the same lead LD3, it is preferred that the wire BW5 (wire connected to the invalid pad) be located at a closer position to the resin injection mark GTK than the wire BW3 (wire connected to the valid pad). Accordingly, by providing the wire BW5, it is possible to suppress or prevent the wire sweep of the wire BW1 or the wire BW3, and even in a case where the wire BW5 is deformed, it is possible to more precisely prevent a failure caused by such deformation. Thus, it is possible to further improve the manufacturing yield of the semiconductor device.

<Application Example to Semiconductor Device>

FIG. 32 is a plan view illustrating the resin sealing step of step S4$d$, and the same planar region as that in FIG. 12 is illustrated. In FIG. 32, arrows indicate traveling directions of the resin material MR1 that travels within the cavity CAV when the resin material MR1 is injected into the cavity CAV of the metal molds KG1 and KG2 in the resin sealing step. The traveling directions correspond to the resin traveling directions YG1, YG2, YG3, YG4, YG5, and YG6 described above. In the resin sealing step, the resin material MR1 for forming the sealing portion MR is injected from a gate (resin injection port) GT provided to the metal molds (KG1 and KG2) into the cavity (CAV) of the metal molds (KG1 and KG2). The resin material MR1 that has been injected into the cavity (CAV) from the gate GT travels in directions of the arrows in FIG. 32 and fills an inside of the cavity (CAV). Then, the resin material MR1 is cured by heating and the like, so that the sealing portion MR is formed.

FIG. 33 is a partially-enlarged plan view illustrating apart of FIG. 32 in an enlarged manner. To facilitate understanding, in FIG. 33, among the plurality of pad electrodes PD included in the semiconductor chip CP, the pad electrode PD serving as the valid pad is indicated with a white square (□), and the pad electrode PD serving as the invalid pad (unused pad) is indicated with a black square (■).

In the case of FIG. 33, wires for preventing the wire sweep corresponding to the wire BW5 are provided to three places, which are a wire BW5a, a wire BW5b, and a wire BW5c.

First, the wire BW5a will be described.

As illustrated in FIGS. 32 and 33, the plurality of pad electrodes PD are disposed along the side SD1 of the semiconductor chip CP, and a pad electrode PD1a corresponding to the pad electrode PD1, a pad electrode PD2a corresponding to the pad electrode PD2, and a pad electrode PD3a corresponding to the pad electrode PD3 are included therein. The pad electrode PD1a and the pad electrode PD3a are the valid pads, and the pad electrode PD2a is the invalid pad. The pad electrode PD2a is disposed between the pad electrode PD1a and the pad electrode PD3a. The pad electrode PD1a is electrically connected to a lead LD1a corresponding to the lead LD1 via a wire BW1a corresponding to the wire BW1, and the pad electrode PD3a is electrically connected to a lead LD3a corresponding to the lead LD3 via a wire BW3a corresponding to the wire BW3. The lead LD1a and the lead LD3a are next to each other. Then, as a characteristic of this embodiment, the pad electrode PD2a serving as the invalid pad is electrically connected to the lead LD3a via the wire BW5a corresponding to the wire BW5. Accordingly, it is in a state where the wire BW5a is disposed between the wire BW1a and the wire BW3a.

By providing the wire BW5a, it is possible to suppress or prevent the wire sweep from occurring in the wire BW3a. That is, since the wire BW5a is located closer to the gate GT (see FIG. 32) than the wire BW3a, the resin material MR1 that has been injected into the cavity CAV of the metal molds from the gate GT first contacts the wire BW5a and then contacts the wire BW3a. Accordingly, as the resin material MR1 is decelerated by colliding with the wire BW5a, it is possible to slow down the speed of the resin material MR1 at the time of colliding with the wire BW3a. Accordingly, it is possible to suppress or prevent the wire sweep from occurring due to deformation of the wire BW3a. Furthermore, even when the wire BW5a is deformed toward a side of the wire BW3a and contacts the wire BW3a as a result of the resin material MR1 colliding with the wire BW5a, since the wire BW5a and the wire BW3a are electrically connected via the lead LD3a, it is possible to prevent an electric failure from occurring. In the semiconductor device PKG that has been manufactured, the wire BW5a is located closer to the resin injection mark GTK than the wire BW3a.

Furthermore, the plurality of pad electrodes PD (invalid pads not connected to the wire BW) are disposed between the pad electrode PD1a and the pad electrode PD2a and between the pad electrode PD2a and the pad electrode PD3a. Accordingly, an interval (distance) between the wire BW1a and the wire BW3a is considerably large. Thus, in a case where the wire BW5a is not formed, the speed of the resin material MR1 at the time of collision with the wire BW3a becomes considerably fast, whereby an effect of preventing the wire sweep of the wire BW3a by providing the wire BW5a is significantly large.

Next, the wire BW5b will be described.

As illustrated in FIGS. 32 and 33, the plurality of pad electrodes PD are disposed along the side SD2 of the semiconductor chip CP, and a pad electrode PD1b corresponding to the pad electrode PD1, a pad electrode PD2b corresponding to the pad electrode PD2, and a pad electrode PD3b corresponding to the pad electrode PD3 are included therein. The pad electrode PD1b and the pad electrode PD3b are the valid pads, and the pad electrode PD2b is the invalid pad.

The pad electrode PD2b is disposed between the pad electrode PD1b and the pad electrode PD3b. The pad electrode PD1b is electrically connected to a lead LD1b corresponding to the lead LD1 via a wire BW1b corresponding to the wire BW1, and the pad electrode PD3b is electrically connected to a lead LD3b corresponding to the lead LD3 via a wire BW3b corresponding to the wire BW3. The lead LD1b and the lead LD3b are next to each other. Then, as a characteristic of this embodiment, the pad electrode PD2b serving as the invalid pad is electrically connected to the lead LD3b via the wire BW5b corresponding to the wire BW5. Accordingly, it is in a state where the wire BW5b is disposed between the wire BW1b and the wire BW3b.

The wire BW5b is located closer to the gate GT than the wire BW3b (see FIG. 32). Accordingly, by providing the wire BW5b, for the same reason described in relation to the wires BW5a and BW3a, it is possible to suppress or prevent the wire sweep from occurring in the wire BW3b. Furthermore, even when the wire BW5b is deformed toward a side of the wire BW3b and contacts the wire BW3b, it is possible to prevent an electric failure from occurring. In the semiconductor device PKG that has been manufactured, the wire BW5b is located closer to the resin injection mark GTK than the wire BW3b. Furthermore, the plurality of pad electrodes PD (invalid pads not connected to the wire BW) are disposed between the pad electrode PD1b and the pad electrode PD2b and between the pad electrode PD2b and the pad electrode PD3b, whereby an effect of preventing the wire sweep of the wire BW3b by providing the wire BW5b is significantly large.

Next, the wire BW5c will be described.

As illustrated in FIGS. 32 and 33, the plurality of pad electrodes PD are disposed along a side SD3 of the semiconductor chip CP, and a pad electrode PD1c corresponding to the pad electrode PD1, a pad electrode PD2c corresponding to the pad electrode PD2, and a pad electrode PD3c corresponding to the pad electrode PD3 are included therein. The pad electrode PD1c and the pad electrode PD3c are the valid pads, and the pad electrode PD2c is the invalid pad. The pad electrode PD2c is disposed between the pad electrode PD1c and the pad electrode PD3c. The pad electrode PD1c is electrically connected to a lead LD1c corresponding to the lead LD1 via a wire BW1c corresponding to the wire BW1, and the pad electrode PD3c is electrically connected to a lead LD3c corresponding to the lead LD3 via a wire BW3c corresponding to the wire BW3. The lead LD1c and the lead LD3c are next to each other. Then, as a characteristic of this embodiment, the pad electrode PD2c serving as the invalid pad is electrically connected to the lead LD3c via a wire BW5c corresponding to the wire BW5. Accordingly, it is in a state where the wire BW5c is disposed between the wire BW1c and the wire BW3c.

The wire BW5c is located closer to the gate GT than the wire BW1c (see FIG. 32). Accordingly, by providing the wire BW5c, for the same reason described in relation to the wires BW5a and BW3a, it is possible to suppress or prevent the wire sweep from occurring in the wire BW1c. In the semiconductor device PKG that has been manufactured, the wire BW5c is located closer to the resin injection mark GTK than the wire BW1c. Furthermore, the plurality of pad electrodes PD (invalid pads not connected to the wire BW) are disposed between the pad electrode PD1c and the pad electrode PD2c and between the pad electrode PD2c and the pad electrode PD3c, whereby an effect of preventing the wire sweep of the wire BW1c by providing the wire BW5c is significantly large.

Also, in FIGS. 32 and 33, the wires (wires BW5a, BW5b, and BW5c) for preventing the wire sweep corresponding to the wire BW5 are each provided to three places; however, it is not limited to three places, and it is sufficient as long as the wire is provided to one or more places. Moreover, the wire for preventing the wire sweep corresponding to the wire BW5 may be provided to all of four sides of the semiconductor chip CP or to a part of the four sides thereof. Furthermore, the wire for preventing the wire sweep corresponding to the wire BW5 may be provided to one place or to multiple places of one side of the semiconductor chip CP.

Also, an effect of preventing the wire sweep becomes large by providing the wire corresponding to the wire BW5 to a place where the plurality of invalid pads are consecutively disposed. For example, at a place where five or more invalid pads are consecutively arranged along a side of an upper surface of the semiconductor chip CP, by connecting one end of the wire corresponding to the wire BW5 to the invalid pad in the middle among five or more consecutive invalid pads and by connecting the other end of the wire to the lead LD, the effect of preventing the wire sweep by providing the wire becomes significantly large.

Also, since the wire for preventing the wire sweep corresponding to the wire BW5 is not used as a conductive path, conductivity is not an essential condition, and the wire may be an insulator or a conductor. To facilitate manufacturing of the semiconductor device PKG, however, it is preferred that the wire for preventing the wire sweep corresponding to the wire BW5 also have the conductivity.

Moreover, it is preferred that the wire for preventing the wire sweep corresponding to the wire BW5 also be formed together with the wire BW to be functioned as the conductive path in the wire bonding step. Accordingly, it is preferred that the wire for preventing the wire sweep corresponding to the wire BW5 be made of the same material as the other wires BW (BW1, BW3, and BW4) to be functioned as the conductive path, and it is more preferred that the wires have the same diameter. This makes it easier to perform the wire bonding step.

Also, in this embodiment, there has been described a case where, in the semiconductor chip CP, the signal input from the pad electrode PD serving as the valid pad is transmitted to the internal circuit unit 5 or the signal transmitted from the internal circuit unit 5 is output from the pad electrode PD serving as the valid pad. The signal may be also a power supply voltage (power supply potential) or a ground voltage (ground potential). Also, in this embodiment, it is preferred that the signal transmitted between the pad electrode PD3 and the internal circuit unit 5 of the semiconductor chip CP and the signal transmitted between the pad electrode PD2 and the internal circuit unit 5 of the semiconductor chip CP be different in potential or type.

Second Embodiment

In the above-described first embodiment, the semiconductor device PKG is manufactured by using the lead frame; however, in a second embodiment, a semiconductor device PKG is manufactured by using a wiring substrate.

The semiconductor device PKG according to the second embodiment, which is manufactured by using a wiring substrate PCB, is hereinafter denoted by reference character PKG1 and is referred to as the semiconductor device PKG1.

FIG. 34 is a plan perspective view of the semiconductor device PKG1 according to the second embodiment, and FIG. 35 is a cross-sectional view of the semiconductor device PKG1 of FIG. 34. In FIG. 34, there is illustrated the plan perspective view of an upper surface side of the semiconductor device PKG1 when viewed through a sealing portion MR. A cross-section of the semiconductor device PKG1 at a position of a line A1-A1 of FIG. 34 substantially corresponds to FIG. 35.

Also, in FIG. 34, in the same manner as FIG. 33 described above, among a plurality of pad electrodes PD provided in a semiconductor chip CP, the pad electrode PD serving as a valid pad is indicated with a white square (□), and the pad electrode PD serving as an invalid pad (unused pad) is indicated with a black square (■).

Hereinafter, a configuration of the semiconductor device PKG1 will be described with reference to FIGS. 34 and 35.

The semiconductor device (semiconductor package) PKG1 according to the second embodiment illustrated in FIGS. 34 and 35 is a semiconductor device (semiconductor package) having the semiconductor chip CP mounted over the wiring substrate PCB.

The semiconductor device PKG1 according to the second embodiment includes the semiconductor chip CP, the wiring substrate PCB that supports or mounts the semiconductor chip CP, a plurality of wires BW that electrically connect the plurality of pad electrodes PD of the semiconductor chip CP to a plurality of bonding leads BLD of the wiring substrate PCB, and the sealing portion MR that covers an upper surface of the wiring substrate PCB including the semiconductor chip CP and the wire BW. The semiconductor device PKG1 further includes a plurality of solder balls HB provided on a lower surface of the wiring substrate PCB.

A configuration of the semiconductor chip CP including the pad electrode PD of the second embodiment is the same as the configuration thereof of the first embodiment, whereby a repeated description is omitted herein.

The semiconductor chip CP is mounted over the upper surface of the wiring substrate PCB in a state where a front surface (a main surface on a side where the pad electrode PD is formed) thereof faces upward and a back surface thereof faces the wiring substrate PCB. A back surface of the semiconductor chip CP is adhered (bonded) and fixed to the upper surface of the wiring substrate PCB via a bonding material BD.

The wiring substrate PCB includes the upper surface which is one of main surfaces, the lower surface which is a main surface opposite to the upper surface, a plurality of bonding leads (connection terminals, electrodes) BLD formed in the upper surface, and a plurality of lands (conductive land portion) LA formed in the lower surface. The lands LA are conductive land portions.

The wiring substrate PCB includes an insulation base material layer (insulation substrate, core material) BS, a conductor layer formed over upper and lower surfaces of the base material layer BS, and solder resist layers SR1 and SR2 as insulation layers formed over the upper and lower surfaces of the base material layer BS so as to cover the conductor layer. As a different form, it is also possible to form the wiring substrate PCB of a multilayer wiring substrate in which a plurality of insulation layers and a plurality of wiring layers are layered.

The conductor layer formed over the upper surface of the base material layer BS is patterned and includes the plurality of bonding leads BLD, and it may further include a wire and the like. Each of the bonding leads BLD is a connection terminal where one end of the wire BW is connected. The solder resist layer SR1 is formed over the upper surface of the base material layer BS; however, the bonding leads BLD are not covered with the solder resist layer SR1 and are exposed from an opening portion of the solder resist layer SR1.

The conductor layer formed over the lower surface of the base material layer BS is patterned and includes the plurality of lands LA, and it may further include a wire and the like. Each of the lands LA is a terminal (electrode, pad) where the solder ball HB is connected. The solder resist layer SR2 is formed over the lower surface of the base material layer BS; however, the lands LA are not covered with the solder resist layer SR2 and are exposed from an opening portion of the solder resist layer SR2.

In addition, a plurality of opening portions (penetration holes) are formed in the base material layer BS, and a conductive layer is formed inside the opening portions, constituting a via wire VH. The plurality of bonding leads BLD formed on the upper surface side of the wiring substrate PCB are electrically connected to the plurality of lands LA formed on the lower surface side of the wiring substrate PCB via wires (including the via wires VH) of the wiring substrate PCB, respectively.

In the upper surface of the wiring substrate PCB, the plurality of bonding leads BLD are adjacently disposed around a region where the semiconductor chip CP is mounted. The plurality of pad electrodes PD of the semiconductor chip CP are electrically connected to the plurality of bonding leads BLD in the upper surface of the wiring substrate PCB via the plurality of wires BW, respectively.

Note that the bonding lead BLD according to the second embodiment corresponds to a wire connection portion (a part connected with the wire BW) of the leads LD according to the first embodiment. Accordingly, it is possible to apply the configuration and the technical idea related to connection between the pad electrodes PD of the semiconductor chip CP and the leads LD via the wires BW according to the first embodiment to the configuration and the technical idea related to connection between the pad electrodes PD of the semiconductor chip CP and the bonding leads BLD of the wiring substrate PCB via the wires BW in the second embodiment.

That is, the configuration of the semiconductor chip CP in the semiconductor device PKG1 of FIGS. 34 and 35 is the same as the configuration of the semiconductor chip CP in the semiconductor device PKG according to the first embodiment. Accordingly, a circuit configuration of the semiconductor chip CP and a way of arrangement of the plurality of pad electrodes PD in the upper surface of the semiconductor chip CP (way of arrangement of the valid pad and the invalid pad) are common between the above-described first embodiment and the second embodiment. Furthermore, a connection relation of the plurality of wires BW provided in the semiconductor device PKG1 is the same as that of the semiconductor device PKG according to the first embodiment except that a connection destination of one end of each of the wires BW is not the leads LD but the bonding leads BLD in the semiconductor device PKG1 according to the second embodiment. Accordingly, the wires BW5a, BW5b, and BW5c for preventing the wire sweep illustrated in FIG. 33 are also provided in the semiconductor device PKG1 according to the second embodiment as it is seen from FIG. 34; however, in the second embodiment, one end of each of the wires BW5a, BW5b, and BW5c is connected to the invalid pads, and the other end of each of the wires BW5a, BW5b, and BW5c is connected to the bonding leads BLD, not to the leads LD.

To each of the lands LA in the lower surface of the wiring substrate PCB, the solder ball (ball electrode, bump electrode) HB as a bump electrode is connected (formed). FIG. 35 corresponds to a case where the lands LA and the solder balls HB connected thereto are arranged in two columns along an outer periphery of the lower surface of the wiring substrate PCB; however, it is not limited to this, and the lands LA and the solder balls HB may be also disposed in an array in the lower surface of the wiring substrate PCB, for example. The solder balls HB are capable of functioning as external terminals (external connection terminals) of the semiconductor device PKG.

Accordingly, in the semiconductor device PKG1 according to the second embodiment, each of the valid pads of the plurality of pad electrodes PD of the semiconductor chip CP is electrically connected to each of the bonding leads BLD of the wiring substrate PCB via each of the wires BW and is further electrically connected to each of the lands LA of the wiring substrate PCB and to each of the solder balls HB connected to the corresponding land LA via the wire (including the via wire VH) of the wiring substrate PCB.

The sealing portion (sealing resin portion, sealing body) MR is formed over the upper surface of the wiring substrate PCB so as to cover the semiconductor chip CP, the wires BW, and the bonding leads BLD. That is, the sealing portion MR is formed over the upper surface of the wiring substrate PCB, and the sealing portion MR seals and protects the semiconductor chip CP, the wires BW, and the bonding leads BLD. A material and the like of the sealing portion MR are the same in the second embodiment as the first embodiment.

A manufacturing process of the semiconductor device PKG1 of FIGS. 34 and 35 can be performed as follows, for example.

That is, first, the semiconductor chip CP is mounted over the wiring substrate PCB and is bonded thereto via the bonding material BD. Then, a wire bonding step is performed, whereby the plurality of pad electrodes PD of the semiconductor chip CP are electrically connected to the plurality of bonding leads BLD of the wiring substrate PCB via the plurality of wires BW. Then, a resin sealing step is performed, whereby the sealing portion MR is formed over the upper surface of the wiring substrate PCB so as to cover the semiconductor chip CP, the wires BW, and the bonding leads BLD. In this case, the wiring substrate PCB is sandwiched by metal molds such as the metal molds KG1 and KG2 (note, however, that a shape of the cavity CAV is different from that of the first embodiment) such that the semiconductor chip CP and the wires BW are disposed inside the cavity of the metal molds. Then, a resin material for forming the sealing portion MR is introduced into the cavity of the metal molds from a resin injection gate of the metal molds, and the resin material is cured by heating and the like, so that the sealing portion MR is formed. Subsequently, the solder balls HB are connected to the plurality of lands LA in the lower surface of the wiring substrate PCB. In this manner, the semiconductor device PKG can be formed.

Alternatively, it is also possible to manufacture the semiconductor device PKG1 by using a wiring substrate base in which the plurality of wiring substrates PCB are integrally coupled in an array. In this case, after up to the resin sealing step has been performed, the wiring substrate base is cut (diced) into the individual wiring substrates PCB, and subsequently, the solder balls HB can be connected to the lands LA.

In the second embodiment, the technical idea is the same as that of the first embodiment. The second embodiment is different from the first embodiment mainly in the following points. That is, in the first embodiment, the semiconductor chip CP is mounted over the die pad DP; however, in the second embodiment, the semiconductor chip CP is mounted over the wiring substrate PCB. Furthermore, in the first embodiment, the other end of the wire BW having one end connected to the pad electrode PD of the semiconductor chip CP is connected to the inner lead portion of the lead LD; however, in the second embodiment, the other end of the wire BW having one end connected to the pad electrode PD of the semiconductor chip CP is connected to the bonding lead BLD of the wiring substrate PCB.

An equivalent of the leads LD according to the first embodiment is, in the second embodiment, a combination of the bonding leads BLD, the wire of the wiring substrate PCB that electrically connects the bonding leads BLD to the lands LA, the lands LA, and the solder balls HB. In the second embodiment, the bonding leads BLD correspond to the wire connection portion (a part connected to the wire BW) of the leads LD in the first embodiment, and the lands LA and the solder balls HB correspond to the outer lead portions of the leads LD of the first embodiment. The wire of the wiring substrate PCB that electrically connects each of the bonding leads BLD to the corresponding land LA corresponds to a part connecting the wire connection portion to the outer lead portion of each of the leads LD of the first embodiment.

Also in the second embodiment, it is possible to obtain substantially the same effect as that of the first embodiment by applying the same characteristic as the first embodiment to the second embodiment. For example, it is possible to replace the leads LD with the bonding leads BLD in the descriptions related to FIGS. 25 to 33.

In short, also in the second embodiment, in the same manner as the first embodiment, by providing the wires BW5a, BW5b, and BW5c for preventing the wire sweep illustrated in FIG. 34, it is possible to suppress or prevent the wire sweep from occurring in another wire BW in the resin sealing step.

Thus, the technical idea described in the first embodiment can be applied to the semiconductor device (semiconductor package) including the semiconductor chip CP, and a terminal for wire connection (corresponding to the leads LD in the first embodiment and corresponding to the bonding leads BLD in the second embodiment), and in which the pad electrode PD of the semiconductor chip CP is connected to the terminal for wire connection via the wire, and these are sealed with a resin.

In the foregoing, the invention made by the inventors of the present invention has been concretely described based on the embodiments. However, it is needless to say that the present invention is not limited to the foregoing embodiments and various modifications and alterations can be made within the scope of the present invention.

EXPLANATION OF REFERENCE CHARACTERS 1, 1a, 1b, 1c, 1d Input output circuit unit
2 Control circuit unit
2a, 2b, 2c, 2d Selection circuit
2e Logic circuit unit
3 Decoder circuit unit
4 Storage circuit unit
5 Internal circuit unit
5a, 5b, 5c, 5d Internal circuit
BD Bonding material
BW, BW1, BW1a, BW1b, BW1c, BW2, BW3, BW3a, BW3b, BW3c, BW4, BW5, BW5a, BW5b, BW5c Wire
CAV Cavity
CP Semiconductor chip
DP Die pad
GT gate
GTK Resin injection mark
KG1, KG2 Metal mold
LD, LD1, LD1a, LD1b, LD1c, LD2, LD3, LD3a, LD3b, LD3c, LD4 Lead
MR Sealing portion
MR1 Resin material
PD, PD1, PD1a, PD1b, PD1c, PD2, PD2a, PD2b, PD2c, PD3, PD3a, PD3b, PD3c, PD4 Pad electrode
PKG, PKG1 Semiconductor device (semiconductor package)
SW, SW1, SW2, SW3, SW4 Switch circuit unit
TL Suspension lead

The invention claimed is:

1. A semiconductor device comprising:
a semiconductor chip including a first internal circuit, a second internal circuit, and a switch circuit unit, the semiconductor chip having a main surface in which a first electrode and a second electrode are formed;
a first external terminal disposed around the semiconductor chip;
a first wire electrically connecting the first electrode to the first external terminal;
a second wire electrically connecting the second electrode to the first external terminal; and
a sealing body sealing the semiconductor chip, the first wire, and the second wire with a resin,
wherein the second electrode is electrically connected to the second internal circuit, and transmission of a signal is possible between the second internal circuit and the second electrode,
wherein the switch circuit unit is a circuit capable of being set in a first state in which transmission of a signal is possible between the first internal circuit and the first electrode and in a second state in which transmission of a signal is not possible between the first internal circuit and the first electrode, and
wherein the switch circuit unit is fixed to the second state during operation of the semiconductor device.

2. The semiconductor device according to claim 1,
wherein a signal is transmitted between the first external terminal and the semiconductor chip via the second electrode and the second wire, and a signal is not transmitted therebetween via the first electrode and the first wire.

3. The semiconductor device according to claim 1,
wherein the semiconductor chip includes a storage circuit unit,
wherein the storage circuit unit is electrically connected to the switch circuit unit, and
wherein the switch circuit unit is fixed to the second state based on information stored in the storage circuit unit.

4. The semiconductor device according to claim 3,
wherein the switch circuit unit includes a control circuit unit and a first input output circuit unit connected to the first electrode, and
wherein the switch circuit unit is fixed to the second state by controlling the first input output circuit unit by the control circuit unit based on the information stored in the storage circuit unit.

5. The semiconductor device according to claim 4,
wherein the semiconductor chip further includes a decoder circuit unit, and
wherein the switch circuit unit is fixed to the second state by the information stored in the storage circuit unit being converted into a signal by the decoder circuit unit, by the signal having been converted by the decoder circuit unit being input to the control circuit unit, and by the control circuit unit controlling the first input output circuit unit based on the signal having been input to the control circuit unit.

6. The semiconductor device according to claim 1, further comprising:
a third electrode formed in the main surface of the semiconductor chip;
a second external terminal disposed around the semiconductor chip;
a third wire electrically connecting the third electrode to the second external terminal,
wherein the third electrode is electrically connected to a third internal circuit of the semiconductor chip, and transmission of a signal is possible between the third internal circuit and the third electrode,
wherein, in a plan view, the first electrode, the second electrode, and the third electrode are disposed along a first side of the main surface of the semiconductor chip, and
wherein the first electrode is disposed between the second electrode and the third electrode.

7. The semiconductor device according to claim 6, further comprising:
a fourth electrode formed in the main surface of the semiconductor chip;
a third external terminal disposed around the semiconductor chip; and
a fourth wire electrically connecting the fourth electrode to the third external terminal,
wherein the fourth electrode is electrically connected to a fourth internal circuit of the semiconductor chip, and transmission of a signal is possible between the fourth internal circuit and the fourth electrode,
wherein, in the plan view, the fourth electrode is disposed along the first side of the main surface of the semiconductor chip, and
wherein the second electrode is disposed between the fourth electrode and the first electrode.

8. The semiconductor device according to claim 7, further comprising:
a plurality of fifth electrodes formed in the main surface of the semiconductor chip,
wherein, in the plan view, the plurality of fifth electrodes are disposed along the first side of the main surface of the semiconductor chip, and
wherein the plurality of fifth electrodes are disposed between the first electrode and the second electrode and between the first electrode and the third electrode.

9. The semiconductor device according to claim 1,
wherein the sealing body has a resin injection mark, and
wherein the first wire is located at a closer position to the resin injection mark than the second wire.

10. A method for manufacturing a semiconductor device, comprising the steps of:
(a) preparing a semiconductor chip including a first internal circuit, a second internal circuit, a storage circuit unit, and a switch circuit unit, the semiconductor chip having a main surface in which a first electrode and a second electrode are formed;
(b) mounting the semiconductor chip over a chip mounting portion;
(c) electrically connecting the first electrode of the semiconductor chip to a first external terminal disposed around the chip mounting portion via a first wire as well as electrically connecting the second electrode of the semiconductor chip to the first external terminal via a second wire;
(d) forming a resin sealing portion by sealing the semiconductor chip, the first wire, and the second wire with a resin; and
(e) storing first information in the storage circuit unit of the semiconductor chip,
wherein the second electrode is electrically connected to the second internal circuit, and transmission of a signal is possible between the second internal circuit and the second electrode,
wherein the switch circuit unit is a circuit capable of being set in a first state in which transmission of a signal is possible between the first internal circuit and the first electrode and in a second state in which transmission of a signal is not possible between the first internal circuit and the first electrode, and
wherein, after the step (e), the switch circuit unit is fixed to the second state based on the first information stored in the storage circuit unit during operation of the semiconductor device.

11. The method for manufacturing a semiconductor device according to claim 10,
wherein the step (e) is performed after the step (d).

12. The method for manufacturing a semiconductor device according to claim 10,
wherein the step (a) includes the steps of:
(a1) preparing a semiconductor wafer having a plurality of chip regions; and
(a2) obtaining the semiconductor chip by cutting the semiconductor wafer,
wherein each of the plurality of chip regions of the semiconductor wafer prepared in the step (a1) includes the switch circuit unit, the first internal circuit, the second internal circuit, the storage circuit unit, the first electrode, and the second electrode, and
wherein the step (e) is performed after the step (a1) and before the step (a2).

13. The method for manufacturing a semiconductor device according to claim 10,
wherein the step (d) includes the steps of:
(d1) disposing the semiconductor chip, the first wire, the second wire, the chip mounting portion, and at least a part of the first external terminal inside a cavity of metal molds; and
(d2) injecting a resin material for the resin sealing portion into the cavity of the metal molds after the step (d1), and
wherein, in the step (d2), the resin material having been injected into the cavity of the metal molds contacts the second wire after contacting the first wire.

* * * * *